(12) United States Patent
Kim

(10) Patent No.: US 12,000,866 B2
(45) Date of Patent: Jun. 4, 2024

(54) DETECTION UNIT, SEMICONDUCTOR FILM LAYER INSPECTION APPARATUS INCLUDING THE SAME, AND SEMICONDUCTOR FILM LAYER INSPECTION METHOD USING THE SAME

(71) Applicant: EnVigth Co., Ltd., Hwaseong-si (KR)

(72) Inventor: Hyoung Sik Kim, Hwaseong-si (KR)

(73) Assignee: EnVigth Co., Ltd., Hwaseong-si (KR)

(*) Notice: Subject to any disclaimer, the term of this patent is extended or adjusted under 35 U.S.C. 154(b) by 0 days.

(21) Appl. No.: 17/945,743

(22) Filed: Sep. 15, 2022

(65) Prior Publication Data
US 2023/0341438 A1  Oct. 26, 2023

(30) Foreign Application Priority Data

Apr. 20, 2022 (KR) .................. 10-2022-0048970
Jun. 13, 2022 (KR) .................. 10-2022-0071600

(51) Int. Cl.
| | | |
|---|---|---|
| G01R 31/20 | (2006.01) | |
| G01R 1/073 | (2006.01) | |
| G01R 3/00 | (2006.01) | |
| G01R 31/26 | (2020.01) | |
| G01R 31/28 | (2006.01) | |
| G01R 35/00 | (2006.01) | |

(52) U.S. Cl.
CPC ........... *G01R 1/07307* (2013.01); *G01R 3/00* (2013.01); *G01R 31/2648* (2013.01); *G01R 31/2886* (2013.01); *G01R 31/2887* (2013.01); *G01R 35/005* (2013.01); *H01L 2924/00* (2013.01); *H01L 2924/00014* (2013.01); *H01L 2924/0002* (2013.01)

(58) Field of Classification Search
CPC ............ G01R 1/07307; G01R 31/2648; G01R 35/005; G01R 31/2886; G01R 3/00; G01R 31/2887; H01L 2924/00; H01L 2924/00014; H01L 2924/0002
USPC ......... 324/71, 378, 403, 415, 425, 500, 537, 324/754.01, 754.03
See application file for complete search history.

(56) References Cited

U.S. PATENT DOCUMENTS

| | | | |
|---|---|---|---|
| 10,090,208 B2 | 10/2018 | Kishi et al. | |
| 2015/0241512 A1* | 8/2015 | Faifer | ................ G01R 31/2648 |
| | | | 324/754.23 |
| 2016/0320430 A1* | 11/2016 | Zhu | ..................... G01R 31/2601 |

FOREIGN PATENT DOCUMENTS

| | | |
|---|---|---|
| JP | 07167906 A | 7/1995 |
| JP | 09321107 A | 12/1997 |
| JP | 2022521625 A | 4/2022 |

(Continued)

*Primary Examiner* — Raul J Rios Russo
(74) *Attorney, Agent, or Firm* — Rabin & Berdo, P.C.

(57) ABSTRACT

The present invention provides a semiconductor film layer inspection apparatus (10) for detecting the electrical characteristics of a semiconductor film layer (30) formed on one surface of a substrate (20) and including an oxide semiconductor layer (31), and a detection unit used therein. The apparatus includes a base unit (40), a detection unit (200) and a carrier generator (300 300*a* and 300*b*). The detection unit (200) includes: a detection probe pin (230) and a detection probe module (202). The detection probe pin (230) includes a detection probe pin body (231) and a detection probe pin contactor unit (233). The detection probe pin contactor unit at least partially forms a plurality of independently detectable and operable segmented pin contactor unit blocks.

28 Claims, 37 Drawing Sheets

(56) References Cited

FOREIGN PATENT DOCUMENTS

| | | | |
|---|---|---|---|
| KR | 100254054 | B1 | 4/2000 |
| KR | 100297283 | B1 | 10/2001 |
| KR | 100873181 | B1 | 12/2008 |
| KR | 101163199 | B1 | 7/2012 |
| KR | 20160052742 | A | 5/2016 |
| KR | 102456347 | B1 | 10/2022 |

* cited by examiner

DETECTION UNIT, SEMICONDUCTOR FILM LAYER INSPECTION APPARATUS INCLUDING THE SAME, AND SEMICONDUCTOR FILM LAYER INSPECTION METHOD USING THE SAME

CROSS-REFERENCE TO RELATED APPLICATIONS

This application claims the benefit of Korean Patent Application No. 10-2022-0048970, filed on Apr. 20, 2022 and No. 10-2022-0071600, filed on Jun. 13, 2022 in the Korean Intellectual Property Office, which is incorporated herein by reference in its entirety.

BACKGROUND OF THE INVENTION

1. Field of the Invention

The present invention relates to a detection unit and an apparatus for inspecting a semiconductor film layer. More specifically, the present invention relates to an apparatus for more accurately detecting the electrical characteristics of an oxide semiconductor layer, and a method of controlling the same.

2. Description of Related Art

A semiconductor manufacturing process is actively applied to various application fields such as large-area displays as well as individual chip devices, and various rapid technological changes in the semiconductor manufacturing process are in progress. Along with the development of such technologies, various related technologies are being developed to secure excellent quality. Conventionally, a two-point method has been mainly used to inspect a semiconductor film layer. However, the conventional two-point inspection method entails a problem in that a semiconductor layer, particularly, an oxide semiconductor layer has a low intrinsic carrier concentration despite its fast mobility, and thus it is considerably difficult to detect the electrical characteristics of the oxide semiconductor layer due to a fine detection current.

SUMMARY OF THE INVENTION

The present invention has been made to solve the above-mentioned problems associated with the prior art, and it is an object of the present invention to provide an apparatus for more easily and accurately detecting the electrical characteristics of a corresponding oxide semiconductor layer that is an inspection object by applying energy to the oxide semiconductor layer to form an excited state and thus leading to an increase in the carrier concentration to facilitate the detection of a current, and a control or measurement method thereof.

Another object of the present invention is to provide a structure for improving the detection reliability of the electrical characteristics of an oxide semiconductor layer to increase data robustness.

To achieve the above object, in one aspect, the present invention provides a semiconductor film layer inspection apparatus (10) for detecting the electrical characteristics of a semiconductor film layer (30) formed on one surface of a substrate (20) and including an oxide semiconductor layer (31), the apparatus including: a base unit (40) configured to allow the substrate to be seatingly disposed on one surface thereof; a detection unit (200) configured to be brought into close contact with at least two points on one surface of the oxide semiconductor layer to apply an electrical signal so as to detect the electrical characteristics of the oxide semiconductor layer; and a carrier generator (300,300a,300b) configured to increase a concentration of a carrier of the oxide semiconductor layer.

In the semiconductor film layer inspection apparatus, the semiconductor film layer (30) may include an electrode layer (35) disposed between the oxide semiconductor layer (31) and the substrate (20), and wherein the carrier generator (300) may include a generator ground line (340) electrically connected at one end thereof to the electrode layer (35) and connected at the other end thereof to the ground.

In the semiconductor film layer inspection apparatus, the generator ground line (340) may include a generator power supply unit (330) disposed between the electrode layer (35) and the generator ground line (330).

In the semiconductor film layer inspection apparatus, the generator power supply unit (330) may include a DC power supply.

In the semiconductor film layer inspection apparatus, the detection unit 200 may include: one or more detection probe pins (230) configured to be brought into close contact with one or more points spaced apart from each other on one surface of the oxide semiconductor layer: and a detection probe module (202) configured to generate a detection signal for application to the detection probe pin (230) to detect the electrical characteristics of the semiconductor film layer (30), and configured to sense a detection sensing signal inputted thereto from the detection probe pin (230).

In the semiconductor film layer inspection apparatus, the detection probe module (202) may include: a voltage application module (210) configured to generate the detection signal for application to the plurality of detection probe pins (230); and a current measurement module (220) configured to measure the detection sensing signal through the plurality of detection probe pins (230).

In the semiconductor film layer inspection apparatus, the detection probe module (202) may include a capacitance-voltage measurement module (210a) configured to generate the detection signal for application to the plurality of detection probe pins (230) and measure the detection sensing signal through the plurality of detection probe pins (230) to detect the electrical characteristics of the oxide semiconductor layer.

In the semiconductor film layer inspection apparatus, the carrier generator (300) may include a generator light source unit (310a) configured to irradiate light of a predetermined wavelength band to the oxide semiconductor layer (31).

In the semiconductor film layer inspection apparatus, the generator light source unit (310a) may include: a generator light source (311a) configured to generate the light of a predetermined wavelength band irradiated to the oxide semiconductor layer (31); and a generator reflection unit (313a) configured to reflect the light generated from the generator light source (311a) toward the oxide semiconductor layer (31).

In the semiconductor film layer inspection apparatus, the generator light source unit (310a) may be disposed so as to be opposed to the detection unit (20) with the substrate (20) interposed therebewteen.

In the semiconductor film layer inspection apparatus, the semiconductor film layer (30) may include an electrode layer (35) disposed between the oxide semiconductor layer (31) and the substrate (20), and the carrier generator (300) may include: a generator ground line (340) electrically connected at one end thereof to he electrode layer (35) and connected at the other end thereof to the ground; and a generator light source unit (310*a*) configured to irradiate light of a predetermined wavelength band to the oxide semiconductor layer (31).

In the semiconductor film layer inspection apparatus, the electrode layer (35) may include a transparent electrode layer, and the generator light source unit (310*a*) may be disposed so as to be opposed to the detection unit (20) with the substrate (20) interposed therebewteen.

In the semiconductor film layer inspection apparatus, the detection unit 200 may include: one or more detection probe pins (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230) The detection probe pin (230) may be provided in plural numbers in such a manner that an overlapping region occurs on a projection region when ends of the plural respective detection probe pins (230) oriented toward the substrate 30 are projected onto a plane (C'C') that is perpendicular to the substrate 20 and is parallel to a line segment (C-C) interconnecting the centroids ($C_1$ and $C_2$) of the respective detection probe pins (230) on a plane horizontal to the substrate (20).

In the semiconductor film layer inspection apparatus, one of the projection regions of the detection probe pin (230) may include a closed structure that surrounds the other thereof.

In the semiconductor film layer inspection apparatus, one of the projection regions of the detection probe pin (230) may include an opened structure that at least partially surrounds the other thereof.

In the semiconductor film layer inspection apparatus, the detection unit (200) may include: one or more detection probe pins (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), wherein the detection probe pin (230) may be provided in plural numbers, and wherein at least one of the plural detection probe pins (230) may include: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer.

In the semiconductor film layer inspection apparatus, the detection probe pin contactor unit (233) may include one or more detection probe pin contactors (235) configured to be brought into direct contact with the oxide semiconductor layer.

In the semiconductor film layer inspection apparatus, the detection probe pin contactor unit (233) may further include a detection probe pin medium (237) disposed between the detection probe pin body (231) and the detection probe pin contactor (235).

In the semiconductor film layer inspection apparatus, the detection probe pin contactor unit (233) may establish an electrical connection with the detection unit (200).

In the semiconductor film layer inspection apparatus, the one or more detection probe pin contactors (235) may be arranged to form a matrix structure in such a manner that any one of the detection probe pin contactors (235) is applied with an electrical signal different from that of another adjacent detection probe pin contactor (235).

In the semiconductor film layer inspection apparatus, the one or more detection probe pin contactors (235) may form a structure in which at least one part thereof captures another part thereof, and wherein each of the one or more detection probe pin contactors (235) may include: a first detection probe pin contactor (235*a*); and a second detection probe pin contactor (235*b*) applied with an electrical signal different from that of the first detection probe pin contactor (235*a*).

In the semiconductor film layer inspection apparatus, the first detection probe pin contactor (235*a*) may include: a first detection probe pin contactor node (235*a*-1) configured to be plurally electrically connected to another adjacent first detection probe pin contactor (235*a*); a first detection probe pin contactor core (235*a*-3) configured to be arranged in such a manner that a plurality of predetermined detection probe pin contactors are grouped so as to be electrically connected to one another, and configured to be at least partially surrounded by the second detection probe pin contactor (235*b*); and a first detection probe pin contactor branch (235*a*-2) configured to be arranged in such a manner that a plurality of predetermined detection probe pin contactors are in series connected to one another, and configured to be electrically connected at one end thereof to the first detection probe pin contactor node (235*a*-1) and at the other end thereof to the first detection probe pin contactor core (235*a*-3). The first detection probe pin contactor node (235*a*-1) may be further electrically connected to at least another of the first detection probe pin contactor (235*a*).

In the semiconductor film layer inspection apparatus, the second detection probe pin contactor (235*b*) may include: a second detection probe pin contactor node (235*b*-1) configured to be plurally electrically connected to another adjacent second detection probe pin contactor (235*b*); a second detection probe pin contactor core (235*b*-3) configured to be arranged in such a manner that a plurality of predetermined detection probe pin contactors are grouped so as to be electrically connected to one another, and configured to be at least partially surrounded by the first detection probe pin contactor (235*a*); and a second detection probe pin contactor branch (235*b*-2) configured to be arranged in such a manner that a plurality of predetermined detection probe pin contactors are in series connected to one another, and configured to be electrically connected at one end thereof to the second detection probe pin contactor node (235*b*-1) and at the other end thereof to the second detection probe pin contactor core (235*b*-3).

The second detection probe pin contactor node (235*b*-1) may be further electrically connected to at least another of the second detection probe pin contactor (235*b*).

In the semiconductor film layer inspection apparatus, the detection probe pin body (231) may be at least partially formed of a ferromagnetic material, and wherein the semiconductor film layer inspection apparatus may further include a contact alignment unit (400) disposed opposed to the detection probe pin body (231) with the substrate (20) interposed therebetween, and configured to create a magnetic force on the detection probe pin body (231) during its operation to closely align the substrate (20) and the detection probe pin body (231) to allow the detection probe pin body to be brought into close contact with the substrate.

In the semiconductor film layer inspection apparatus, the contact alignment unit (400) may include: a contact alignment electromagnet unit (410) disposed on the base unit (40) and configured to create the magnetic force on the detection probe pin body (231); and a contact alignment control unit (420) configured to control application of power to the contact alignment electromagnet unit (410).

In the semiconductor film layer inspection apparatus, the detection unit (200) may include: a detection probe pin (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), and wherein the detection probe pin (230) may include: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer.

In the semiconductor film layer inspection apparatus, the detection probe pin body (231) may include: a detection probe pin body base (231-1) configured to allow the detection probe pin contactor unit (233) to be disposed thereon; and a detection probe pin body line (231-2) disposed on one surface of the detection probe pin body base (231-1) to allow the detection probe pin contactor unit (233) to be electrically connected to the detection probe pin contactor unit (233).

In the semiconductor film layer inspection apparatus, the detection probe pin body base (231-1) may include an FPCB, and wherein the detection probe pin contactor unit 233 may include one or more detection probe pin contactors (235) disposed on one surface of the detection probe pin body base (231-1) so as to be electrically connected to the detection probe pin body line (231-2), and configured to be brought into direct contact with the oxide semiconductor layer.

In the semiconductor film layer inspection apparatus, the one or more detection probe pin contactors (235) may be arranged to form a matrix structure in such a manner that any one of the detection probe pin contactors (235) is applied with an electrical signal different from that of another adjacent detection probe pin contactor (235).

In the semiconductor film layer inspection apparatus, the one or more detection probe pin contactors (235) may form a structure in which at least one part thereof captures another part thereof, and wherein each of the one or more detection probe pin contactors (235) may include: a first detection probe pin contactor (235a); and a second detection probe pin contactor (235b) applied with an electrical signal different from that of the first detection probe pin contactor (235a).

In the semiconductor film layer inspection apparatus, the first detection probe pin contactor (235a) may include: a first detection probe pin contactor node (235a-1) configured to be plurally electrically connected to another adjacent first detection probe pin contactor (235a); a first detection probe pin contactor core (235a-3) configured to be arranged in such a manner that a plurality of predetermined detection probe pin contactors are grouped so as to be electrically connected to one another, and configured to be at least partially surrounded by the second detection probe pin contactor (235b); and a first detection probe pin contactor branch (235a-2) configured to be arranged in such a manner that a plurality of predetermined detection probe pin contactors are in series connected to one another, and configured to be electrically connected at one end thereof to the first detection probe pin contactor node (235a-1) and at the other end thereof to the first detection probe pin contactor core (235a-3).

In the semiconductor film layer inspection apparatus, the second detection probe pin contactor (235b) may include: a second detection probe pin contactor node (235b-1) configured to be plurally electrically connected to another adjacent second detection probe pin contactor (235b); a second detection probe pin contactor core (235b-3) configured to be arranged in such a manner that a plurality of predetermined detection probe pin contactors are grouped so as to be electrically connected to one another, and configured to be at least partially surrounded by the first detection probe pin contactor (235a); and a second detection probe pin contactor branch (235b-2) configured to be arranged in such a manner that a plurality of predetermined detection probe pin contactors are in series connected to one another, and configured to be electrically connected at one end thereof to the second detection probe pin contactor node (235b-1) and at the other end thereof to the second detection probe pin contactor core (235b-3).

In the semiconductor film layer inspection apparatus, the detection unit (200) may include a detection probe moving unit (240) configured to allow the detection probe pin (230) to be disposed at one end thereof so as to be relatively movable with respect to the base unit (40).

In the semiconductor film layer inspection apparatus, the detection probe moving unit (240) may include: a detection probe moving body (241) configured to allow the detection probe pin (230) to be disposed at one end thereof; and a detection probe moving guide (280) having one end disposed at the detection probe moving body (241) and the other end disposed so as to be relatively movable with respect to the base unit (40).

In the semiconductor film layer inspection apparatus, the detection probe moving unit (240) may include a detection probe damping unit (270) configured to damp the movement of the detection probe moving body (241).

In the semiconductor film layer inspection apparatus, the detection probe damping unit (270) may include: a damping moving body accommodating part (271) disposed at the inside of the detection probe moving body (241); a damping elastic part (273) disposed inside the damping body accommodating part (271) in such a manner as to be supported at one end thereof by the inner side of the damping body accommodating part (271); and a damping plunger (275) brought at one end thereof into contact with the damping elastic part (273) and disposed at the other end thereof within the damping body accommodating part (271) so as to be oriented toward the base unit 40 to limit the movement of the detection probe moving body (241).

In the semiconductor film layer inspection apparatus, the damping plunger (275) may include: a damping plunger body (2751) supported at an end thereof by the damping elastic part (273) in an elastic contact manner; and a damping plunger shaft (2753) connected at one end thereof to the damping plunger body (2751) and accommodatingly disposed at the other end thereof within the damping moving body accommodating part (271) along the longitudinal direction of the damping moving body accommodating part (271).

In the semiconductor film layer inspection apparatus, the detection probe moving unit (240) may include a detection probe moving sensing unit (290) disposed at the base unit (40) so as to be opposed to the damping plunger body (2751), and configured to be brought into contact with the damping plunger body (2751) to senses a contact state.

In the semiconductor film layer inspection apparatus, the detection probe moving sensing unit (290) may include a pressure sensor.

In another aspect, the present invention provides a detection unit (200) configured to be brought into close contact with at least two points on one surface of the oxide semiconductor layer to detect the electrical characteristics of the oxide semiconductor layer by applying an electrical signal, wherein the detection unit (200) includes: a detection probe pin (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), and wherein the detection probe pin (230) includes: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer.

In the detection unit, the detection probe pin body (231) may include: a detection probe pin body base (231-1) configured to allow the detection probe pin contactor unit (233) to be disposed thereon; and a detection probe pin body line (231-2) disposed on one surface of the detection probe pin body base (231-1) to allow the detection probe pin contactor unit (233) to be electrically connected to the detection probe pin contactor unit (233).

In the detection unit, the detection probe pin body base (231-1) may include an FPCB, and wherein the detection probe pin contactor unit 233 may include one or more detection probe pin contactors (235) disposed on one surface of the detection probe pin body base (231-1) so as to be electrically connected to the detection probe pin body line (231-2), and configured to be brought into direct contact with the oxide semiconductor layer.

In the detection unit, the one or more detection probe pin contactors (235) may be arranged to form a matrix structure in such a manner that any one of the detection probe pin contactors (235) is applied with an electrical signal different from that of another adjacent detection probe pin contactor (235).

In the detection unit, the one or more detection probe pin contactors (235) may form a structure in which at least one part thereof captures another part thereof, and wherein each of the one or more detection probe pin contactors (235) may include: a first detection probe pin contactor (235a); and a second detection probe pin contactor (235b) applied with an electrical signal different from that of the first detection probe pin contactor (235a).

In the detection unit, the first detection probe pin contactor (235a) may include: a first detection probe pin contactor node (235a-1) configured to be plurally electrically connected to another adjacent first detection probe pin contactor (235a); a first detection probe pin contactor core (235a-3) configured to be arranged in such a manner that a plurality of predetermined detection probe pin contactors are grouped so as to be electrically connected to one another, and configured to be at least partially surrounded by the second detection probe pin contactor (235b); and a first detection probe pin contactor branch (235a-2) configured to be arranged in such a manner that a plurality of predetermined detection probe pin contactor are in series connected to one another, and configured to be electrically connected at one end thereof to the first detection probe pin contactor node (235a-1) and at the other end thereof to the first detection probe pin contactor core (235a-3).

In the detection unit, the second detection probe pin contactor (235b) may include: a second detection probe pin contactor node (235b-1) configured to be plurally electrically connected to another adjacent second detection probe pin contactor (235b); a second detection probe pin contactor core (235b-3) configured to be arranged in such a manner that a plurality of predetermined detection probe pin contactors are grouped so as to be electrically connected to one another, and configured to be at least partially surrounded by the first detection probe pin contactor (235a); and a second detection probe pin contactor branch (235b-2) configured to be arranged in such a manner that a plurality of predetermined detection probe pin contactors are in series connected to one another, and configured to be electrically connected at one end thereof to the second detection probe pin contactor node (235b-1) and at the other end thereof to the second detection probe pin contactor core (235b-3).

In the detection unit, the detection unit (200) may include a detection probe moving unit 240 configured to allow the detection probe pin (230) to be disposed at one end thereof so as to be relatively movable with respect to the base unit (40).

In the detection unit, the detection probe moving unit (240) may include: a detection probe moving body (241) configured to allow the detection probe pin (230) to be disposed at one end thereof; and a detection probe moving guide (280) having one end disposed at the detection probe moving body (241) and the other end disposed so as to be relatively movable with respect to the base unit (40).

In the detection unit, the detection probe moving unit (240) may include a detection probe damping unit (270) configured to damp the movement of the detection probe moving body (241).

In the detection unit, the detection probe damping unit (270) may include: a damping moving body accommodating part (271) disposed at the inside of the detection probe moving body (241); a damping elastic part (273) disposed inside the damping body accommodating part (271) in such a manner as to be supported at one end thereof by the inner side of the damping body accommodating part (271); and a damping plunger (275) brought at one end thereof into contact with the damping elastic part (273) and disposed at the other end thereof within the damping body accommodating part (271) so as to be oriented toward the base unit 40 to limit the movement of the detection probe moving body (241).

In the detection unit, the damping plunger (275) may include: a damping plunger body (2751) supported at an end thereof by the damping elastic part (273) in an elastic contact manner; and a damping plunger shaft (2753) connected at one end thereof to the damping plunger body (2751) and accommodatingly disposed at the other end thereof within the damping moving body accommodating part (271) along the longitudinal direction of the damping moving body accommodating part (271).

In the detection unit, the detection probe moving unit 240 may include a detection probe moving sensing unit (290) disposed at the base unit (40) so as to be opposed to the damping plunger body (2751), and configured to be brought into contact with the damping plunger body (2751) to senses a contact state.

In the detection unit, the detection probe moving sensing unit (290) may include a pressure sensor.

In still another aspect, the present invention provides a method of inspecting a semiconductor film layer using a semiconductor film layer inspection apparatus, the method including: a provision step (S1) of providing the semiconductor film layer inspection apparatus according to claim 1; a preparation step (S10) of preparing a substrate (20) having one surface on which an oxide semiconductor layer (31) as an inspection object is formed so that the substrate is disposed on the semiconductor film layer inspection apparatus (10); a carrier generation step (S20) of allowing a carrier generator (300) to increase the carrier concentration of the oxide semiconductor layer (10); and a measurement step (S30) of allowing a detection unit (200) to be brought into contact with at least two points on one surface of oxide semiconductor layer (31) to detect the electrical characteristics of the oxide semiconductor layer (31) by applying an electrical signal to the oxide semiconductor layer (31).

In the semiconductor film layer inspection method, the method may further include, between the preparation step (S10) and the carrier generation step (S20), an alignment step (S10a) of aligning the contact position of at least a part of each of a plurality of detection probe pins (230) included in the detection unit (200) and configured to be brought into close contact with the two points spaced apart from each other on one surface of the oxide semiconductor layer (31).

In the semiconductor film layer inspection method, the alignment step (S10a) may include: a position alignment step (S11a) of applying a position alignment control signal from a control unit to check a relative position between the detection probe pin (230) and the oxide semiconductor layer (31) to allow the detection probe pin (230) to move to a position close proximity to the oxide semiconductor layer (31) in order to detect electrical characteristics of the oxide semiconductor layer (31); and a close contact alignment step (S13a) of applying the control signal from the control unit to a contact alignment control unit (420) to form an on-switching state of a contact alignment electromagnet unit (410) so that the at least a part of the detection probe pin (230) is closely disposed on the oxide semiconductor layer (31).

In yet another aspect, the present invention provides a semiconductor film layer inspection apparatus (10) for detecting the electrical characteristics of a semiconductor film layer (30) formed on one surface of a substrate (20) and including an oxide semiconductor layer (31), the apparatus including: a base unit (40) configured to allow the substrate to be seatingly disposed on one surface thereof; a detection unit (200) configured to be brought into close contact with at least two points on one surface of the oxide semiconductor layer to apply an electrical signal so as to detect the electrical characteristics of the oxide semiconductor layer; and a carrier generator (300, 300a, 300b) configured to increase a concentration of a carrier of the oxide semiconductor layer, wherein the detection unit (200) includes: a detection probe pin (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), wherein the detection probe pin (230) includes: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer, and wherein the detection probe pin contactor unit (233) at least partially forms a plurality of independently detectable and operable segmented pin contactor unit blocks.

In the semiconductor film layer inspection apparatus, the detection probe pin (230) may include one or more detection probe sub pins (230sub), and the detection probe pin contactor unit (233) disposed on each of the detection probe sub pins (230sub) forms an independently detectable and operable pin contactor unit block in units of each detection probe sub pin (230sub).

In the semiconductor film layer inspection apparatus, the semiconductor film layer inspection apparatus may further include a detecting calibration module (500) disposed between the detection probe module (202) and the detection probe pin (230), and configured to apply, as an independently operable detection signal, a detection signal from a detection probe module (202) to a detection probe pin contactor unit (233) that forms one or more independently detectable and operable pin contactor unit blocks and configured to process an independently operable detection sensing signal applied thereto from the detection probe pin contactor unit (233) for application to the detection probe module (202).

In the semiconductor film layer inspection apparatus, the detecting calibration module (500) may include: a detecting calibration data selector (520) configured to select a target pin contactor unit block from among the plurality of pin contactor unit blocks using the detection signal from the detection probe module (202) as the independently operable detection signal, and configured to output, as the independently operable detection sensing signal from the detection probe pin contactor unit (233) of a corresponding pin contactor unit block of the pin contactor unit blocks, the detection sensing signal applied to the detecting calibration module (500) from the detection probe pin contactor unit (233); and a detecting calibration control unit (510) configured to determine whether to use the independently operable detection sensing signal from the detection probe pin contactor unit (233) of the corresponding pin contactor unit block based on the independently operable detection sensing signals of the plurality of pin contactor unit blocks and information on the number of the detection probe pin contactor units (233), and configured to perform a normalization of the electrical characteristics of the semiconductor film layer (30) including the oxide semiconductor layer (31) based on the number of the detection probe pin conductor units (233) depending on whether to use the independently operable detection sensing signal from the detection probe pin contactor unit (233) of the corresponding pin contactor unit block.

In the semiconductor film layer inspection apparatus, the detecting calibration control unit (510) may include: a detecting calibration calculation control unit (511) configured to calculate independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units (233); a detecting calibration determination control unit (513) configured to compare the independently operable detection sensing signals per the number of the detection probe pin contactor units, calculated by the calibration calculation control unit (511) with independently operable detection sensing signal reference values per the number of the detection probe pin contactor units, which are stored in a detecting calibration storage unit (530), and determine whether to use the independently operable detection sensing signals per the number of the detection probe pin contactor units as independently operable detection sensing signals; and a detecting calibration update control unit (515) configured to update the independently operable detection sensing signals per the number of the detection probe pin contactor units as the independently operable detection sensing signal reference values per the number of the detection probe pin contactor units, which are stored in the detecting calibration storage unit 530 if the detecting calibration determination control unit (513) determines to use the independently operable detection sensing signals per the number of the detection probe pin contactor units as independently operable detection sensing signals.

In the semiconductor film layer inspection apparatus, the detection probe pin body (231) may include: a detection probe pin body base (231-1) configured to allow the detection probe pin contactor unit (233) to be disposed thereon; and a detection probe pin body line (231-2) disposed on one surface of the detection probe pin body base (231-1) to allow the detection probe pin contactor unit (233) to be electrically connected to the detection probe pin contactor unit (233).

In the semiconductor film layer inspection apparatus, the detection probe pin body base (231-1) may include an FPCB, and wherein the detection probe pin contactor unit (233) comprises one or more detection probe pin contactors (235) disposed on one surface of the detection probe pin body base (231-1) so as to be electrically connected to the detection probe pin body line (231-2), and configured to be brought into direct contact with the oxide semiconductor layer.

In the semiconductor film layer inspection apparatus, at least one of the one or more detection probe pin contactors (235) may be applied with an electrical signal different from that of at least another adjacent detection probe pin contactor (235).

In the semiconductor film layer inspection apparatus, the detection probe pin contactors (235) may form a structure in which at least one part thereof captures another part thereof.

In the semiconductor film layer inspection apparatus, the detection unit (200) may include a detection probe moving unit (240) configured to allow the detection probe pin (230) to be disposed at one end thereof so as to be relatively movable with respect to the base unit (40).

In the semiconductor film layer inspection apparatus, the detection probe moving unit (240) may include: a detection probe moving body (241) configured to allow the detection probe pin (230) to be disposed at one end thereof; and a detection probe moving guide (280) having one end disposed at the detection probe moving body (241) and the other end disposed so as to be relatively movable with respect to the base unit (40).

In the semiconductor film layer inspection apparatus, the detection probe moving unit 240 may include a detection probe damping unit (270) configured to damp the movement of the detection probe moving body (241).

In the semiconductor film layer inspection apparatus, the detection probe damping unit (270) may include: a damping moving body accommodating part (271) disposed at the inside of the detection probe moving body (241); a damping elastic part (273) disposed inside the damping body accommodating part (271) in such a manner as to be supported at one end thereof by the inner side of the damping body accommodating part (271); and a damping plunger (275) brought at one end thereof into contact with the damping elastic part (273) and disposed at the other end thereof within the damping body accommodating part (271) so as to be oriented toward the base unit 40 to limit the movement of the detection probe moving body (241).

In the semiconductor film layer inspection apparatus, the damping plunger (275) may include: a damping plunger body (2751) supported at an end thereof by the damping elastic part (273) in an elastic contact manner; and a damping plunger shaft (2753) connected at one end thereof to the damping plunger body (2751) and accommodatingly disposed at the other end thereof within the damping moving body accommodating part (271) along the longitudinal direction of the damping moving body accommodating part (271).

In the semiconductor film layer inspection apparatus, the detection probe moving unit 240 may include a detection probe moving sensing unit (290) disposed at the base unit (40) so as to be opposed to the damping plunger body (2751), and configured to be brought into contact with the damping plunger body (2751) to senses a contact state.

In the semiconductor film layer inspection apparatus, the detection probe moving sensing unit 290 may include a pressure sensor.

In a further another aspect, the present invention provides a detection unit (200) configured to be brought into close contact with at least two points on one surface of the oxide semiconductor layer to detect the electrical characteristics of the oxide semiconductor layer by applying an electrical signal, wherein the detection unit (200) includes: a detection probe pin (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), wherein the detection probe pin (230) includes: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer, wherein the detection probe pin contactor unit 233 at least partially forms a plurality of independently detectable and operable segmented pin contactor unit blocks, wherein the detection probe pin body (231) includes: a detection probe pin body base (231-1) configured to allow the detection probe pin contactor unit (233) to be disposed thereon; and a detection probe pin body line (231-2) disposed on one surface of the detection probe pin body base (231-1) so as to be electrically connected to the detection probe pin contactor unit (233), wherein the detection probe pin body base (231-1) includes an FPCB, and the detection probe pin contactor unit (233) comprises one or more detection probe pin contactors (235) disposed on one surface of the detection probe pin body base (231-1) so as to be electrically connected to the detection probe pin body line (231-2), and configured to be brought into direct contact with the oxide semiconductor layer, and wherein at least one of the one or more detection probe pin contactors (235) is applied with an electrical signal different from that of at least another adjacent detection probe pin contactor (235).

In the detection unit, the detection probe pin contactors (235) may form a structure in which at least one part thereof captures another part thereof.

In the detection unit, the detection unit (200) may include a detection probe moving unit (240) configured to allow the detection probe pin (230) to be disposed at one end thereof so as to be relatively movable with respect to the base unit (40) configured to allow the substrate on which the semiconductor film layer (30) comprising the oxide semiconductor layer is formed to be seatingly disposed on one surface thereof.

In the detection unit, the detection probe moving unit (240) may include: a detection probe moving body (241) configured to allow the detection probe pin (230) to be disposed at one end thereof; and a detection probe moving guide (280) having one end disposed at the detection probe moving body (241) and the other end disposed so as to be relatively movable with respect to the base unit (40) configured to allow the substrate to be seatingly disposed on one surface thereof.

In the detection unit, the detection probe moving unit 240 may include a detection probe damping unit (270) configured to damp the movement of the detection probe moving body (241).

In the detection unit, the detection probe damping unit (270) may include: a damping moving body accommodating part (271) disposed at the inside of the detection probe moving body (241); a damping elastic part (273) disposed inside the damping body accommodating part (271) in such a manner as to be supported at one end thereof by the inner side of the damping body accommodating part (271); and a damping plunger (275) brought at one end thereof into contact with the damping elastic part (273) and disposed at the other end thereof within the damping body accommodating part (271) so as to be oriented toward the base unit (40) having one surface on which the substrate is seatingly disposed to limit the movement of the detection probe moving body (241).

In the detection unit, the damping plunger (275) may include: a damping plunger body (2751) supported at an end thereof by the damping elastic part (273) in an elastic contact manner; and a damping plunger shaft (2753) connected at one end thereof to the damping plunger body (2751) and accommodatingly disposed at the other end thereof within the damping moving body accommodating part (271) along the longitudinal direction of the damping moving body accommodating part (271).

In the detection unit, the detection probe moving unit 240 may include a detection probe moving sensing unit (290) disposed at the base unit (40) so as to be opposed to the damping plunger body (2751), and configured to be brought into contact with the damping plunger body (2751) to senses a contact state.

In the detection unit, the detection probe moving sensing unit 290 may include a pressure sensor.

In a still further aspect, the present invention provides a method of inspecting a semiconductor film layer using a semiconductor film layer inspection apparatus (10) for detecting the electrical characteristics of a semiconductor film layer (30) formed on one surface of a substrate (20) and including an oxide semiconductor layer (31), the apparatus including: a base unit (40) configured to allow the substrate to be seatingly disposed on one surface thereof; a detection unit (200) configured to be brought into close contact with at least two points on one surface of the oxide semiconductor layer to detect the electrical characteristics of the oxide semiconductor layer by applying an electric signal; and a carrier generator (300, 300a, 300b) configured to increase a concentration of a carrier of the oxide semiconductor layer, wherein the detection unit (200) comprises: a detection probe pin (230) configured to be brought into close contact with one or more points spaced apart from each other on one surface of the oxide semiconductor layer: and a detection probe module (202) configured to generate a detection signal for application to the detection probe pin (230) to detect the electrical characteristics of the oxide semiconductor layer, and configured to sense a detection sensing signal inputted thereto from the detection probe pin (230), wherein the detection probe pin (230) comprises: a detection probe pin body (231) disposed spaced apart from the oxide semiconductor layer; and a detection probe pin contactor unit (233) disposed at one end thereof at the detection probe pin body (231) and brought at the other end thereof into direct contact with the oxide semiconductor layer, and wherein the detection probe pin contactor unit (233) at least partially forms a plurality of independently detectable and operable segmented pin contactor unit blocks, wherein the method includes: a provision step (S1) of providing the semiconductor film layer inspection apparatus; a preparation step (S10) of preparing a substrate (20) having one surface on which an oxide semiconductor layer (31) as an inspection object is formed so that the substrate is disposed on the semiconductor film layer inspection apparatus (10); a carrier generation step (S20) of allowing a carrier generator (300) to increase the carrier concentration of the oxide semiconductor layer (10); and a measurement step (S30) of allowing a detection unit (200) to be brought into contact with at least two points on one surface of oxide semiconductor layer (31) to detect the electrical characteristics of the oxide semiconductor layer (31) by applying an electric signal to the oxide semiconductor layer (31), and wherein the measurement step (S30) includes: a sequential measurement step (S31) of acquiring a detection sensing signal as an independently operable detection sensing signal individually or in preset single or plural units of blocks for a plurability of pin contactor unit blocks which are segmented in a preset manner; a calibration step (S33) of confirming and calculating a sequential measurement value measured in a target pin contactor unit block using the detection sensing signal acquired individually for the segmented pin contactor unit blocks in the sequential measurement step (S31) as the independently operable detection sensing signal, and determining validity of the calculated sequential measurement value as the independently operable detection sensing signal; and a measurement confirmation step (S35) of outputting the final electrical characteristics of the oxide semiconductor layer as a result of determination in the calibration step (S33).

In the semiconductor film layer inspection method, the semiconductor film layer inspection apparatus (10) may further include a detecting calibration module (500) disposed between the detection probe module (202) and the detection probe pin (230), and configured to apply, as an independently operable detection signal, a detection signal from a detection probe module (202) to a detection probe pin contactor unit (233) that forms one or more independently detectable and operable pin contactor unit blocks and configured to process an independently operable detection sensing signal applied thereto from the detection probe pin contactor unit (233) for application to the detection probe module (202), wherein the detecting calibration module (500) may include: a detecting calibration data selector (520) configured to select a target pin contactor unit block from among the plurality of pin contactor unit blocks using the detection signal from the detection probe module 202 as the independently operable detection signal, and configured to output as the independently operable detection sensing signal from the detection probe pin contactor unit (233) of a corresponding pin contactor unit block of the pin contactor unit blocks, the detection sensing signal applied to the detecting calibration module (500) from the detection probe pin contactor unit (233); and a detecting calibration control unit (510) configured to determine whether to use the independently operable detection sensing signal from the detection probe pin contactor unit (233) of the corresponding pin contactor unit block based on the independently operable detection sensing signals of the plurality of pin contactor unit blocks and information on the number of the detection probe pin contactor units (233), and configured to perform a normalization of the electrical characteristics of the semiconductor film layer (30) including the oxide semiconductor layer (31) based on the number of the detection probe pin conductor units (233) depending on whether to use the independently operable detection sensing signal from the detection probe pin contactor unit 233 of the corresponding pin contactor unit block, and wherein the sequential measurement step (S31) may include: a sequential measurement mode confirmation step (S311) of allowing the detecting calibration control unit (510) to confirm a sequential measurement mode which is to be selected and executed by a user; and a sequential measurement mode execution step (S313) of acquiring the detection sensing signal as the independently operable detection sensing signal individually for the segmented pin contactor unit blocks according to the sequential measurement mode selected through the detecting calibration control unit (510) according to the sequential measurement mode confirmed in the sequential measurement mode confirmation step (S311).

In the semiconductor film layer inspection method, the calibration step (S33) may include: a sequential measurement value confirmation and calculation step (S331) of allowing a detecting calibration calculation control unit (511) of a detecting calibration control unit (510) to calculate independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units (233); and a calibration validity determination step (S333) of allowing a detecting calibration determination control unit (513) of the detecting calibration control unit (510) to determine whether to use the independently operable detection sensing signals per the number of the detection probe pin contactor units as independently operable detection sensing signals based on the independently operable detection sensing signals per the number of the detection probe pin contactor units, calculated by the detecting calibration calculation control unit (511).

Effects of the Invention

According to the present invention as constructed above, it is possible to more accurately detect the electrical characteristics of the oxide semiconductor layer through an increase in the free carrier concentration by the carrier generator unlike a conventional simple two-point method.

In addition, according to the present invention as constructed above, the carrier generator enables to provide a simple but more reinforced type of detection result through the application or/and irradiation of voltage or/and light to the electrode layer.

In addition, according to the present invention as constructed above, it is possible to more accurately detect the electrical characteristics of the oxide semiconductor layer through an increase in the free carrier concentration by the carrier generator unlike a conventional simple two-point method, as well as it is possible to significantly increase the accuracy and reliability of the detection of the electrical characteristics of the oxide semiconductor layer through improvement of the structure of the probe.

Further, according to the present invention as constructed above, it is possible to maximize the detection accuracy and reliability of the electrical characteristics of the oxide semiconductor layer by providing a closer contact structure through an elastic arrangement structure of the probe and securing a close contact positioning structure through a magnetic positioning function.

Besides, according to the present invention as constructed above, the detection probe pin contactor unit forms a plurality of independently detectable and operable pin contactor unit blocks so that reliability and robustness of the electrical characteristics data of the oxide semiconductor layer can be improved.

BRIEF DESCRIPTION OF THE DRAWINGS

The above and other objects, features and advantages of the present invention will be apparent from the following detailed description of the preferred embodiments of the invention in conjunction with the accompanying drawings, in which.

EXPLANATION ON REFERENCE NUMERALS OF MAIN ELEMENTS IN THE DRAWINGS

Figure 1:
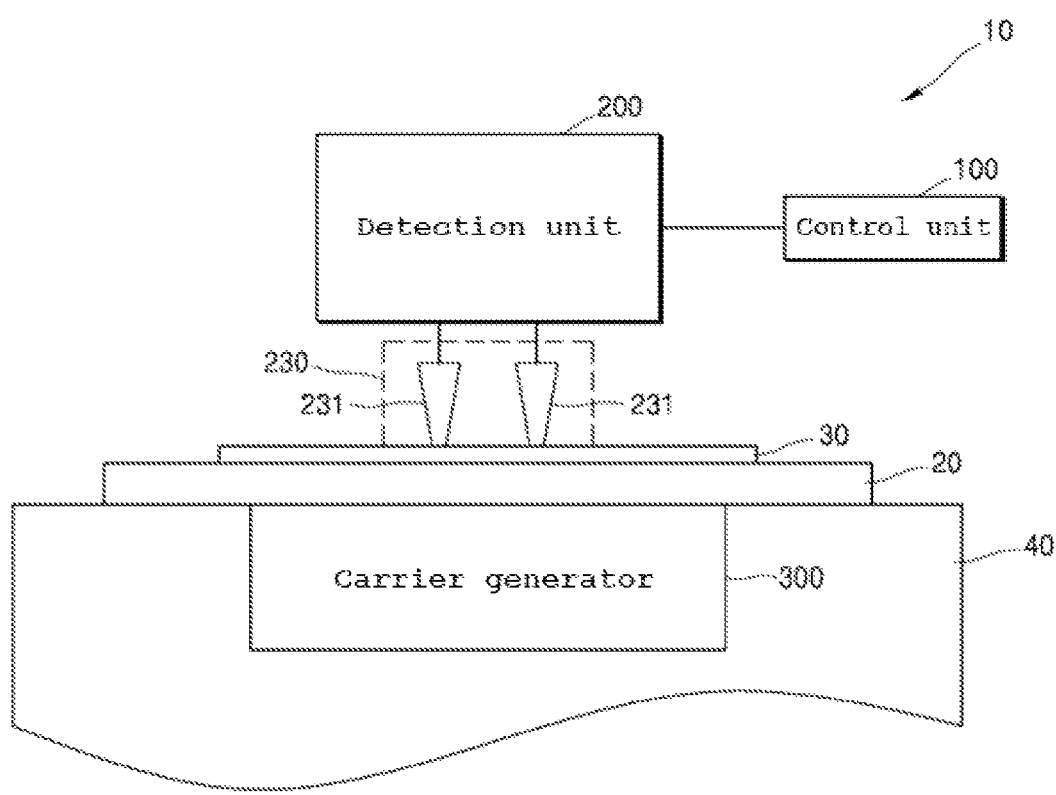
FIG. 1 is a block diagram illustrating a configuration of a semiconductor film layer inspection apparatus according to one embodiment of the present invention.

10: semiconductor film layer inspection apparatus
30: semiconductor film layer
40: base unit
300: carrier generator

DESCRIPTION OF THE PREFERRED EMBODIMENTS

Now, preferred embodiments of the present invention will be described hereinafter in detail with reference to the accompanying drawings. It should be noted that the same elements in the drawings are denoted by the same reference numerals although shown in different figures. In the following description, the detailed description on known function and constructions unnecessarily obscuring the subject matter of the present invention will be avoided hereinafter.

The present invention provides an apparatus for inspecting a semiconductor film layer for more easily peeling off a protective film attached to the active surface of a semiconductor wafer so as to protect damage to a semiconductor chip subjected to a back grinding step or a sawing step in a semiconductor chip manufacturing process, and a control method thereof.

The present invention according to one embodiment of the present invention provides a semiconductor film layer inspection apparatus 10 for detecting the electrical characteristics of a semiconductor film layer 30 formed on one surface of a substrate 20 and including an oxide semiconductor layer 31.

More specifically, the semiconductor film layer inspection apparatus 10 of the present invention includes a base unit 40, a detection unit 200, and a carrier generator 300.

As shown in FIG. 1, the base unit 40 allows the substrate to be seatingly disposed on one surface thereof. A sufficient mass is disposed on the base unit 40 to allow the substrate 20 to be disposed on one surface of the base unit, and then it is separated from the base unit 40 after the mass disposition work. The base unit 40 may have a structure in which the substrate 20 disposed on the one surface is not affected by the mass disposition work in such series of processes.

The base unit 40 may provide a stable mounting space so that various switches and devices such as a control unit 100 can be disposed thereon.

The semiconductor film layer 30 is disposed on one surface of the substrate 20 disposed on the base unit 40, and includes the oxide semiconductor layer 31. In this case, the substrate 20 is composed of glass in this embodiment. In some embodiments, the substrate 20 may be composed of various materials selected within the scope of being made of a transparent material including ultra-thin glass (UTG), plastic such as polyimide, or the like.

Figure 4:
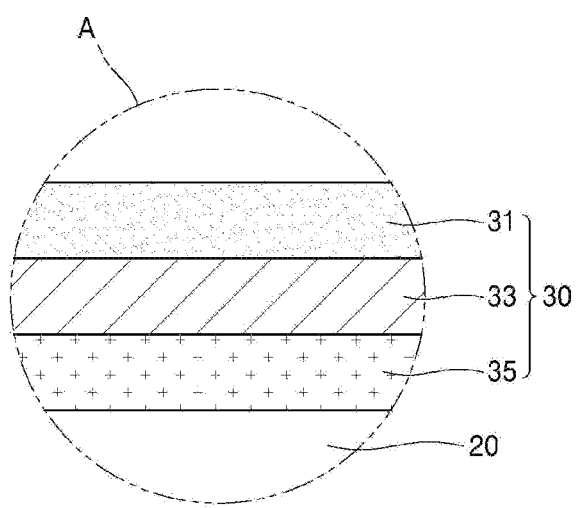
FIGS. 4 and 5 are partially enlarged cross-sectional views of portions "A" and "B" shown in FIG. 2.
Figure 5:
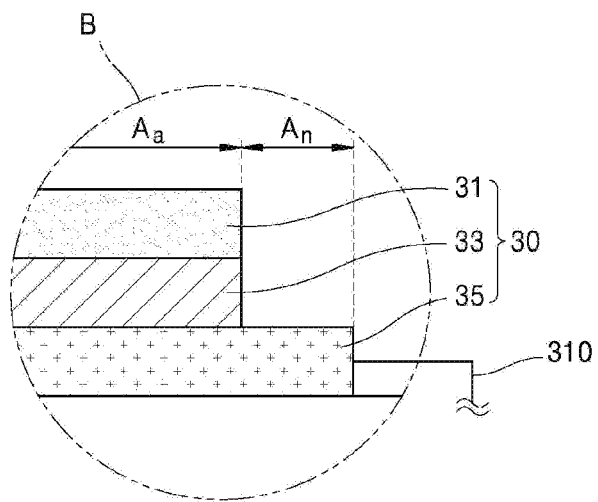

As shown in FIG. 4, the semiconductor film layer 30 formed on one surface of the substrate 20 may include an insulator layer 33. The insulator layer 33 includes an oxide layer such as $SiO_2$, $SiN_x$, $Al_2O_3$, or the like, and the insulator layer 33 is implemented as an $SiO_2$ layer in this embodiment. The oxide semiconductor layer 31 disposed on one surface of the insulator layer 33 of the semiconductor film layer 30 includes an amorphous oxide transparent semiconductor having a wide band gap of 3 eV or more such as indium gallium Zinc oxide (IGZO).

The detection unit 200 of the present invention is brought into close contact with at least two points on one surface of the oxide semiconductor layer to detect the electrical characteristics of the oxide semiconductor layer by applying an electrical signal. As described below, the detection unit 200 of the present invention may apply an electrical signal, and detect the electrical characteristics of the oxide semiconductor layer, i.e., the surface characteristics of the semiconductor layer, such as the current-voltage or capacitance-voltage characteristics. The present invention employs a two-point method that is a method for detecting characteristics through contact at two points of the oxide semiconductor layer, and a current-voltage or a capacitance-voltage is measured to extract the state density for a plurality of frequencies, and a detailed description of a configuration thereof will be made later.

The carrier generator 300 is connected to the semiconductor film layer 30 and is induced to increase a carrier, i.e., a concentration of the carrier of the oxide semiconductor layer. The carrier generator 300 may provide energy, i.e., excitation energy to the oxide semiconductor layer to increase the free carrier so as to enable to detect the electrical characteristics of the oxide semiconductor layer 31.

Figure 2:
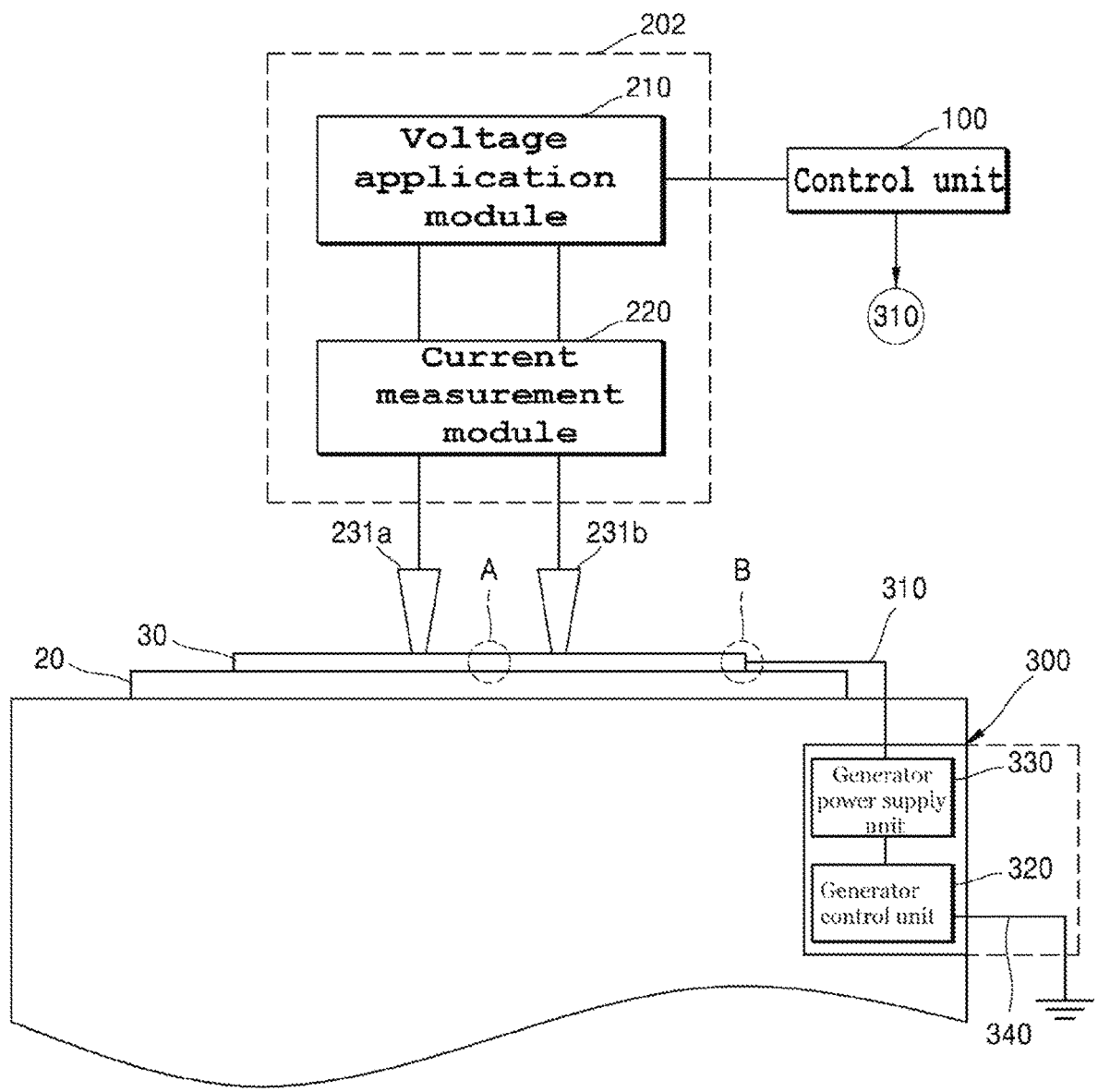
FIG. 2 is a schematic block diagram illustrating a configuration of a semiconductor film layer inspection apparatus according to one embodiment of the present invention.

More specifically, as shown in FIG. 2, the oxide semiconductor layer 31 may include an electrode layer 35 disposed between the oxide semiconductor layer 31 and the substrate 20. Although the electrode layer 35 is implemented as a metal electrode, it may be configured in various manners, such as being formed as a transparent electrode such as an indium tin oxide (ITO) electrode in some embodiment.

The detection unit 200 of according to one embodiment of the present invention includes a plurality of detection probe pins 230 and a detection probe module 202. The plurality of detection probe pins 230 is brought into close contact with the two points spaced apart from each other on one surface of the oxide semiconductor layer. The detection probe module 202 generates a detection signal for application to the detection probe pin 230 to detect the electrical characteristics of the semiconductor film layer 30 and senses a detection sensing signal inputted thereto from the detection probe pin 230. The generation of the detection signal and the detection of the electrical characteristics of the semiconductor film layer 30 may be performed in response to a control signal from the control unit 100.

In this embodiment, the detection probe pin 230 includes a first detection probe pin body 231a and a second detection probe pin body 231b, each of which is brought into direct contact with one surface of the oxide semiconductor layer 31 of the semiconductor film layer 30 to enable the identification of the electrical characteristics through the two-point method.

The detection probe module 202 includes a voltage application module (210) and a current measurement module 220.

In other words, the voltage application module 210 generates the detection signal for application to the detection probe pins 230, and the current measurement module 220 measures the detection sensing signal through the plurality of detection probe pins 230. In the voltage application and current measurement process, the voltage application module 210 and the current measurement module 220 are operated in response to the control signal from the control unit 100.

Figure 3:
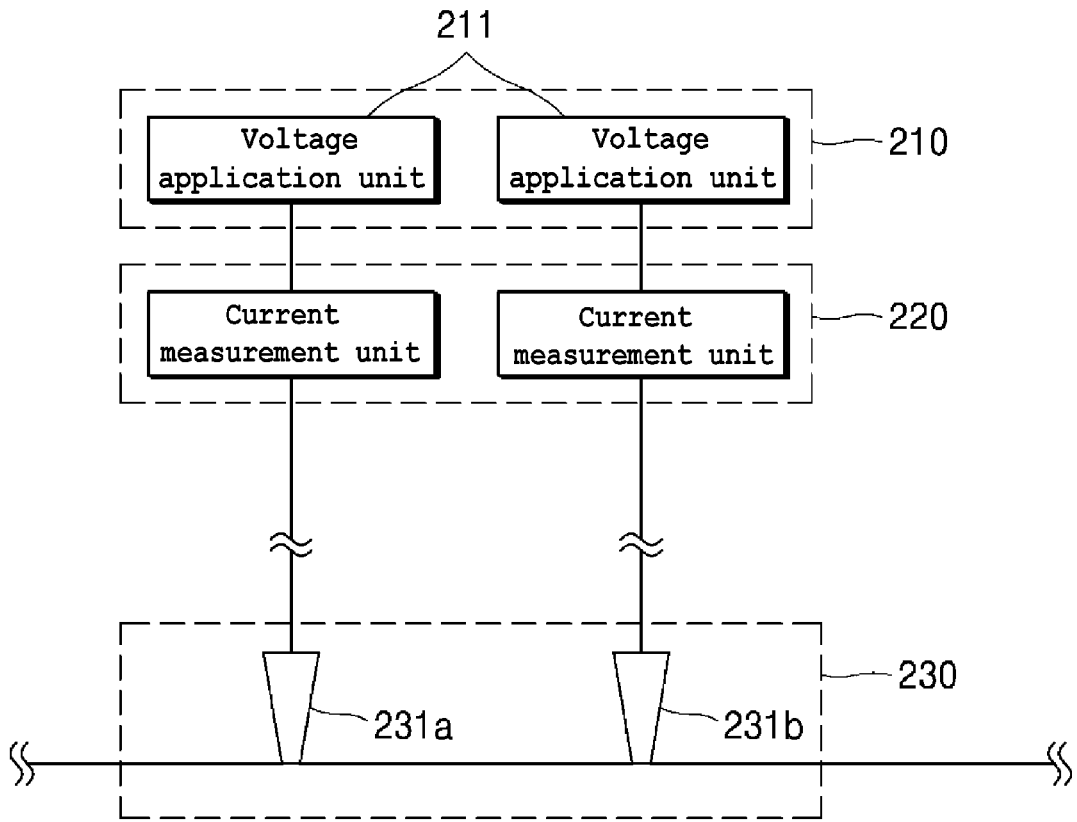
FIG. 3 is a block diagram illustrating a configuration of a detection unit of a semiconductor film layer inspection apparatus according to one embodiment of the present invention.

In some embodiments, the first detection probe pin body 231a and the second detection probe pin body 231b may have a connection structure with an individual voltage applying module 210 and an individual current measuring module 220. As shown in FIG. 3, the voltage applying module 210 may include a first and second voltage applying unit 211, and the current measuring module 220 may include a first and second current measuring unit 221. Each of the voltage applying unit 211 and the current measuring unit 221 is connected to each of the first detection probe pin body 231a and the second detection probe pin body 31b of the plurality of detection probe pins 230 to perform the voltage application and current measurement operation.

In this case, the oxide semiconductor layer (300) includes a generator ground line 340. The generator ground line 340 has a structure of being electrically connected at one end thereof to the electrode layer 35 and connected at the other end thereof to the ground. The carrier generator 300 includes a generator power supply unit 330. The generator power supply unit 330 is disposed between the electrode layer 35 and the generator ground line (330) through a line 310. In this embodiment, the generator power supply unit 330 may be implemented as a DC power supply to enable stable detection of the electrical characteristics through the detection unit 200 which will be described later. In some embodiments, a generator control unit 320 may be further provided between the generator ground line 340 and the generator power supply unit 330, and the generator control unit 320 may be modified in various manners, such as performing an operation in response to the control signal from the control unit 100.

As such, more accurate characteristic detection data may be secured through a configuration of enabling to detect the electrical characteristics of the oxide semiconductor layer having a configuration that simulates a bottom gate thin film transistor.

The electrical characteristics detection process through the detection unit may be performed as follows. First, a provision step S1 (see FIG. 6) of providing the semiconductor film layer inspection apparatus 10 of the present invention is performed, and a preparation step S10 of preparing a sample object whose characteristics is to be inspected is performed so that the sample object is disposed on the semiconductor film layer inspection apparatus 10. In the preparation step, the substrate 20 is provided on which the oxide semiconductor layer 31 as the inspection sample object is formed. The formation of the oxide semiconductor layer 31 on the substrate 20 is performed in such a manner that the electrode layer 35 formed of a metal electrode material or a transparent electrode material is formed on one surface of the substrate 20, an insulating layer 33 is formed on one surface of the electrode layer 35, and the oxide semiconductor layer 31 is formed on one surface of the insulating layer 33. In some embodiments, the electrode layer 35 is partially exposed to the outside so that a connection between the electrode layer 35 and the carrier generator 300 can be established more smoothly. In other words, in the case where a stacked area on one surface of the electrode layer 35 is indicated by reference numeral Aa and a non-stacked area on one surface of the electrode layer 35 is indicated by reference numeral An, the non-stacked area An may be disposed to be at least partially exposed along an outer periphery to enable a smooth connection between the semiconductor film layer 30 and the carrier generator 300 or the detection unit 200.

Thereafter, a carrier generation step S20 is performed to form a state of enabling detection through the free carrier is possible, and a measurement step S30 is performed in which a current is measured by the first and second current measurement unit 221 of the current measurement module 220 connected to the first detection probe pin body 231a and the second detection probe pin body 231b that is brought into direct contact with one surface of the oxide semiconductor layer 31, with varying the voltage of the first and second voltage application unit 211 in a state where the electrode layer 35 has been biased to the generator power unit 330 implemented as the DC power supply.

Meanwhile, in the above embodiment, the detection unit includes a voltage application module and the current measurement module to detect the current-voltage characteristics of the oxide semiconductor layer, but the semiconductor film layer inspection apparatus 10 of the present invention may have different configurations. In other words, the detection probe module 202 may have a configuration of including a capacitance-voltage measurement module 210a. The capacitance-voltage measurement module 210a generates the detection signal for application to the plurality of detection probe pins 230 and measures the detection sensing signal through the plurality of detection probe pins 230 to detect the electrical characteristics of the oxide semiconductor layer. Herein, the capacitance-voltage measurement module 210a may be implemented as a C-V meter or an LCR meter.

The electrical characteristics detection process through the detection unit may be performed as follows. First, a provision step S1 (see FIG. 6) of providing the semiconductor film layer inspection apparatus 10 of the present invention is performed, and a preparation step S10 of preparing a sample object whose characteristics is to be inspected is performed so that the sample object is disposed on the semiconductor film layer inspection apparatus 10. In the preparation step, the substrate 20 is provided on which the oxide semiconductor layer 31 as the inspection sample object is formed. The formation of the oxide semiconductor layer 31 on the substrate 20 is performed in such a manner that the electrode layer 35 formed of a metal electrode material or a transparent electrode material is formed on one surface of the substrate 20, an insulating layer 33 is formed on one surface of the electrode layer 35, and the oxide semiconductor layer 31 is formed on one surface of the insulating layer 33. Thereafter, a carrier generation step S20 is performed to form a state of enabling detection through the free carrier is possible, and a measurement step S30 is performed in which the electrode layer 35 may be biased to the generator power unit 330 implemented as the DC power supply or may be directly grounded so as be biased to a DC level as in the previous embodiment. Then, the first detection probe pin body 231a and the second detection probe pin body 231b are short-circuited. Subsequently, a current is measured by the first and second current measurement unit 221 of the current measurement module 220 connected to the first detection probe pin body 231a and the second detection probe pin body 231b that is brought into direct contact with one surface of the oxide semiconductor layer 31, with varying the voltage of the first and second voltage application unit 211.

Figure 36:
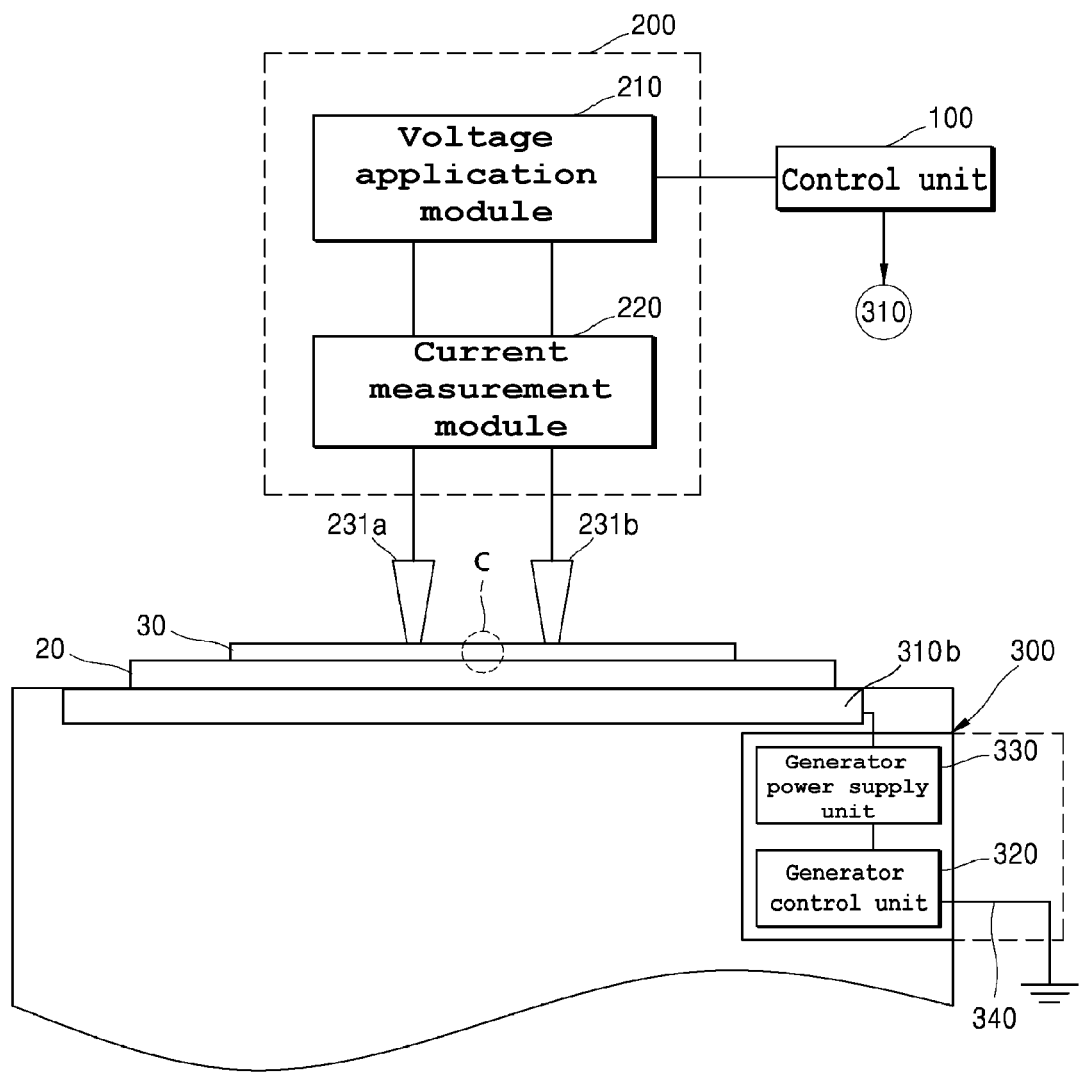
FIG. 36 is a schematic block diagram illustrating a configuration of a semiconductor film layer inspection apparatus according to another embodiment of the present invention.
Figure 37:
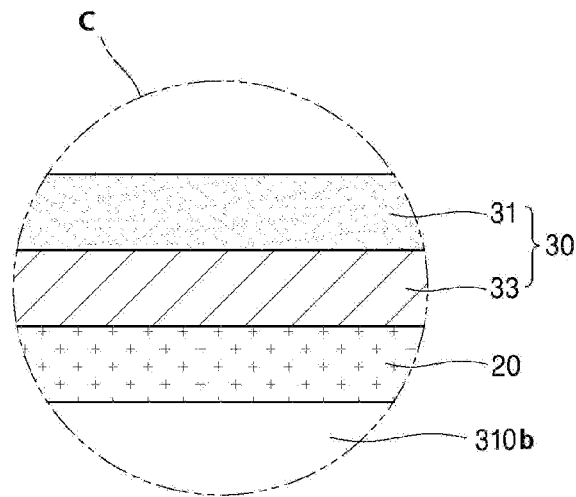
FIG. 37 is a partially enlarged cross-sectional views of a portion "C" shown in FIG. 36.

In the meantime, in the above embodiments, although a description has been made focusing on the case where the electrode layer serving as a gate is directly formed on the substrate 20 in a form that simulates the bottom gate thin film transistor, the present invention is not limited thereto, but may be modified in various manners depending on design specifications. In other words, as shown FIGS. 36 and 37, the semiconductor film layer inspection apparatus (10) in this embodiment includes a carrier generator 300. The carrier generator 300 includes a conductive base 310b and a generator ground line 340. The conductive base 310b is disposed on a base structure of forming the carrier generator 300 and allows the substrate 20 to be disposed on one surface thereof. The generator ground line 340 is electrically connected at one end thereof to the conductive base 310b and connected at the other end thereof to the ground. A generator control unit or a generator power supply unit is provided between the conductive base 310b and the other end of the generator ground line 340, and the conductive base 310b is implemented as a gate electrode in a transistor simulation structure to enable to perform a potential formation function through switching or supply of power, which is the same as the structure described above.

Figure 8:
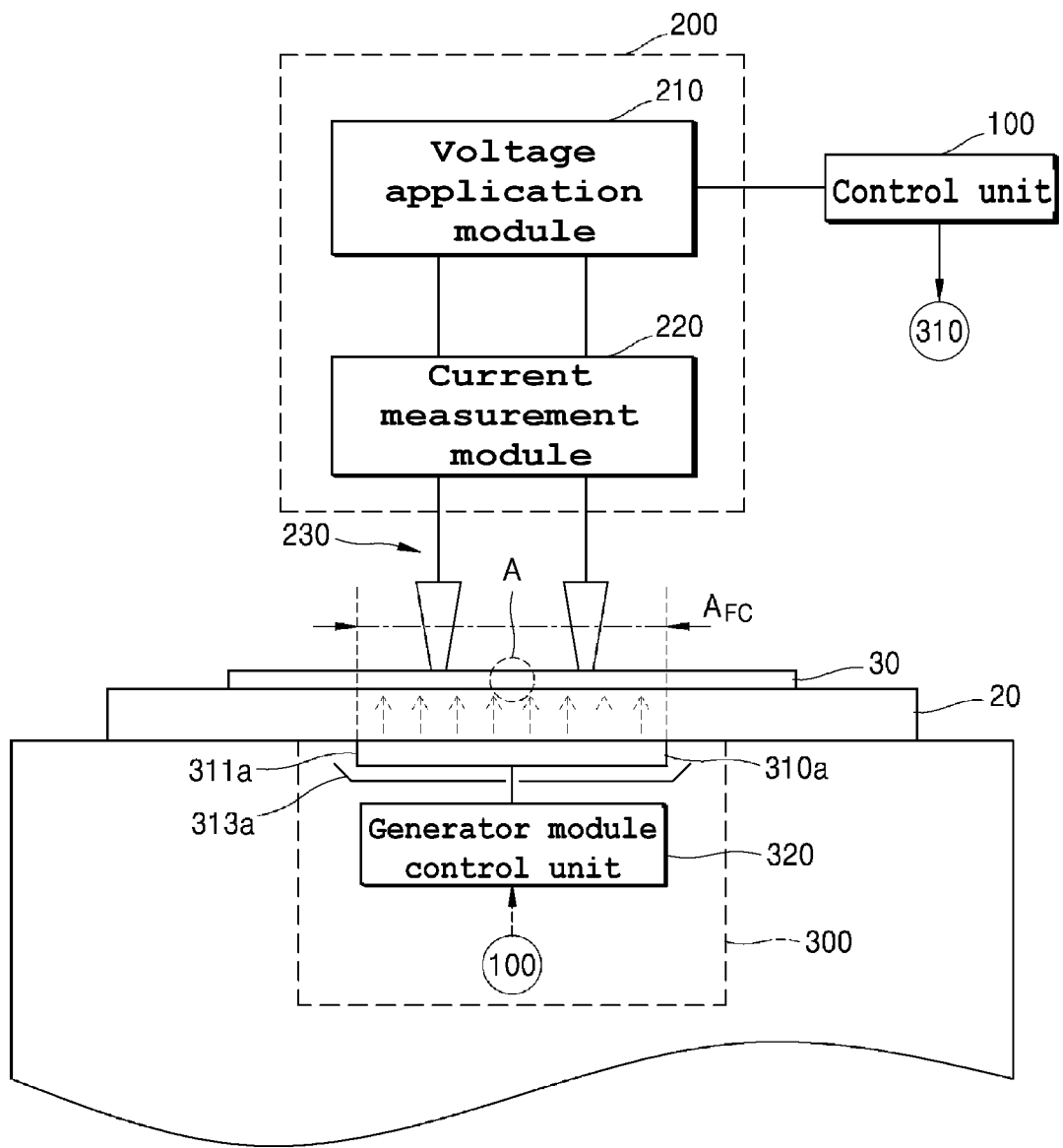
FIG. 8 is a block diagram illustrating a configuration of a detection unit of a semiconductor film layer inspection apparatus according to still another embodiment of the present invention.

Further, in the meantime, although a carrier generation function using the electrode layer has been implemented in a form that simulates the bottom gate thin film transistor in the above embodiments, the carrier generator of the present invention is not limited thereto, but may provide an excitation structure through a light source. In other words, as shown in FIG. 8, the carrier generator 300 may include a generator light source unit 310a. The generator light source unit 310a irradiates light of a predetermined wavelength band to the oxide semiconductor layer 31, and such a wavelength band may be variably formed in a plurality of wavelength bands.

Figure 7:
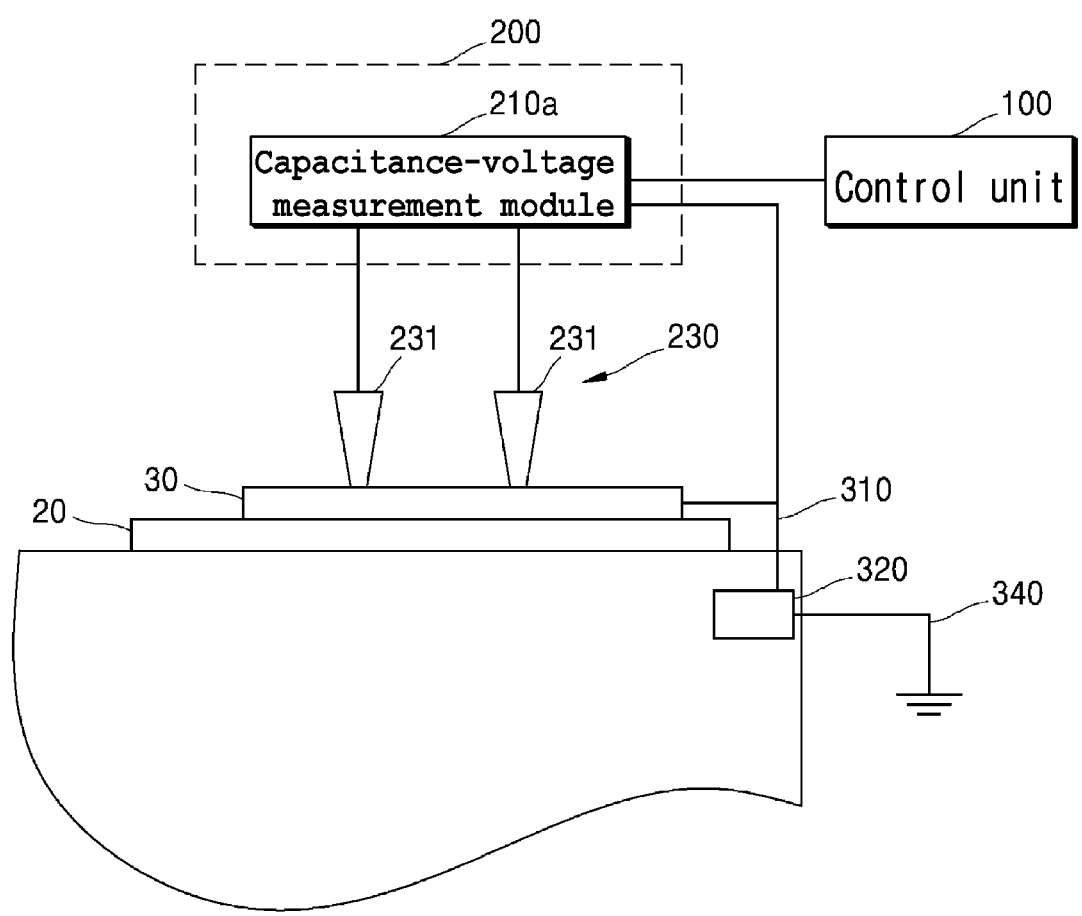
FIG. 7 is a block diagram illustrating a configuration of a detection unit of a semiconductor film layer inspection apparatus according to another embodiment of the present invention.
Figure 9:
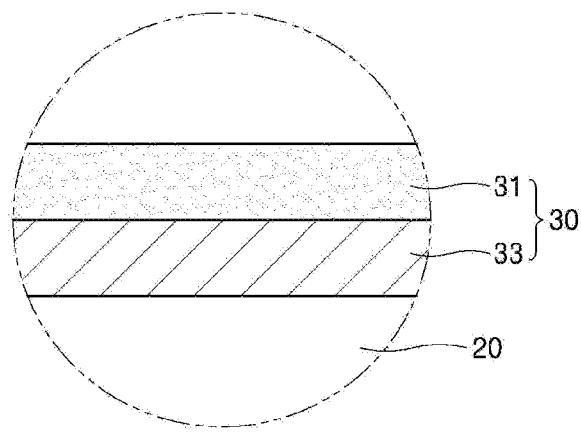
FIG. 9 is a partially enlarged cross-sectional view of a portion "A" shown in FIG. 8.

In this case, the semiconductor film layer 30 may have a configuration in which the electrode layer 35 is excluded from one surface of the substrate 20 provided in FIG. 7 as shown in FIG. 9, unlike the above embodiments.

More specifically, the generator light source unit 310a may include a generator light source 311a and a generator reflection unit 313a. The generator light source 311a may generate the light of a predetermined wavelength band irradiated to the oxide semiconductor layer 31, and the generator reflection unit 313a may reflect the light generated from the generator light source 311a toward the oxide semiconductor layer 31 to enhance the formation of an excitation state.

The generator light source unit 310a is disposed so as to be opposed to the detection unit 20 with the substrate 20 interposed therebewteen so that the generator light source unit 310a can provide the excitation energy through light irradiation from the rear side thereof to the oxide semiconductor layer 31 formed on the insulating layer 33 disposed on one surface of the substrate 20.

The carrier generator 300 shown in FIG. 8 includes a generator module control unit 320, and the generator module control unit 320 may perform an operation implementation control in response to a control signal of the controller 100.

By virtue of such a structure, light of a plurality of wavelength bands, which enables the supply of energy for increasing the free carrier concentration without creating a shaded region at the surface measurement point, may be completely transmitted.

Figure 6:
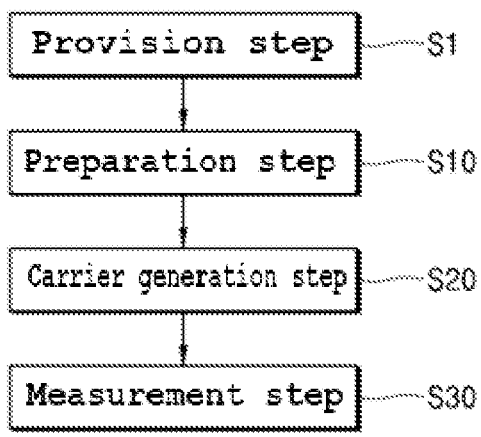
FIG. 6 is a flowchart illustrating a process of controlling a semiconductor film layer inspection apparatus according to one embodiment of the present invention.
Figure 10:
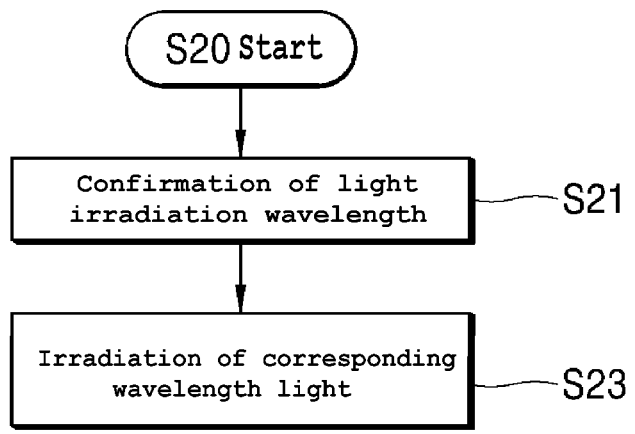
FIG. 10 is a partial flowchart illustrating a process of controlling a semiconductor film layer inspection apparatus according to one embodiment of the present invention.
Figure 11:
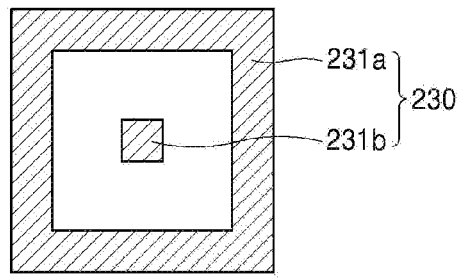
FIGS. 11 to 14 are transverse cross-sectional or projection views of a structure of a detection probe pin.
Figure 12:
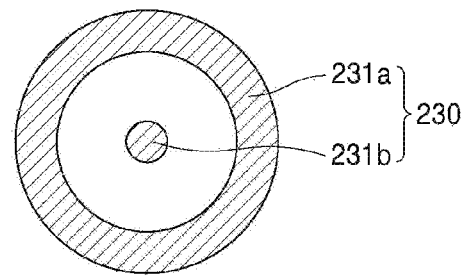

In some embodiments, the carrier generating step S20 of FIG. 6 may take the control flow as shown in FIG. 10 in the embodiment of FIG. 7. In other words, the carrier generation step S20 includes a light irradiation wavelength confirmation step S21 and a corresponding wavelength light irradiation step S23. The light irradiation wavelength confirmation step S21 confirms the wavelength band of the irradiated light and the light irradiation data thereof, stored in a storage unit (not shown) connected to the controller 100, and a control signal thereof is applied to the generator module control unit 320. The corresponding wavelength light irradiation step S23 allows generator module control unit 320 to apply a signal to the generator light source unit 310a to form a predetermined light irradiation output state, and executes an electrical characteristics detection process through the predetermined detection unit.

Meanwhile, in an embodiment of the configuration of FIG. 8, the electrode layer 35 is excluded from one surface of the substrate 20 as a sample as shown in FIG. 9, but such a configuration may be applied even when the electrode layer 35 is formed on one surface of the substrate 20 of the sample.

In other words, the electrode layer 35 may be formed as a transparent electrode layer such as ITO. In this case, the semiconductor film layer inspection apparatus 10 of the present invention may have a structure in which the carrier generator 300 includes both the generator ground line 340 and the generator light source unit 310a. That is, the semiconductor film layer 30 includes an electrode layer 35 disposed between the oxide semiconductor layer 31 and the substrate 20, and formed as a transparent electrode layer. The carrier generator 300 has a structure of including a generator ground line 340 that is electrically connected at one end thereof to the electrode layer 35 and connected at the other end thereof to the ground, and a generator light source unit 310a that irradiates light of a predetermined wavelength band to the oxide semiconductor layer 31. Thus, the carrier generator 300 may have a complex structure that enables detection of various sample objects in both cases, i.e., a case shown in FIGS. 2 and 7, and a case shown in FIG. 8 to improve versatility.

In this case, the electrode layer 35 is a transparent electrode layer, and the generator light source unit 310a may have a structure of being disposed so as to be opposed to the detection unit 20 with the substrate 20 interposed therebewteen to form a smooth excitation energy providing structure without creating a shaded region through light irradiation.

In addition, meanwhile, the semiconductor film layer inspection apparatus 10 of the present invention employs the two-point method, and may have a configuration in which the detection property is further improved other than the probe having a simple separation structure.

In other words, the detection unit 200 include: a detection probe pin 230 that is brought into close contact with one or more points spaced apart from each other on one surface of the oxide semiconductor layer, and a detection probe module 202 that generates a detection signal for application to the detection probe pins 230 to detect the electrical characteristics of the semiconductor film layer 30 and senses a detection sensing signal inputted thereto from the detection probe pin 230. The detection probe pin 230 may be provided in plural numbers, and may have a structure in which an overlapping region occurs on a projection region when ends of plural respective detection probe pins 230 oriented toward the substrate 30 are projected onto a plane C'C' that is perpendicular to the substrate 20 and is parallel to a line segment C-C interconnecting the centroids $C_1$ and $C_2$ of the respective detection probe pins 230 on a plane horizontal to the substrate 20. That is, as shown in FIGS. 11 to 14, one 231a of the detection probe pin 230 may have a closed structure that captures the other 231b thereof. In addition, one 231a of the detection probe pin 230 may have an opened structure that at least partially surrounds the other one 231b thereof.

Figure 13:
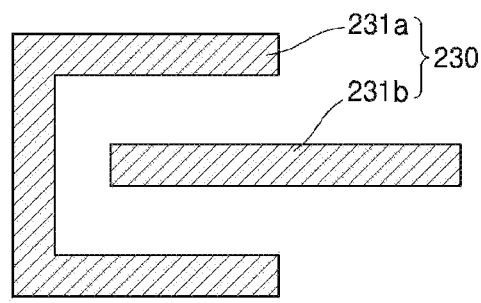
Figure 14:
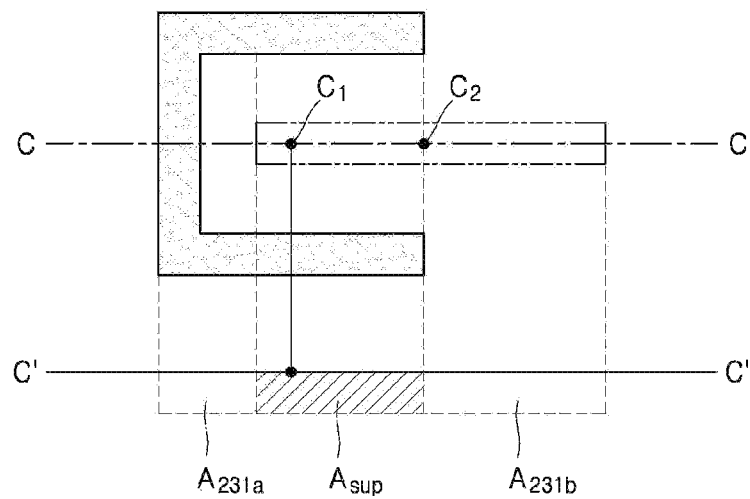

As described above, when the detection probe pins 230 is disposed on the plane horizontal to the substrate 20, the first detection probe pin body 231a indicated by reference numeral 231a and the second detection probe pin body 231b indicated by reference numeral 231b take a figure structure as shown in FIG. 13. In addition, the centroids of the first detection probe pin body 231a and the second detection probe pin body 231b may be indicated by reference numerals C1 and C2, respectively. At this time, in the case where the plane parallel to the line segment C-C interconnecting the two centroids C1 and C2 and perpendicular to the plane on which the substrate 20 is disposed is referred to as a plane C'C' and the overlapping region of the projection region of the first detection probe pin body 231a and the second detection probe pin body 231b onto the plane C'C' is indicated by reference numeral $A_{sup}$, when a planar projection figure structure of the first detection probe pin body 231a and the second detection probe pin body 231b parallel to the substrate 20 is projected onto the plane C'C', respective figures thereof may be represented as projection regions $A_{231a}+A_{sup}$ and $A_{231b}+A_{sup}$ (which basically mean "projection line segments"). By virtue of the arrangement structure of forming the overlapping region, the detection of the electrical characteristics of the oxide semiconductor on the substrate 20 may be further enhanced by increasing the opposed region between the first detection probe pin body 231a and the second detection probe pin body 231b.

Figure 15:
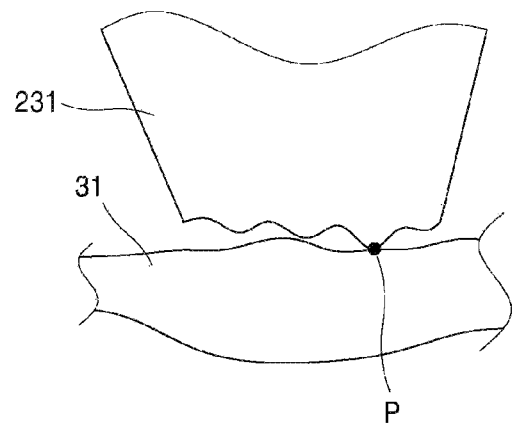
FIG. 15 is a partially enlarged view illustrating one example of a detection probe pin according to one embodiment of the present invention.
Figure 16:
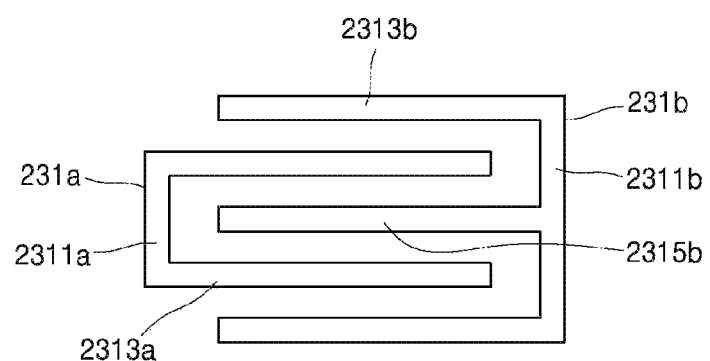
FIG. 16 is a transverse cross-sectional or projection view of a structure of a detection probe pin according to another embodiment of the present invention.

Through the above-described configuration, the detection probe pin 230 may form various structures such as a closed loop capturing structure and a one-sidedly opened surrounding structure may be formed, and the detection probe pin 230 may have a finger arm structure as shown in FIG. 15. In other words, a first detection probe pin body 231a includes a first detection probe pin main body 2311a and a first detection probe pin bridge 2313a. The first detection probe pin bridge 2313a is formed extending from an end or a side of the first detection probe pin main body 2311a.

A second detection probe pin body 231b includes a second detection probe pin main body 2311b, a second detection probe pin outer bridge 2313b, and a second detection probe pin inner bridge 2315b.

The second detection probe pin outer bridge 2313b and the second detection probe pin inner bridge 2315b are formed extending from an end or a side of the second detection probe pin main body 2311b. The second detection probe pin outer bridge 2313b is formed extending from the end of the second detection probe pin main body 2311b, and the second detection probe pin inner bridge 2315b is formed extending from the side of the second detection probe pin main body 2311b.

The first detection probe pin bridge 2313a, the second detection probe pin outer bridge 2313b, and the second detection probe pin inner bridge 2315b may have a structure in which they are alternately arranged to each other.

Meanwhile, the semiconductor film layer inspection application 10 of the present invention employs the two-point method, in which the detection of the electrical characteristics of the oxide semiconductor layer formed on the substrate 20 can be more enhanced by improving the contact state between the first detection probe pin body 231a and the second detection probe pin body 231b.

That is, as shown in FIG. 15, when the contact cross-section between the detection probe pin body 231 and the oxide semiconductor layer 31 is partially enlarged, security of accuracy of the detected electrical characteristics of the oxide semiconductor layer 31 may be deteriorated due to non-uniformity of the surface smoothness or the contact end of the detection probe pin body 231.

In order to prevent the deterioration of accuracy of the detection of the electrical characteristics of the oxide semiconductor layer 31, the detection unit 200 of the semiconductor film layer inspection apparatus 10 of the present invention includes a detection probe pin 230 that is brought into close contact with one or more points spaced apart from each other on one surface of the oxide semiconductor layer, and a detection probe module 202 that generates a detection signal for application to the detection probe pin 230 to detect the electrical characteristics of the oxide semiconductor layer and senses a detection sensing signal inputted thereto from the detection probe pin 230. The detection probe pin 230 is provided in plural numbers. At least one of the plural detection probe pins 230 includes a detection probe pin body 231 and a detection probe pin contactor unit 233. The detection probe pin body 231 may be disposed spaced apart from the oxide semiconductor layer, and the detection probe pin contactor unit 233 may be disposed at one end thereof at the detection probe pin body 231 and brought at the other end thereof into direct contact with the oxide semiconductor layer.

Figure 19:
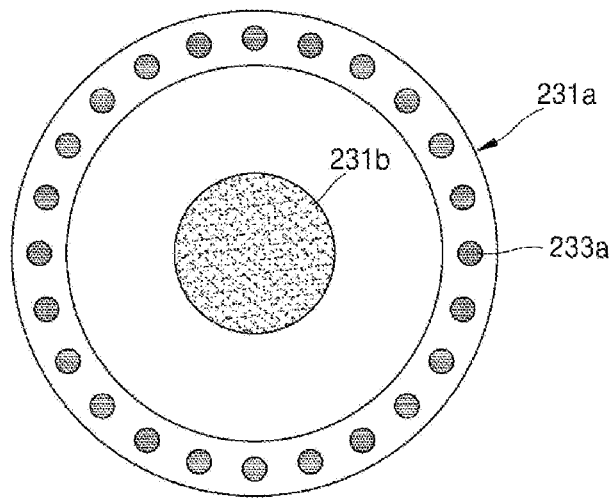
FIGS. 19 and 20 are schematic top plan views illustrating a detection probe pin a detection probe pin according to yet another embodiment of the present invention.
Figure 20:
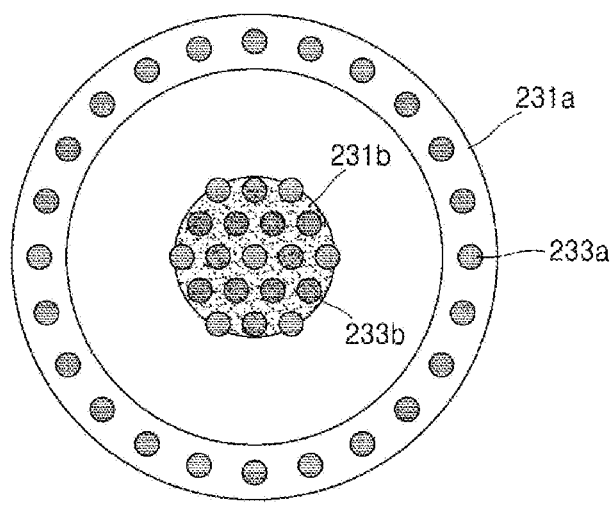

The detection probe pin contactor unit 233 may be modified in various manners, such as having a configuration in which a detection probe pin contactor unit 233a is formed only in the first detection probe pin body 231a as shown in FIG. 19, or detection probe pin contactor units 233a and 233b are formed in both the first detection probe pin body 231a and a second detection probe pin body 231b, respectively, as shown in FIG. 20.

Figure 17:
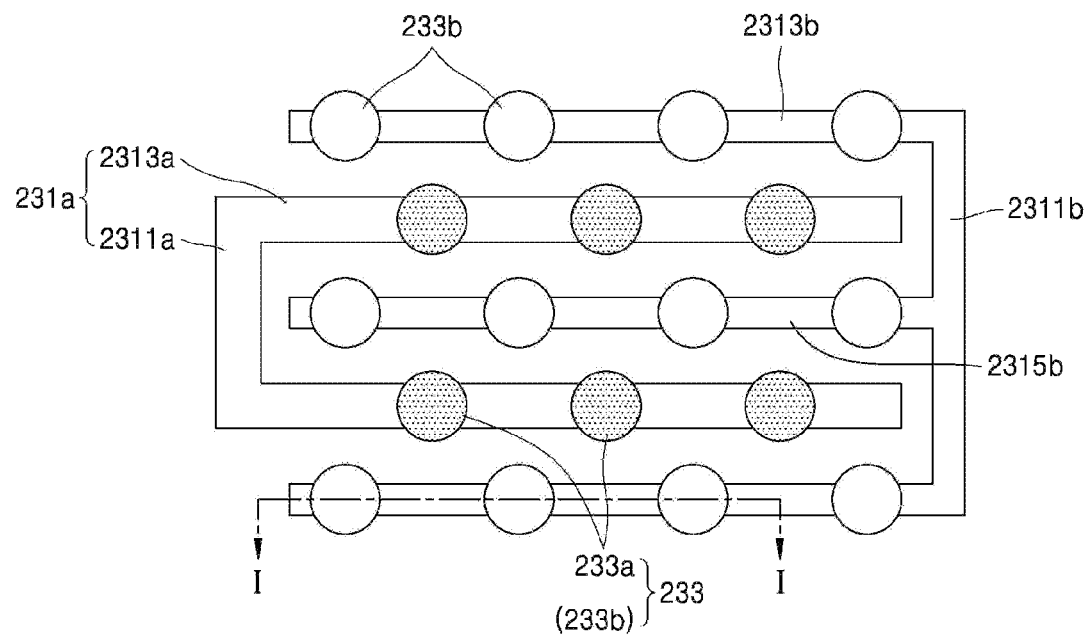
FIG. 17 is a diagrammatic view illustrating a structure of a detection probe pin according to still another embodiment of the present invention.

Meanwhile, as shown in FIG. 17, the detection probe pin of the present invention may have a finger arm structure, and the detection probe pin contactor unit 233 (233a, 233b) is disposed at the first detection probe pin bridge 2313a of the first detection probe pin body 231a and the second detection probe pin outer bridge 2313b and the second detection probe pin inner bridge 2315b of the second detection probe pin body 231b, respectively.

By virtue of such a structure, the first detection probe pin contactor unit 233a and the second detection probe pin contactor unit 233b are disposed spaced apart from each other at the first detection probe pin bridge 2313a of the first detection probe pin body 231a and the second detection probe pin outer bridge 2313b and the second detection probe pin inner bridge 2315b of the second detection probe pin body 231b, respectively. In this case, the first detection probe pin contactor unit 233a and the second detection probe pin contactor unit 233b, which are applied with different electrical signals, may have a structure in which they are alternately arranged to each other on the plane parallel to the substrate 20, i.e., a structure in which although the first detection probe pin contactor unit 233a and the second detection probe pin contactor unit 233b are arranged in a row along the lengths of the first detection probe pin bridge 2313a, the second detection probe pin outer bridge 2313b, and the second detection probe pin inner bridge 2315b, they are staggeredly arranged relative to each other, but not cross each other in a direction perpendicular to the lengths of the first detection probe pin bridge 2313a, the second detection probe pin outer bridge 2313b, and the second detection probe pin inner bridge 2315b so that the first detection probe pin contactor unit 233a are at least partially surrounded by the second detection probe pin contactor unit 233b, or vice versa.

Figure 18:
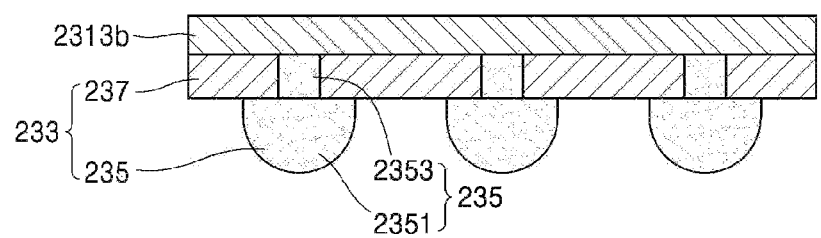
FIG. 18 is a side cross-sectional view of FIG. 17.

More specifically, the detection probe pin contactor unit 233 may include one or more detection probe pin contactors 235 which are brought into direct contact with the oxide semiconductor layer. A partial cross-sectional view taken along the line I-I of FIG. 17 is shown in FIG. 18, and the one or more detection probe pin contacts 235 are disposed on the second detection probe pin outer bridge 2313b of the second detection probe pin body 231b, and each of the detection probe pin contactors 235 includes a probe pin contactor head 2351 and a probe pin contactor mounting part 2353.

In this embodiment, the probe pin contactor head 2351 has a dome-shaped structure that abuts at an end thereof against the oxide semiconductor layer 31, and the probe pin contactor mounting part 2353 has a structure that is connected to an end of the probe pin contactor head 2351 so as to be insertingly mounted on the second detection probe pin outer bridge 2313b of the second detection probe pin body 231b. Although the second detection probe pin outer bridge 2313b of the second detection probe pin body 231b is implemented as a direct connection electrode in this embodiment, it is formed as a simple non-conductive frame structure and may be modified in various manners, such as being connected through a separate wiring as in an embodiment to be described later.

In some embodiments, the detection probe pin contactor unit 233 may further include a detection probe pin medium 237, which is formed as an elastically deformable conductor disposed between the detection probe pin body 231 and the detection probe pin contactor 235. As such, when the probe pin contactor head 2351 abuts against the oxide semiconductor layer 31, predetermined elastic deformation may be permitted to enable the end of the probe pin contactor head 2351 to be brought into close contact with the oxide semiconductor layer 31.

By virtue of this structure, as shown in FIG. 17, a plurality of second detection probe pin contacts units 233 may be alternately arranged in a row to enable more accurate detection of the electrical characteristics of the oxide semiconductor layer 31 through stable application of the electrical signal.

Figure 23:
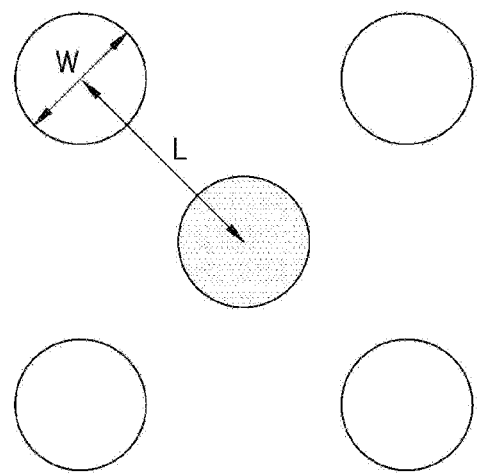
FIG. 23 is a diagrammatic view illustrating an arrangement relationship of a detection probe pin.

In FIG. 23, there is shown a state correlation diagram for the case where the first detection probe pin body 231a is surroundingly captured by the second detection probe pin body 231b through a row staggered arrangement, i.e., a row alternating arrangement between the first detection probe pin body 231a and the second detection probe pin body 231b, and a relationship between the first detection probe pin body 231a and the second detection probe pin body 231b will be described later.

In other words, the circular parts such as electrode pads, which are shown in FIG. 23, indicate a first detection probe pin body 231a and a second detection probe pin body 231b that function as a source and a drain, respectively, and the first detection probe pin body 231a and the second detection probe pin body 231b have an arrangement structure in which any one of the first detection probe pin body 231a and the second detection probe pin body 231b is disposed to be surrounded by the other thereof.

FIG. 23 showed a state correlation diagram for the case where the first detection probe pin body 231a is surroundingly captured by the second detection probe pin body (231b through a row staggered arrangement, i.e., a row alternating arrangement between the first detection probe pin body 231a and the second detection probe pin body 231b, and a relationship between the first detection probe pin body 231a and the second detection probe pin body 231b can be represented by the following equation:

$$I_{ds} \approx n\frac{W}{L}\mu C_{ox}\left(V_{gs} - V_{th} - \frac{1}{2}V_{ds}\right)V_{ds}$$

where,
$I_{ds}$: Detection current,
n: Number of current paths,
W: Diameter of circular electrode pad,
L: Length of channel as simulation transistor structure
μ: Charge mobility,
$C_{ox}$: Insulation film thickness of simulation transistor structure,
$V_{gs}$: Voltage between gate and source of simulation transistor structure, and $V_{ds}$: Voltage between drain and source of simulation transistor structure.

In this embodiment, $I_{ds}$ represents a detection current corresponding to a drain current, detected by the detection probe pin body as a simulation transistor structure, n is the number of current paths and represents the number of the second detection probe pin bodies disposed to surround the first detection probe pin body 231a, W represents the diameter of the detection probe pin contactor unit 233 as a circular electrode pad, L is the length of the channel as a simulation transistor structure and represents the distance between the first detection probe pin body 231a and the second detection probe body 231b as a circular electrode pad, μ represents the mobility of charges, $C_{ox}$ represents the thickness of the insulator layer 33 of the semiconductor film layer 30 as an insulating film of the simulation transistor structure, $V_{gs}$ represents the voltage between the gate and the source of the simulation transistor structure, which is the voltage between the first detection probe pin body 231a and the carrier generator 300, and $V_{ds}$ represents the voltage between the drain and the source of the simulation transistor structure, which is the voltage between the first detection probe pin body and the second detection probe pin body as the circular electrode pad.

In other words, by virtue of this method, the number of second detection probe pin bodies disposed to surround the first detection probe pin body 231a may be increased to minimize difficulty in measuring the physical properties caused by the surrounding environment of the oxide semiconductor layer 31, particularly IGZO to enable more accurate measurement of physical properties such as current.

Meanwhile, as described above, the detection probe pin contactor unit 233 may establish a direct electrical connection with the detection unit 200. In this case, when the second detection probe pin outer bridge 2313b of the second detection probe pin body 231b has a structure in which it is formed as a simple non-conductive frame structure and is connected through a separate wiring, the detection probe pin medium 237 is disposed between the detection probe pin body 231 and the detection probe pin contactor 235 to form only an elastically deformable structure and may not need to have separate conductivity.

As described above, when the detection probe pin contactor unit 233 may establish a direct electrical connection with the detection unit 200, and the first detection probe pin body 231a and the second detection probe pin body 231b have a structure in which they are at least partially formed as a simple non-conductive frame structure and are connected through a separate wiring, the degree of freedom of arrangement of a plurality of detection probe pin contactor units 233 may be configured variously.

Figure 21:
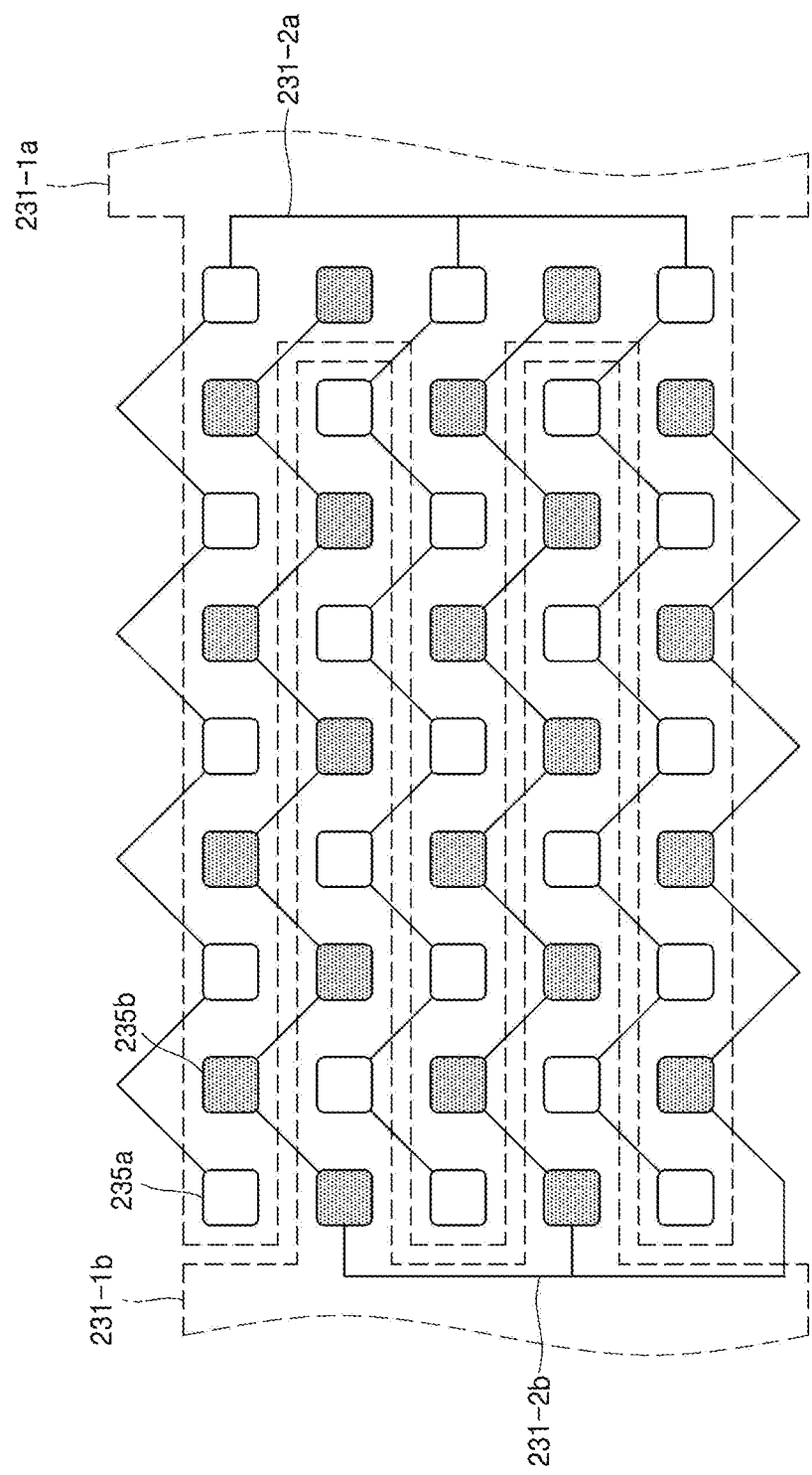
FIGS. 21 and 22 are schematic top plan views illustrating a detection probe pin a detection probe pin according to a further embodiment of the present invention.

In other words, as shown in FIG. 21, the first detection probe pin body 231a and the second detection probe pin body 231b include a first detection probe pin body base 231a-1 and a first detection probe pin body line 231a-2, and a second detection probe pin body base 231b-1 and a second detection probe pin body line 231b-2. The first detection probe pin body base 231a-1 and the second detection probe pin body base 231b-1 may be formed as a substrate structure of a non-conductive material, and the first detection probe pin body line 231a-2 and the second detection probe pin body line 231b-2 may be formed as conductive lines on one surfaces of the first detection probe pin body base 231a-1 and the second detection probe pin body base 231b-1, respectively. The first detection probe pin body line 231a-2 and the second detection probe pin body line 231b-2 may establish a connection with a plurality of second detection probe pin contactors unit 233 formed on one surfaces of the first detection probe pin body base 231a-1 and the second detection probe pin body base 231b-1, respectively, and each of the first detection probe pin body line 231a-2 and the second detection probe pin body line 231b-2 may establish an electrical connection with another component on the detection unit 200 or an external electrical component through a probe pin body terminal part via a terminal line.

In this case, a plurality of detection probe pin contactors 235 of the detection probe pin contactor unit 233 may be arranged to form a matrix structure, and any one of the detection probe pin contactors 235 may have a structure in which it is applied with an electrical signal different from that of another adjacent detection probe pin contactor 235. In other words, the plurality of detection probe pin contactors 235 may have a configuration in which the first detection probe pin body 231a the second detection probe pin body 231b are applied with only the same electrical signal, and only the plurality of detection probe pin contactors 235 of the detection probe pin contactor unit 233 for detecting the electrical characteristics of the oxide semiconductor layer 31 are not arranged but a first detection probe pin contactor 235*a* and a second detection probe pin contactor 235*b* that are applied with different electrical signals are alternately arranged. By virtue of such a configuration, the capture surface between the first detection probe pin contactor 235*a* and the second detection probe pin contactor 235*b* is increased to enable more accurate detection of the electrical characteristics of the oxide semiconductor layer 31.

Figure 22:
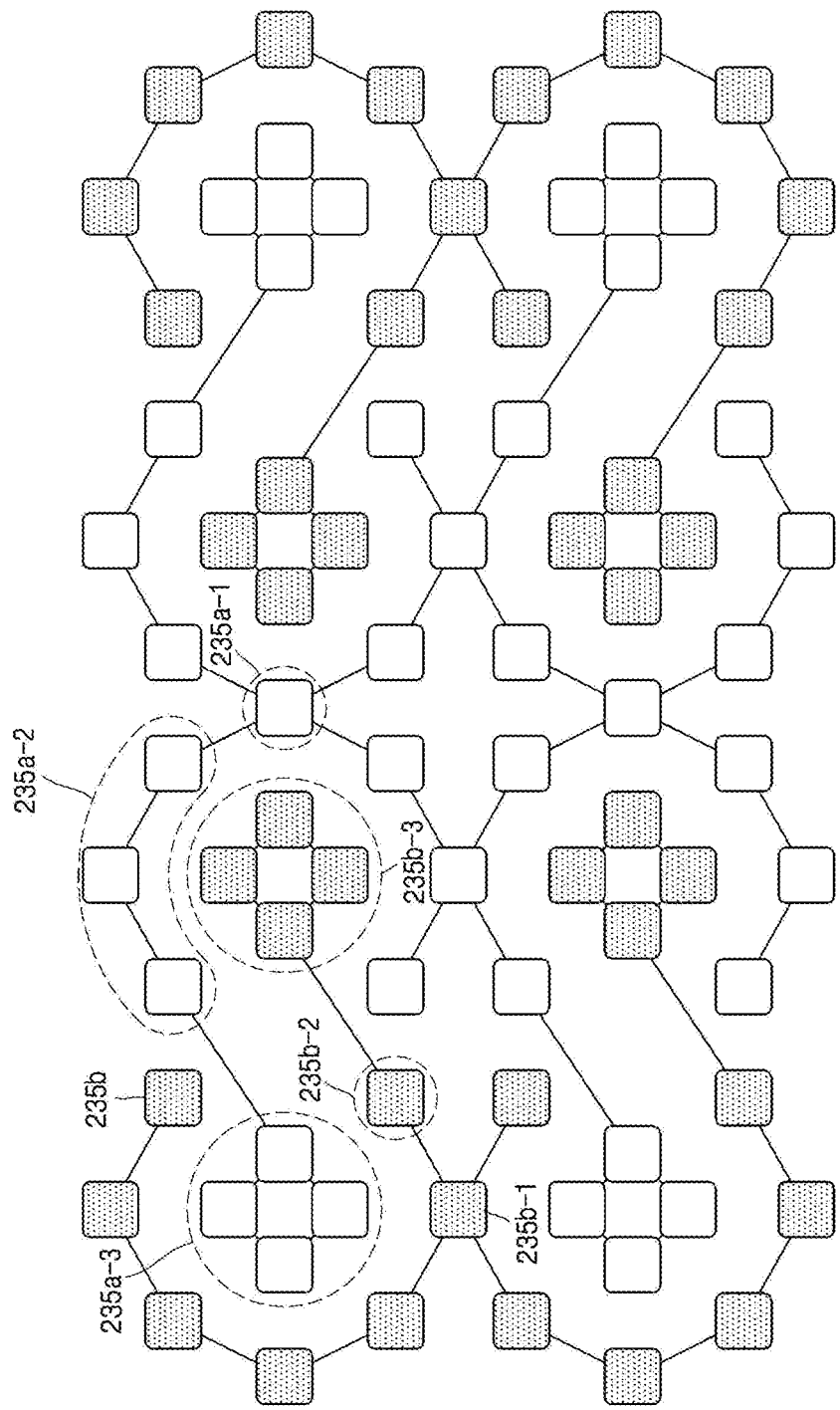

In addition, the plurality of detection probe pin contactors 235 of the detection probe pin contactor unit 233 may be modified in various ways. That is, the plurality of detection probe pin contactors 235 of the detection probe pin contactor unit 233 forms a structure in which at least one part thereof captures another part thereof. Each of the plurality of detection probe pin contactors 235 of the detection probe pin contactor unit 233 may include a first detection probe pin contactor 235*a* and a second detection probe pin contactor 235*b* applied with an electrical signal different from that of the first detection probe pin contactor 235*a*. As shown in FIG. 22, the first detection probe pin contactor 235*a* includes a first detection probe pin contactor node 235*a*-1, a first detection probe pin contactor core 235*a*-3, and a first detection probe pin contactor branch 235*a*-2.

The first detection probe pin contactor node 235*a*-1 is further plurally electrically connected to at least one of other adjacent first detection probe pin contactors 235*a*. The first detection probe pin contactor core 235*a*-3 is arranged in such a manner that a plurality of predetermined detection probe pin contactors are grouped so as to be electrically connected to one another, and is at least partially surrounded by the second detection probe pin contactor 235*b*, The first detection probe pin contactor branch 235*a*-2 is arranged in such a manner that a plurality of predetermined detection probe pin contactors are in series connected to one another, and is electrically connected at one end thereof to the first detection probe pin contactor node 235*a*-1 and at the other end thereof to the first detection probe pin contactor core 235*a*-3.

Similarly, the second detection probe pin contactor 235*b* includes a second detection probe pin contactor node 235*b*-1, a second detection probe pin contactor core 235*b*-3, and a second detection probe pin contactor branch 235*b*-2. The second detection probe pin contactor node 235*b*-1) is provided in single number or plural numbers, and is further plurally electrically connected to at least one of other adjacent second detection probe pin contactors 235*b*. The second detection probe pin contactor core 235*b*-3 is arranged in such a manner that a plurality of predetermined detection probe pin contactors are grouped so as to be electrically connected to one another, and is at least partially surrounded by the first detection probe pin contactor 235*a*. The second detection probe pin contactor branch 235*b*-2 is arranged in such a manner that a plurality of predetermined detection probe pin contactors are in series connected to one another, and is electrically connected at one end thereof to the second detection probe pin contactor node 235*b*-1 and at the other end thereof to the second detection probe pin contactor core 235*b*-3.

The accuracy and reliability of the detection of the electrical characteristics of the oxide semiconductor layer can be more improved through various selections of the above-described arrangement structure.

Meanwhile, the semiconductor film layer inspection apparatus 10 of the present invitation may further include an element for enhancing accuracy and reliability of the detection of the electrical characteristics of the oxide semiconductor layer through the maintenance of a close contact state between such detection probes and the oxide semiconductor layer 31 during the detection process through the detection probes. In other words, the semiconductor film layer inspection apparatus 10 of the present invention may further include a contact alignment unit 400. The detection probe pin body 231 is at least partially formed of a ferromagnetic material. The contact alignment unit (400) is disposed opposed to the detection probe pin body (231) with the substrate (20) interposed therebetween, and creates a magnetic force on the detection probe pin body (231) during its operation to closely align the substrate (20) and the detection probe pin body (231) to allow the detection probe pin body to be brought into close contact with the substrate side.

More specifically, the contact alignment unit 400 includes a contact alignment electromagnet unit 410 and a contact alignment control unit 420. The contact alignment electromagnet unit 410 is disposed on the base unit 40 and creates the magnetic force on the detection probe pin body 231. The contact alignment control unit 420 controls application of power to the contact alignment electromagnet unit 410.

Figure 24:
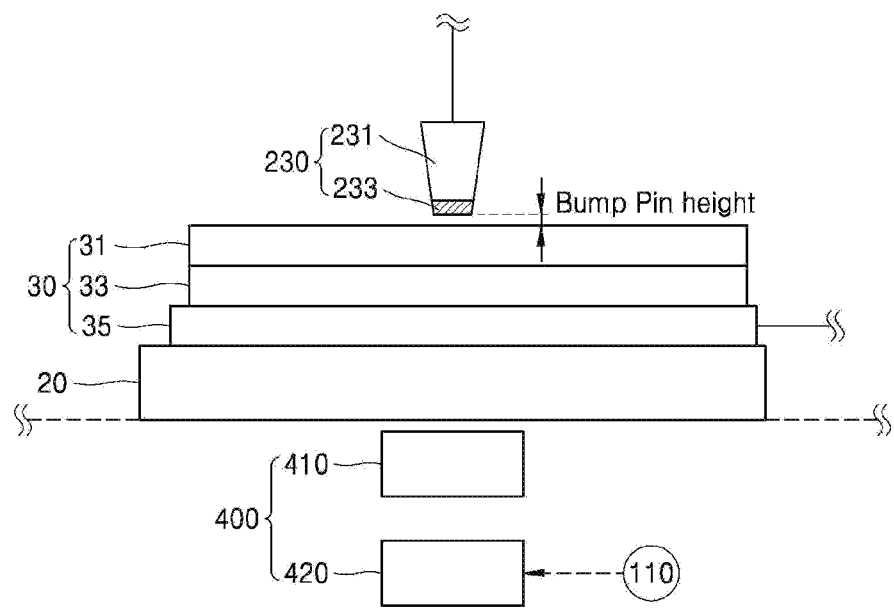
FIGS. 24 and 25 are diagrammatic views illustrating an operating state of a detection unit of a semiconductor film layer inspection apparatus according to still another embodiment of the present invention.
Figure 25:
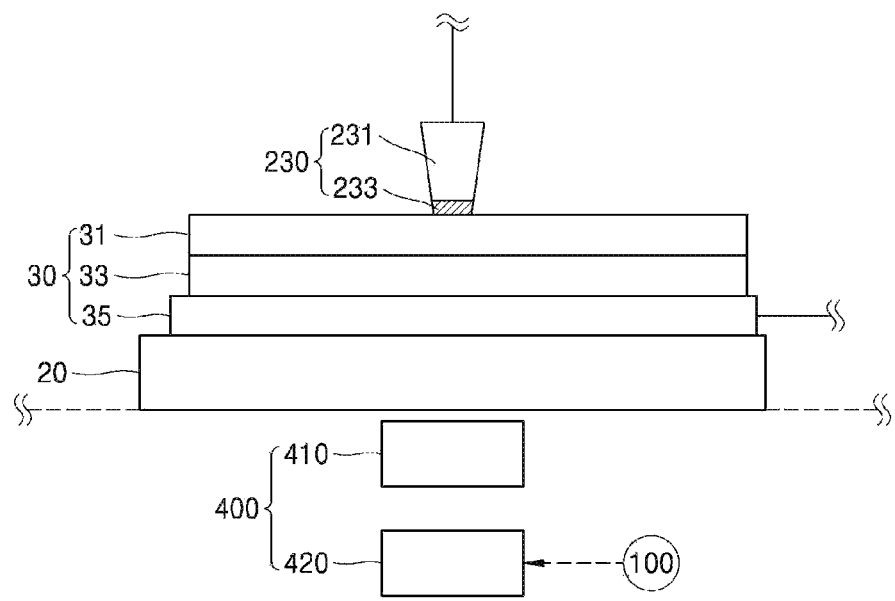

In FIGS. 24 and 25, there is shown an operation schematic diagram of a control off/on state of close contact alignment of the substrate 20 and the detection probe pin body 231 by the contact alignment control unit 420, in which the contact alignment control unit 420 may apply a signal to the contact alignment electromagnet unit 410 in response to a control signal from the control unit 100 to establish a predetermined close contact alignment.

Figure 26:
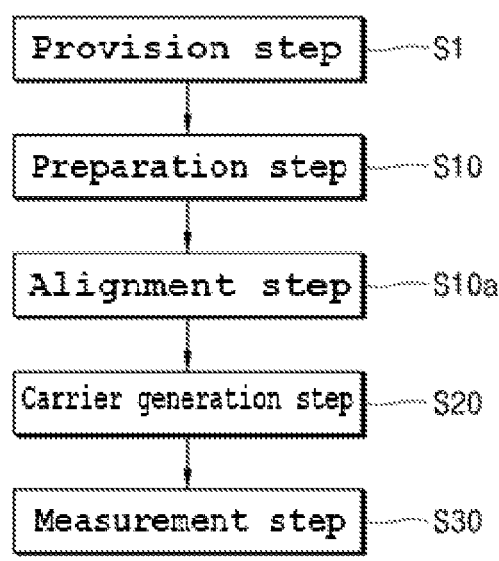
FIGS. 26 and 27 are flowcharts illustrating a process of controlling a semiconductor film layer inspection apparatus according to another embodiment of the present invention.

In FIG. 26, there is shown a control process for detecting the semiconductor film inspection application 10 as in the previous embodiment, and the control process further includes, between step S10 and step S20, an alignment step S10*a* of aligning the contact position of the detection probe pin body 231 unlike the previous embodiment.

Figure 27:
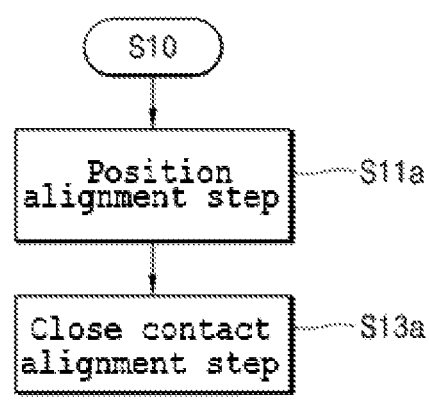

As shown in FIG. 27, the alignment step S10*a* includes a position alignment step S11*a* and a close contact alignment step S13*a*. In the position alignment step S11*a*, the control unit 100 applies a position alignment control signal to a position alignment actuator (not shown) to check a relative position between the detection probe pin 230 and the oxide semiconductor layer 31 to allow the detection probe pin 230 to move to a position close proximity to the oxide semiconductor layer 31 in order to detect electrical characteristics of the oxide semiconductor layer 31. Thereafter, the close contact alignment step S13*a* is performed in which the control unit (100) applies the control signal to the contact alignment control unit 420 to form an on-switching state of the contact alignment electromagnet unit 410 so that an end of the detection probe pin body 231 can be closely disposed on the oxide semiconductor layer 31.

Although the detection probe pin of the detection unit of various semiconductor film layer inspection apparatuses has been described focusing on a configuration based on a two-point contact structure, the detection probe of the semiconductor film inspection apparatus of the present invention is not limited thereto, but may be configured in various manners. The detection probe pin of the semiconductor film layer inspection apparatus of the present invention may form compact structures such as a single integrated movable structure and a flexible print substrate structure as shown in FIGS. 28 to 35. The semiconductor film layer inspection apparatus having the compact structures such as a single integrated movable structure and a flexible print substrate structure as shown in FIGS. 28 to 35 will be described hereinafter. Constituent elements having the same function as in the previous embodiment are denoted by the same reference numeral, a detailed description thereof is replaced with the description of the previous embodiment, and a repeated descriptions thereof will be omitted to avoid redundancy and a description will be made focusing on differences from the previous embodiment.

The detection unit 200 of the semiconductor film layer inspection apparatus of the present invention includes a detection probe pin 230 and a detection probe module 202. The detection probe pin 230 is brought into close contact with one or more points spaced apart from each other on one surface of the oxide semiconductor layer, and the detection probe module 202 generates a detection signal for application to the detection probe pin 230 to detect the electrical characteristics of the oxide semiconductor layer, and senses a detection sensing signal inputted thereto from the detection probe pin 230.

In this case, the detection probe pin 230 includes a detection probe pin body 231 and a detection probe pin contactor unit 233. The detection probe pin body 231 is disposed spaced apart from the oxide semiconductor layer, and the detection probe pin contactor unit 233 is disposed at one end thereof at the detection probe pin body (231) and brought at the other end thereof into direct contact with the oxide semiconductor layer.

Figure 28:
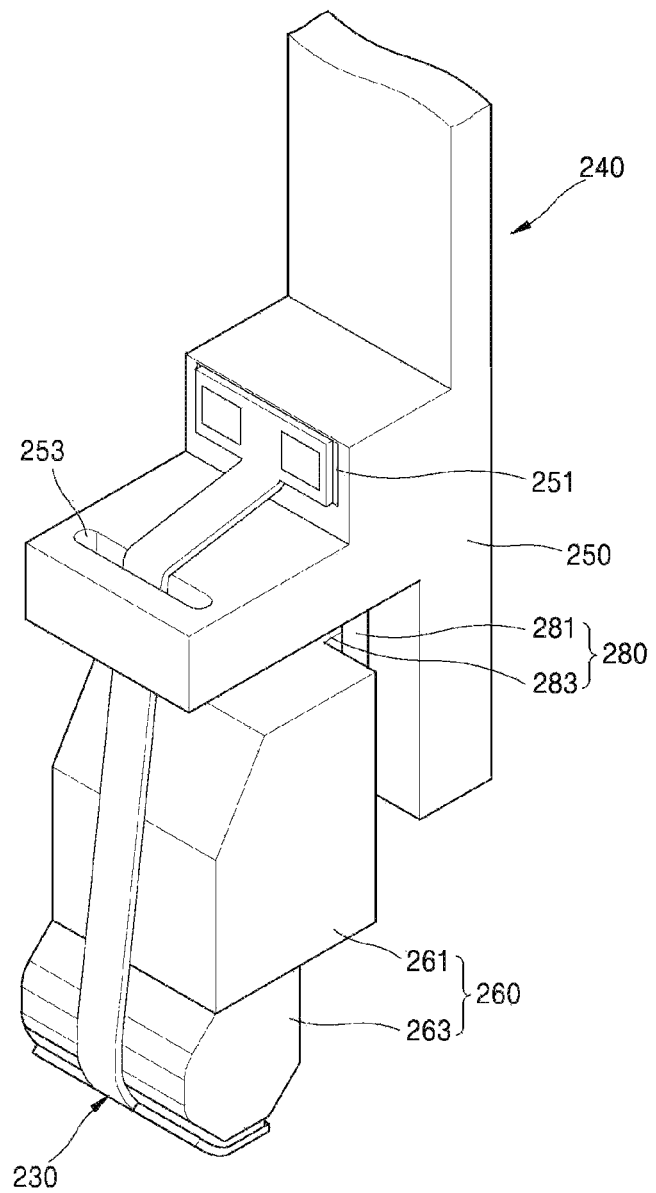
FIGS. 28 and 29 are top perspective and cross-sectional views illustrating a modification of a detection probe moving unit of a detection unit of a semiconductor film layer inspection apparatus according to another embodiment of the present invention.

In this embodiment, the detection probe pin body 231 (see FIG. 30) includes a detection probe pin body base 231-1 and a detection probe pin body line 231-2. That is, as shown in FIG. 28, the detection probe pin body base 231-1 allows the detection probe pin contactor unit 233 to be disposed thereon, and the the detection probe pin body line 231-2 is disposed on one surface of the detection probe pin body base 231-1 so as to be electrically connected to the detection probe pin contactor unit 233.

More specifically, the detection probe pin body base 231-1 may be made of various materials. The detection probe pin body base 231-1 of this embodiment is formed of a nonconductive material, and the detection probe pin body line 231-2 formed on one surface of the detection probe pin body base 231-1 is formed of a conductive material.

Figure 30:
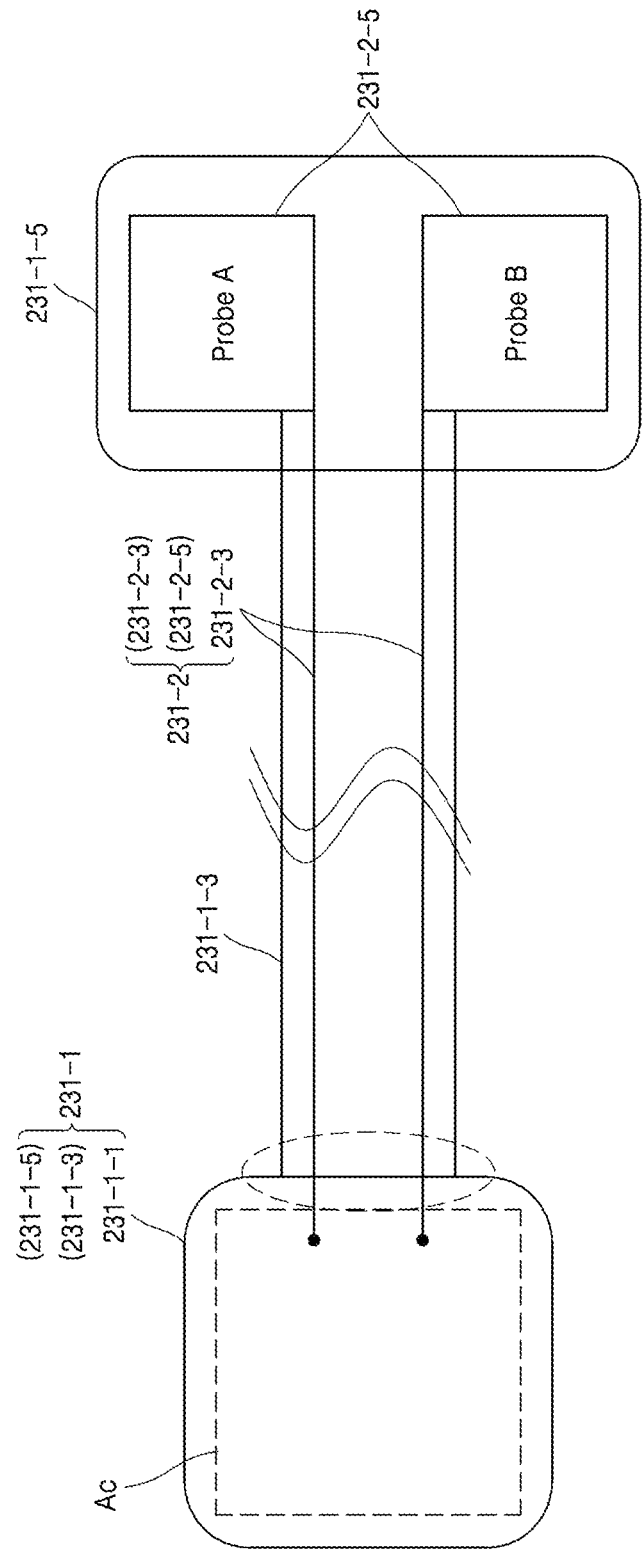
FIG. 30 is a diagrammatic view illustrating a a modification of a detection probe pin body of a detection probe pin of a semiconductor film layer inspection apparatus according to another embodiment of the present invention.

In this embodiment, for example, the detection probe pin body base 231-1 may include an FPCB, and the FPCB may be implemented in the form of a polyimide film. As shown in FIG. 30, the detection probe pin body base 231-1 includes a pin body main base 231-1-1, a pin body extension part 231-1-3, and a pin body terminal part 231-1-5. In addition, the detection probe pin body line 231-2 includes a pin body main line 231-2-1, a pin body extension line 231-2-3, and a pin body terminal line 231-2-5.

In other words, the detection probe pin contactor unit 233 and the pin body main line 231-2-1 are formed on one surface of the pin body main base 231-1-1, and the pin body terminal line 231-2-5 is formed on one surface of the pin body terminal part 231-1-5. The pin body terminal part 231-1-5 may have a structure in which it is disposed on either the base unit 40 side or the semiconductor film layer inspection apparatus 10 side, more specifically, a moving body terminal 251 (see FIG. 28) formed on the semiconductor film layer inspection apparatus 10.

The pin body extension part 231-1-3 has a structure in which it is connectedly disposed between the pin body main base 231-1-1 and the pin body terminal part 231-1-5. The pin body extension line 231-2-3 is disposed on one side of the pin body extension part 231-1-3, and the pin body extension line 231-2-3 interconnects the pin body main line 231-2-1 and the pin body terminal line 231-2-5. In this embodiment, the pin body extension part 231-1-3 has a structure having a width smaller than that of the pin body main base 231-1-1 and the pin body terminal part 231-1-5. It will be apparent from the present invention that the above structure of the pin body extension line 231-2-3 is merely an example for minimizing a problem such as connection peeling caused by torsion due to a separation distance between a detection position and a terminal connection position, and various modifications of the pin body extension line 231-2-3 may be made depending on design specifications.

The detection probe pin body line 231-2 includes the pin body main line 231-2-1, the pin body extension line 231-2-3, and the pin body terminal line 231-2-5.

The detection probe pin body line 231-2 implemented as an FPCB may be formed in various manners, such as a screen printing process and an etching process. That is, for example, the pin body main line 231-2-1 formed on one surface of the pin body main base 231-1-1, the pin body extension line 231-2-3 formed on one surface of the pin body extension part 231-1-3, and the pin body terminal line 231-2-5 formed on one surface of the pin body terminal part 231-1-5 may be formed by the screen printing process and the etching process. In this case, the pin body main line 231-2-1 is formed on one surface of the pin body main base 231-1-1, and at the same time, the first and second detection probe pin contactor units 233a and 233b of the detection probe pin contactor unit 233 may be formed thereon in the shape of a cube island, but this is merely an example and may be modified in various manners depending on design specifications.

Figure 31:
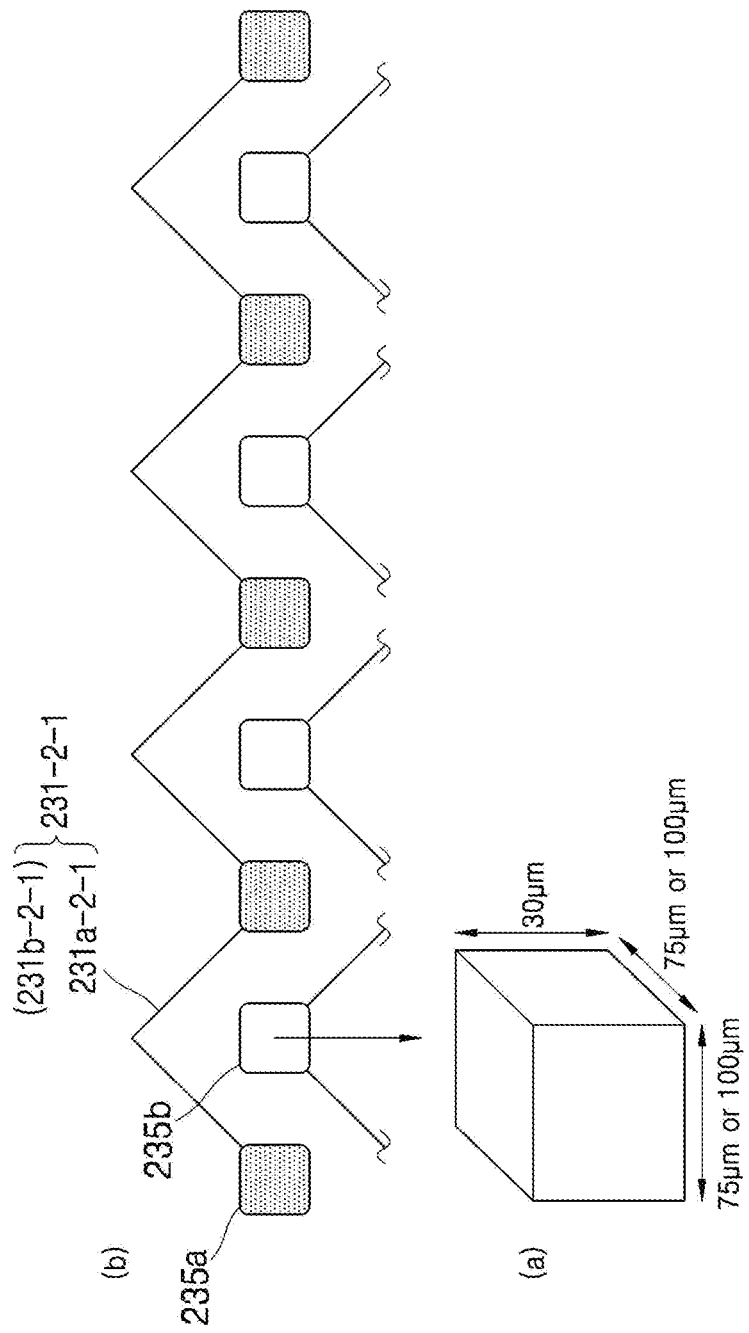
FIG. 31 illustrates a schematic diagrammatic view and a partially enlarged view of a configuration of a detection probe pin contactor unit of a detection probe pin body of a semiconductor film layer inspection apparatus according to another embodiment of the present invention.

As shown in FIG. 31, the detection probe pin contactor unit 233, (see FIG. 31(a)) has a structure in which a plurality of first and second detection probe pin contactors 235a and 235b are respectively disposed spaced apart from each other so as to be electrically differently connected to each other through the pin body main line 231-2-1 (231a-2-1 and 231b-2-1) so that the first and second detection probe pin contactors 235a and 235b are connected to each other to form the same group, respectively. This structure is the same as in the above-described embodiment. The first and second detection probe pin contactors 235a and 235b of the detection probe pin contactor unit 233 are formed in the shape of a square block, but as an example, and various modifications thereof may be made depending on manufacturing process and design specifications.

Figure 32:
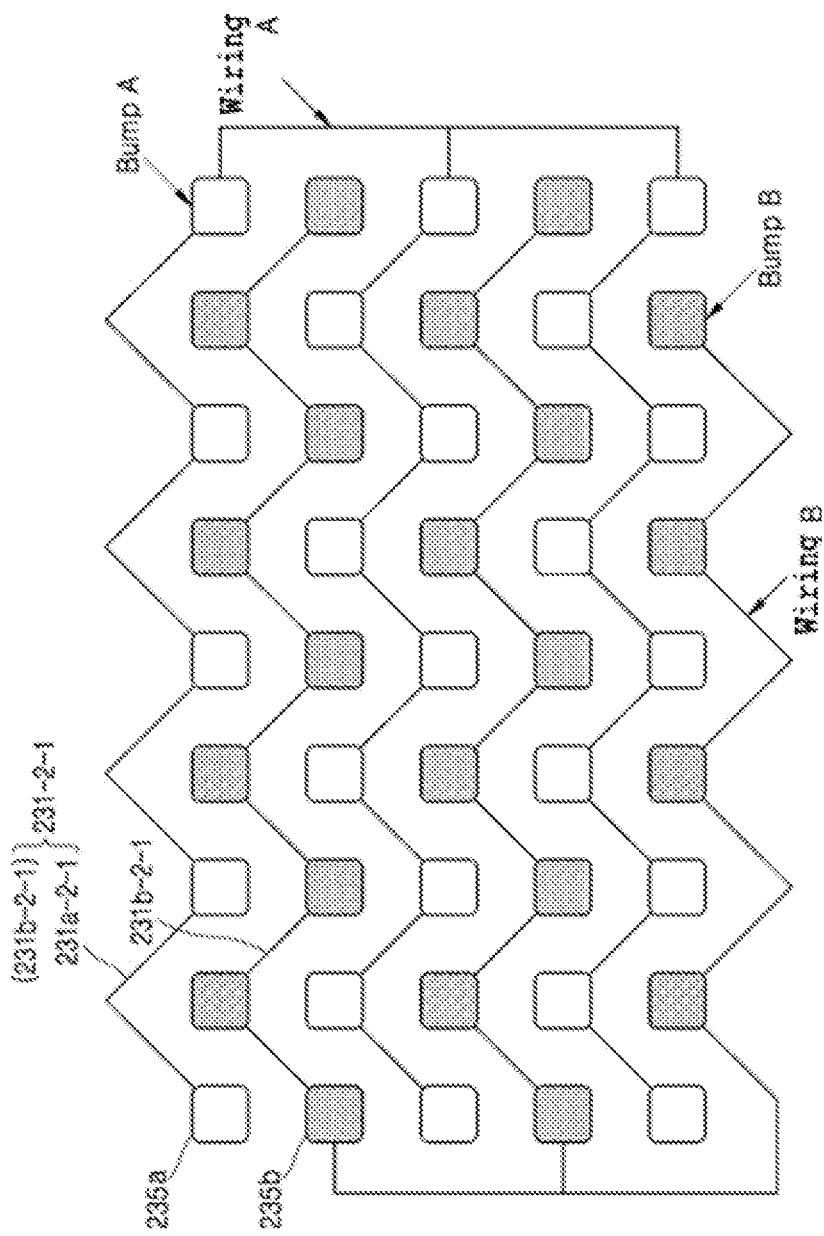
FIG. 32 is a schematic diagrammatic view illustrating a configuration of a detection probe pin contactor unit of a detection probe pin body of a semiconductor film layer inspection apparatus according to another embodiment of the present invention.
Figure 33:
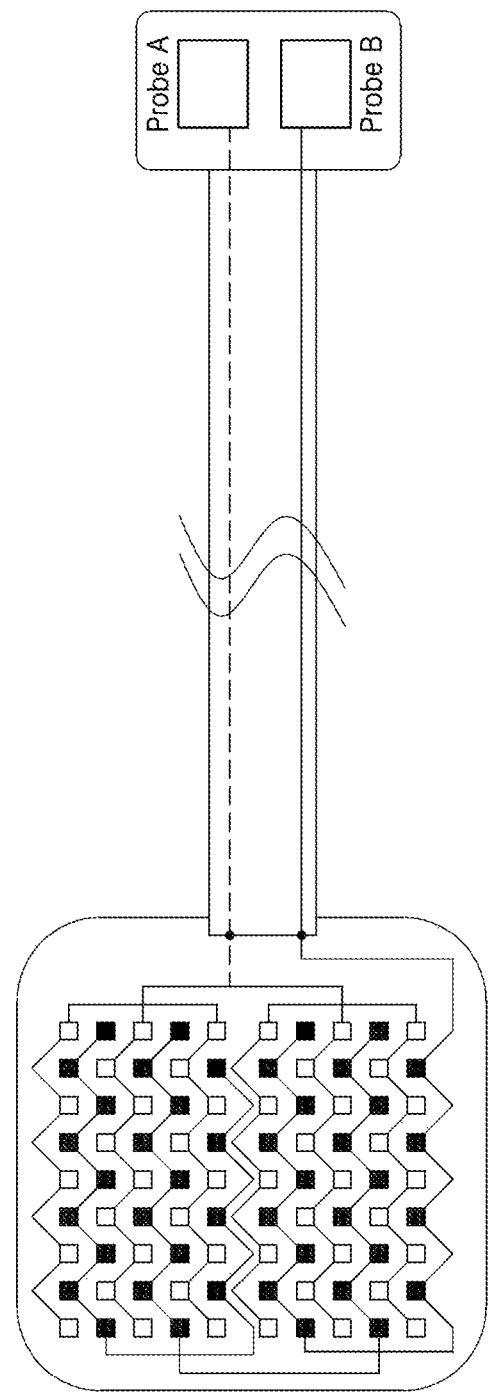
FIG. 33 is a schematic diagrammatic view illustrating a modification of a detection probe pin body of a detection probe pin of a semiconductor film layer inspection apparatus according to another embodiment of the present invention.

FIG. 32 shows a partially enlarged view of a region indicated by "Ac" of FIG. 30, FIG. 33 shows a schematic top plan view of the detection probe pin when an embodiment of the arrangement structure of FIG. 32 is applied. The plurality of detection probe pin contactors 235 (235a and 235b) of the detection probe pin contactor unit 233 are have a structure in which they are arranged to form a matrix structure in such a manner that any one detection probe pin contactor 235a or 235b is applied with an electrical signal different from that of another adjacent detection probe pin contactor 235b or 235a.

In other words, the plurality of detection probe pin contactors 235 may have a configuration in which the first detection probe pin body 231a and the second detection probe pin body 231b are applied with only the same electrical signal, and only the plurality of detection probe pin contactors 235 of the detection probe pin contactor unit 233 for detecting the electrical characteristics of the oxide semiconductor layer 31 are not arranged but a first detection probe pin contactor 235a and a second detection probe pin contactor 235b that are applied with different electrical signals are alternately arranged. This configuration is the same as that of the previous embodiment.

Herein, a plurality of first detection probe pin contactors 235a are electrically connected to each other through the first detection probe pin body main line 231a-2-1, and a plurality of second detection probe pin connectors 235b are electrically connected to each other through the second detection probe pin body main line 231b-2-1. The first detection probe pin body mainline 231a-2-1 and the second detection probe pin body main line 231b-2-1 form a structure in which they are connected to the pin body terminal line 231-2-5 formed on the pin body terminal part 231-1-5 through the pin body extension line 231-2-3, respectively. The pin body terminal line 231-2-5 may establish an electrical connection with other constituent elements of the detection unit 200 through the moving body terminal 251 (see FIG. 28).

By virtue of such a configuration, the capture surface between the first detection probe pin contactor 235a and the second detection probe pin contactor 235b is increased to enable more accurate detection of the electrical characteristics of the oxide semiconductor layer 31, which is the same as in the previous embodiment. In this embodiment, the detection probe pin body base 231-1 may be implemented as an FPCB type to provide an FPCB compact structure having a single integrated shape and ensure maintenance convenience.

Figure 34:
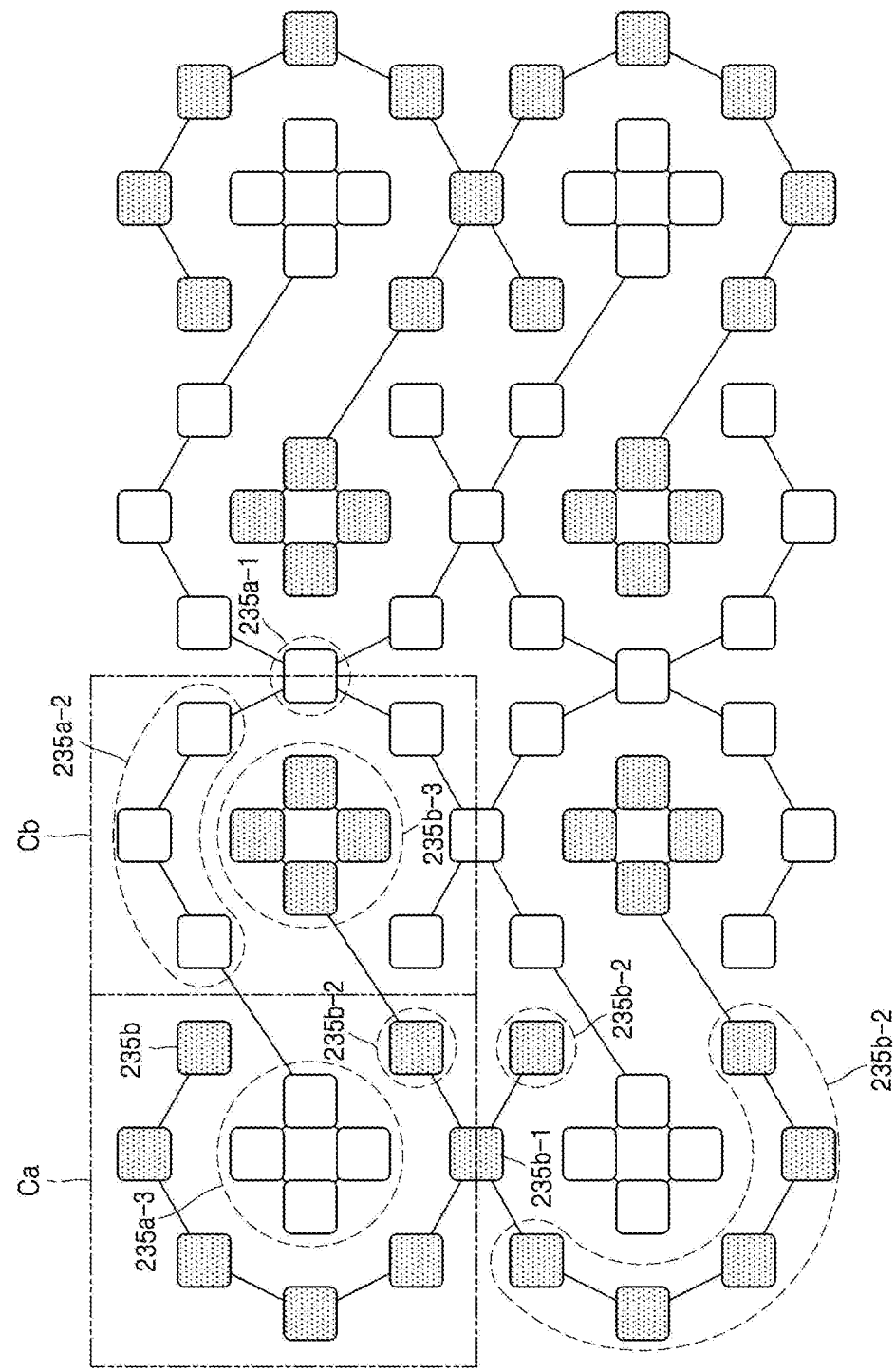
FIG. 34 is a schematic diagrammatic view illustrating another modification of a detection probe pin body of a semiconductor film layer inspection apparatus according to another embodiment of the present invention.
Figure 35:
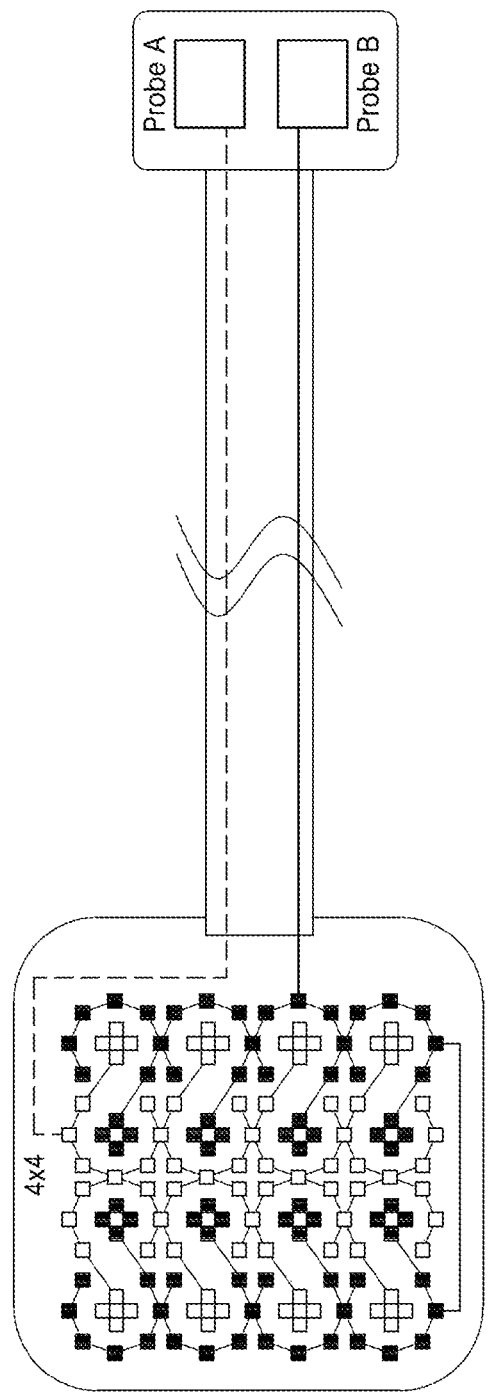
FIG. 35 is a schematic diagrammatic view illustrating a modification of a detection probe pin body of a detection probe pin of a semiconductor film layer inspection apparatus according to another embodiment of the present invention.

Although the arrangement structure of the detection probe pin contactor unit 233 of different groups through the matrix arrangement has been described in the above embodiment, the the plurality of detection probe pin contactors 235 of different groups of the detection probe pin contactor unit 233 may be modified in various manners within the scope of having a structure in which they are arranged at equal intervals. In other words, as shown in FIGS. 33 and 34, the plurality of detection probe pin contactors 235 of the detection probe pin contactor unit 233 forms a structure in which at least one part thereof captures another part thereof. Each of the plurality of detection probe pin contactors 235 of the detection probe pin contactor unit 233 may include a first detection probe pin contactor 235a and a second detection probe pin contactor 235b applied with an electrical signal different from that of the first detection probe pin contactor 235a. As shown in FIGS. 33 and 34, the first detection probe pin contactor 235a includes a first detection probe pin contactor node 235a-1, a first detection probe pin contactor core 235a-3, and a first detection probe pin contactor branch 235a-2.

The detection probe pin contactor node, the detection probe pin contactor core, and the detection probe pin contactor bridge of at least one group form an arrangement structure in which they capture at least a part of an outer side of the detection probe pin contactor core of at least the other group. In other words, in this embodiment, the first detection probe pin contactor node 235a-1 is plurally electrically connected to another adjacent first detection probe pin contactor 235a. The first detection probe pin contactor core 235a-3 is arranged in such a manner that a plurality of predetermined detection probe pin contactors are grouped so as to be electrically connected to one another, and is at least partially surrounded by the second detection probe pin contactor 235b. The first detection probe pin contactor branch 235a-2 is arranged in such a manner that a plurality of predetermined detection probe pin contactors are in series connected to one another, and is electrically connected at one end thereof to the first detection probe pin contactor node 235a-1 and at the other end thereof to the first detection probe pin contactor core 235a-3. Herein, the first detection probe pin contactor core 235a-3 is composed of a combination of four detection probe pin contactors, but it may be arranged in various manners within the scope of one or more of structures. The first detection probe pin contactor node 235a-1 has a structure in which four first detection probe pin contactor branches 235a-2 are connected thereto, but the present invention is not limited thereto and various modifications thereof may be made. The number of the detection probe pin contactors that constitute the first detection probe pin contactor branch 235a-2 connected to the first detection probe pin contactor node 235a-1 may be configured in various manners within the scope of one or more of the detection probe pin contactors.

Similarly, the second detection probe pin contactor 235b includes a second detection probe pin contactor node 235b-1, a second detection probe pin contactor core 235b-3, and a second detection probe pin contactor branch 2353b-2. The second detection probe pin contactor node 235b-1 is plurally electrically connected to at least one of other adjacent second detection probe pin contactors 235b. The second detection probe pin contactor core 235b-3 is arranged in such a manner that a plurality of predetermined detection probe pin contactors are grouped so as to be electrically connected to one another, and is at least partially surrounded by the first detection probe pin contactor 235a. The second detection probe pin contactor branch 235b-2 is arranged in such a manner that a plurality of predetermined detection probe pin contactors are in series connected to one another, and is electrically connected at one end thereof to the second detection probe pin contactor node 235b-1 and at the other end thereof to the second detection probe pin contactor core 235b-3. Herein, the second detection probe pin contactor core 235b-3 is composed of a combination of four detection probe pin contactors, but it may be arranged in various manners within the scope of one or more of structures.

Herein, the second detection probe pin contactor core 235b-3 is composed of a combination of four detection probe pin contactors, but it may be arranged in various manners within the scope of one or more of structures. The second detection probe pin contactor node 235b-1 has a structure in which four second detection probe pin contactor branches 235a-2 are connected thereto, but the present invention is not limited thereto and various modifications thereof may be made. The number of the detection probe pin contactors that constitute the second detection probe pin contactor branch 235b-2 connected to the second detection probe pin contactor node 235b-1 may be configured in various manners within the scope of one or more of the detection probe pin contactors.

By virtue of such an arrangement structure, as shown in FIG. 34, the detection probe pin 230 may a structure in which the first detection probe pin contactor core 235a-3 is at least partially captured by the second detection probe pin contactor 235b in a region indicated by reference numeral Ca, and the second detection probe pin contactor core 235b-3 is at least partially captured by the first detection probe pin contactor 235a in a region indicated by reference numeral Cb.

The accuracy and reliability of the detection of the electrical characteristics of the oxide semiconductor layer can be more improved through various selections of the above-described arrangement structure.

An example of an arrangement state in which the detection probe 230 formed as described above is mounted is shown in FIGS. 28 and 29.

The detection unit 200 according to this embodiment may include a detection probe moving unit 240. The detection probe moving unit 240 has a structure that it is relatively movable with respect to other constituent elements of the semiconductor film layer inspection apparatus 10 through a separate driving unit (not shown).

The detection probe moving unit 240 allows the detection probe pin 230 to be disposed at one end thereof so as to be relatively movable with respect to the base unit 40. In other words, when the detection probe pin 230 is disposed on the detection probe moving unit 240 and the detection probe moving unit 240 is relatively movable with respect to another constituent element, i.e., the base unit 40, the electrical characteristics of the oxide semiconductor layer on the substrate 20 may be detected by the contact between the detection probe pin 230 and the substrate 20 disposed at the base unit 40.

More specifically, the detection probe moving unit 240 includes a detection probe moving body 241 and a detection probe moving guide 280. The detection probe moving body 241 allows the detection probe pin 230 to be disposed at one end thereof, i.e., on one surface thereof. The detection probe moving body 241 includes a detection probe moving body main unit 250 and a detection probe moving body sub unit 260.

The detection probe moving body main unit 250 has a structure in which it is relatively movable with respect to the semiconductor film layer inspection apparatus, and is disposed so as to be movable through the drive unit (not shown) in this embodiment. The detection probe moving body subunit 260 is disposed at a lower end of the detection probe moving body main unit 250 in a fixedly mounted manner so as to move together with the detection probe moving body main unit 250.

The detection probe moving body 241 has a structure in which the detection probe moving body main unit 250 and the detection probe moving body sub unit 260 are relatively movable with respect to each other.

The detection probe moving body sub unit 260 includes a moving body upper sub 261 and a moving body lower sub 263. The moving body upper sub 261 is connected to the detection probe moving body main unit 250, and the moving body lower sub 263 is connected to the lower end of the moving body upper sub 261. The connection structure between the moving body upper sub 261 and the moving body lower sub 263 is merely an example in this embodiment, and may be combined in various manners depending on design specifications.

At an upper end of the detection probe moving body main unit 250, is disposed the moving body terminal 251 (see FIG. 28) connected to the pin body terminal line 231-2-5 formed on the pin body terminal part 231-1-5 of the detection probe pin body main line, i.e., the first detection probe pin body main line 231a-2-1 and the second detection probe pin body main line 231b-2-1. The detection probe pin body may be disposed to extend to a lower end side of the detection probe moving body sub-unit 260 through the moving bod pin body guide 253 formed at an end of the detection probe moving body main unit 250 to prevent interference and enable to implement a stable operation.

The pin body main base 231-1-1 of the detection probe pin 230 is disposed on a lower end of the detection probe moving body sub unit 260, i.e., an underside of the moving body lower sub 263. When the detection probe moving body main unit 250 and the detection probe moving body sub unit 260 are moved, the detection probe pin contactor unit 233 disposed on one surface of the pin body main base 231-1-1 establishes a predetermined physical contact with the oxide semiconductor layer to enable the detection of the electrical characteristics of the oxide semiconductor layer.

Although the detection probe moving body 241 has a structure in which it includes the detection probe moving body main unit 250 and the detection probe moving body sub unit 260 in this embodiment, this is merely an example, and the present invention is not limited thereto, but may be modified in various manners depending on design specifications.

The detection probe moving unit 240 of the present invention includes a detection probe damping unit 270. The detection probe damping unit 270 may damp the movement of the detection probe moving body 241 to implement a stable operation thereof or may prevent inaccurate detection of the electrical characteristics of the oxide semiconductor layer 31 or damage to the oxide semiconductor layer 31 due to an excessive contact reaction force when the detection probe moving unit 240 is brought into close contact with the oxide semiconductor layer 31 of the semiconductor film layer 30. The detection probe damping unit 270 includes a damping moving body accommodating par 271, a damping elastic part 273, and a damping plunger 275.

The damping body accommodating part 271 is disposed on the side of the detection probe moving body 241, and the damping body accommodating part 271 has a structure that it is formed to be opened at an upper end thereof. The damping elastic part 273 is disposed inside the damping body accommodating part 271 in such a manner as to be supported at one end thereof by the inner side of the damping body accommodating part 271. In this embodiment, the damping elastic part 273 is implemented in the form of a coil spring, but the present invention is not limited thereto.

In some embodiments, the damping elastic part 273 may have a structure in which it is in close contact with a lower end surface of the detection probe moving body main unit 250, but may have a contact structure through the damping plunger 275 to perform a stable damping function in an embodiment of the present invention.

The damping plunger 275 is brought at one end thereof into contact with the damping elastic part 273 and disposed at the other end thereof within the damping body accommodating part 271 so as to be oriented toward the base unit 40 to limit the movement of the detection probe moving body 241.

In this embodiment, the damping plunger 275 includes a damping plunger body 2751 ad a damping plunger shaft 2753. The damping plunger body 2751 is supported at an end thereof by the damping elastic part 273 in an elastic contact manner. The damping plunger shaft 2753 is connected at one end thereof to the damping plunger body 2751 and accommodatingly disposed at the other end thereof within the damping moving body accommodating part 271 along the longitudinal direction of the damping moving body accommodating part 271.

In this embodiment, the damping plunger body 2751 and the damping plunger shaft 2753 are formed as an integral structure, and the damping plunger shaft 2753 is disposed to penetrate through the damping elastic part 273.

In this damping process, the detection probe moving unit 240 may further include an element of performing a sensing function in order to prevent an excessive contact. In other words, the detection probe moving unit 240 includes a detection probe moving sensing unit 290. The detection probe moving sensing unit 290 is disposed at the base unit 40 so as to be opposed to the damping plunger body 2751, and is brought into contact with the damping plunger body 2751 to senses a contact state. In this embodiment, the detection probe moving sensing unit 290 may be implemented as a pressure sensor to detect a pressing force.

The detection probe moving sensing unit 290 is disposed at a corresponding position of the damping plug body 2751 at the lower end of the detection probe moving body main unit 250. When the detection probe moving unit 240 is moved to cause the oxide semiconductor layer 31 and the detection probe pin contactor unit 233 (233*a* and 233*b*) of the detection probe pin 230 to be brought into contact with each other, a relative movement between the detection probe moving body main unit 250 and the detection probe moving body sub unit 260 of the detection probe moving body (241) occurs by reaction force. In this case, a predetermined constraint occurs on the relative movement therebetween by the damping function of the detection probe damping unit 270, and simultaneously a pressure is detected by the detection probe moving sensing unit 290 so that the movement of the detection probe moving body 241 can be adjusted through the detected pressure.

In addition, meanwhile, although a description has been made focusing on a configuration in which the detection probe pin contactor unit of the detection probe pin is provided in plural numbers in the detection unit having a single integrated structure in the previous embodiment, the detection probe pin contactor unit of the present invention may enhance accuracy of the electrical characteristics of the oxide semiconductor layer detected and obtained by adopting an independently movable configuration. Herein, the single integrated structure may refer to a physically integrated single structure, a functionally integrated single structure in the form of a physical assembly through a combination of individualized constitutent elements, and the like, and thus various modifications thereof may be made depending on design specifications.

a combination of individualized configurations may refer to a single functional structure (structure) in the form of a physical assembly, and various choices may be made according to design specifications.

Constituent elements having the same function as in the previous embodiment are denoted by the same reference numeral, a detailed description thereof is replaced with the description of the previous embodiment, and a repeated descriptions thereof will be omitted to avoid redundancy and a description will be made focusing on differences from the previous embodiment.

Figure 38:
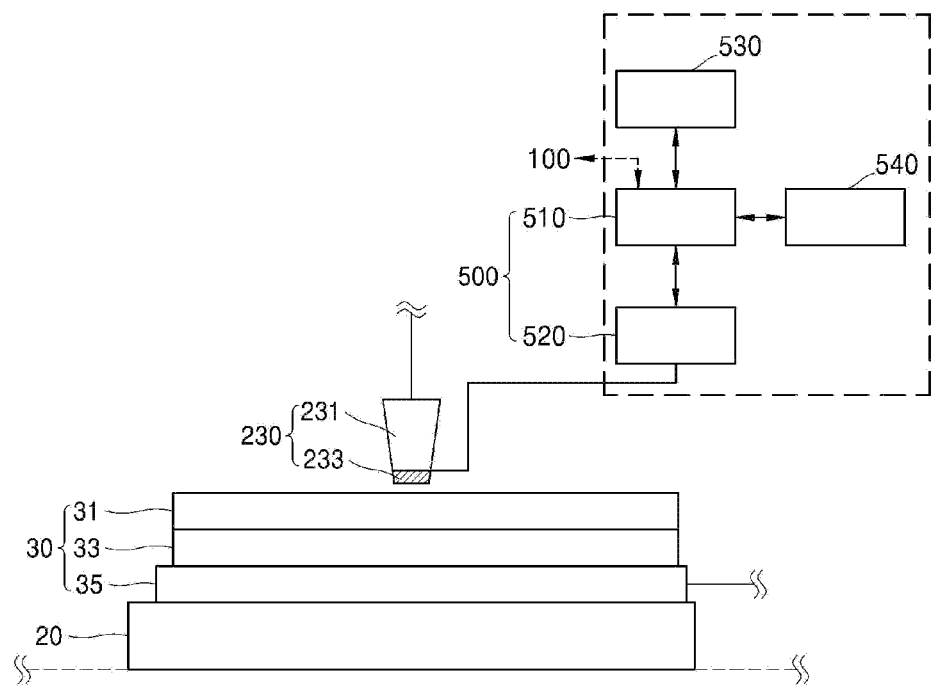
FIG. 38 is a is a schematic block diagram illustrating a modification of a semiconductor film layer inspection apparatus according to another embodiment of the present invention.
Figure 39:
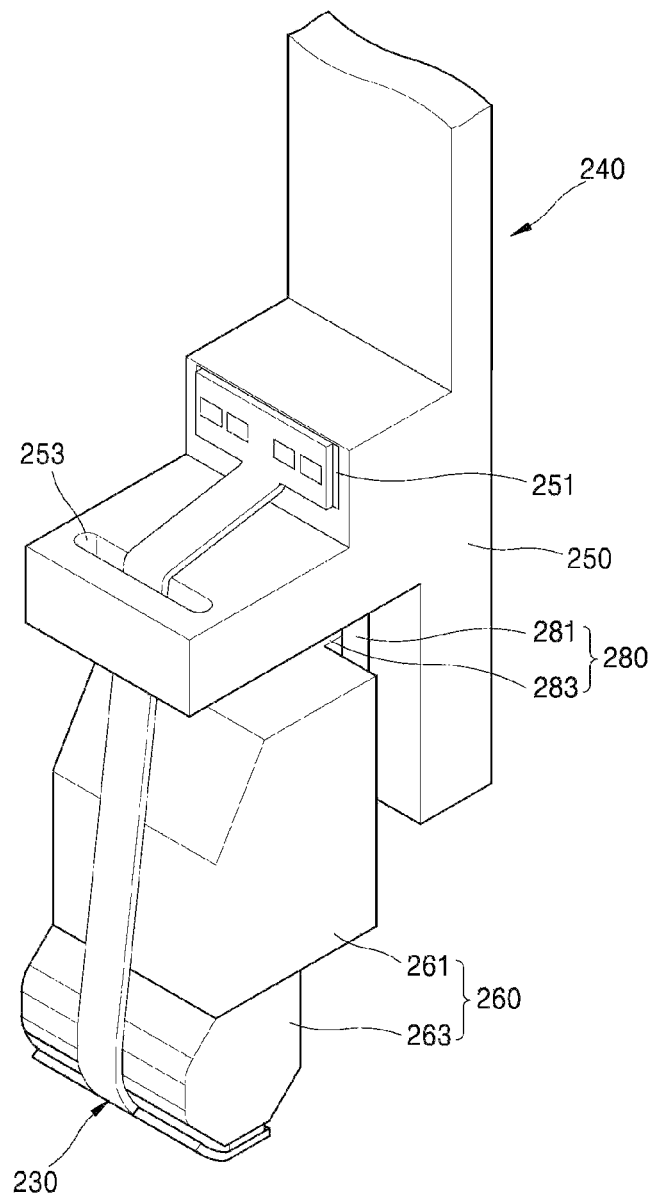
FIG. 39 is a top perspective view illustrating a modification of a detection probe moving unit of a detection unit of a semiconductor film layer inspection apparatus according to still another embodiment of the present invention.
Figure 40:
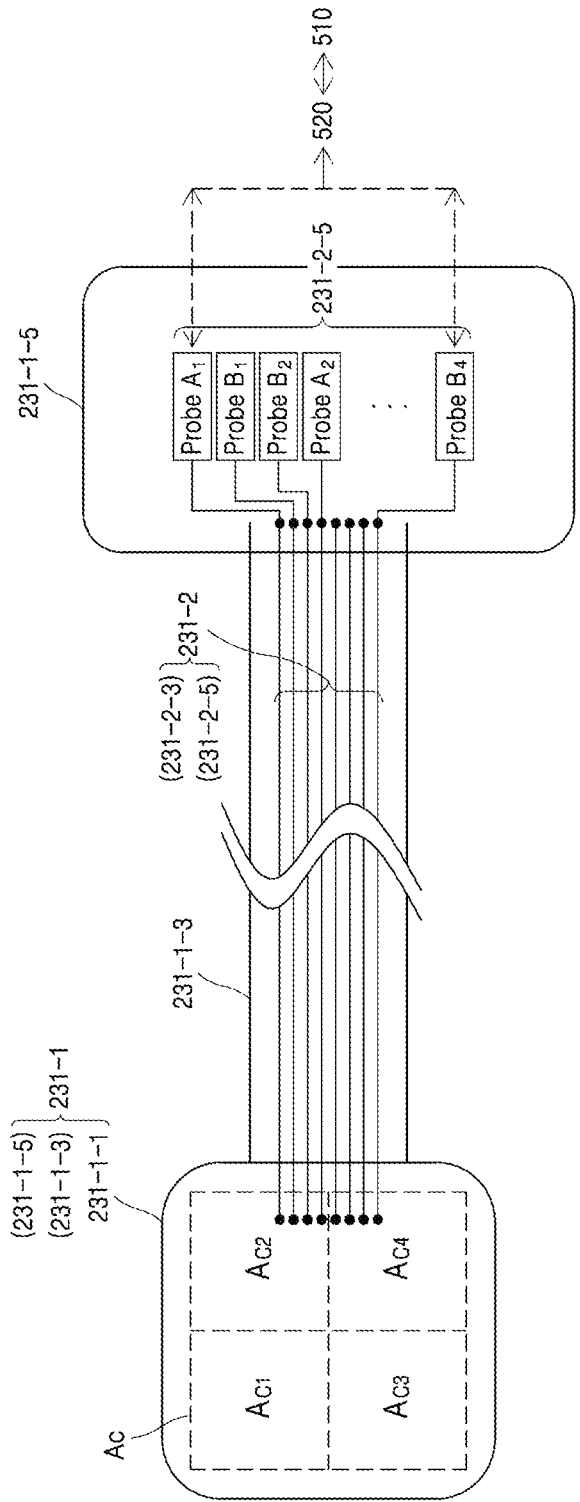
FIG. 40 is a diagrammatic view illustrating a configuration of a detection probe pin body of a detection probe pin contactor unit of a detection probe pin body of a semiconductor film layer inspection apparatus according to another embodiment of the present invention.
Figure 41:
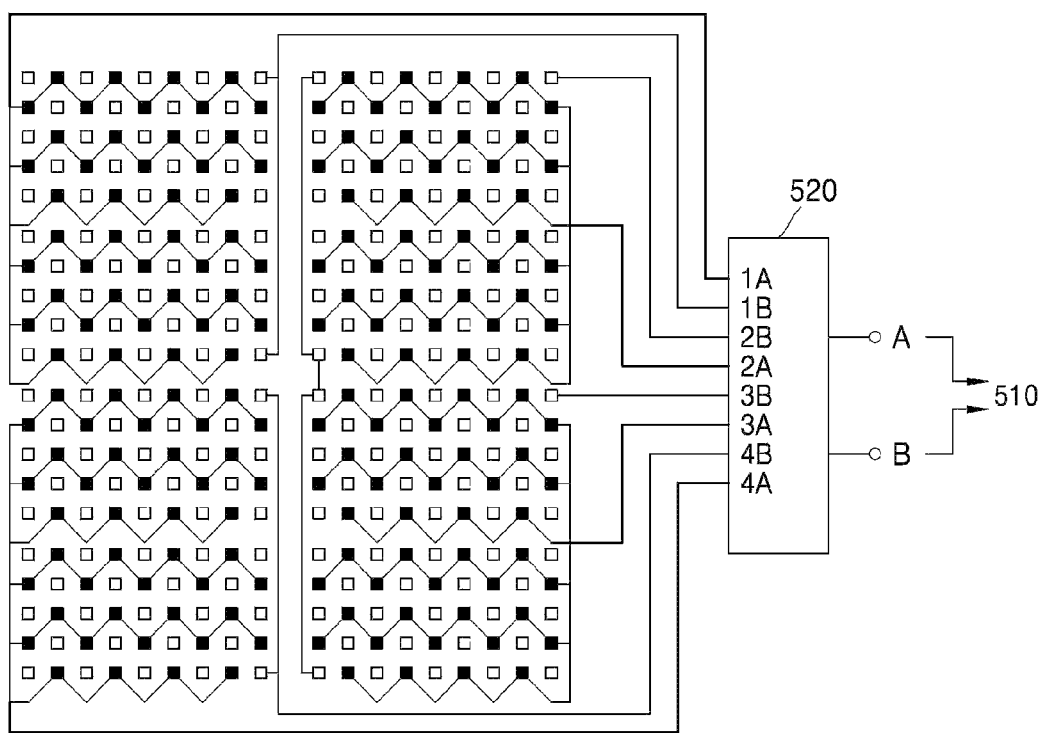
FIG. 41 is a schematic diagrammatic view illustrating a configuration of a detection probe pin contactor unit of a detection probe pin body of a semiconductor film layer inspection apparatus according to another embodiment of the present invention.
Figure 42:
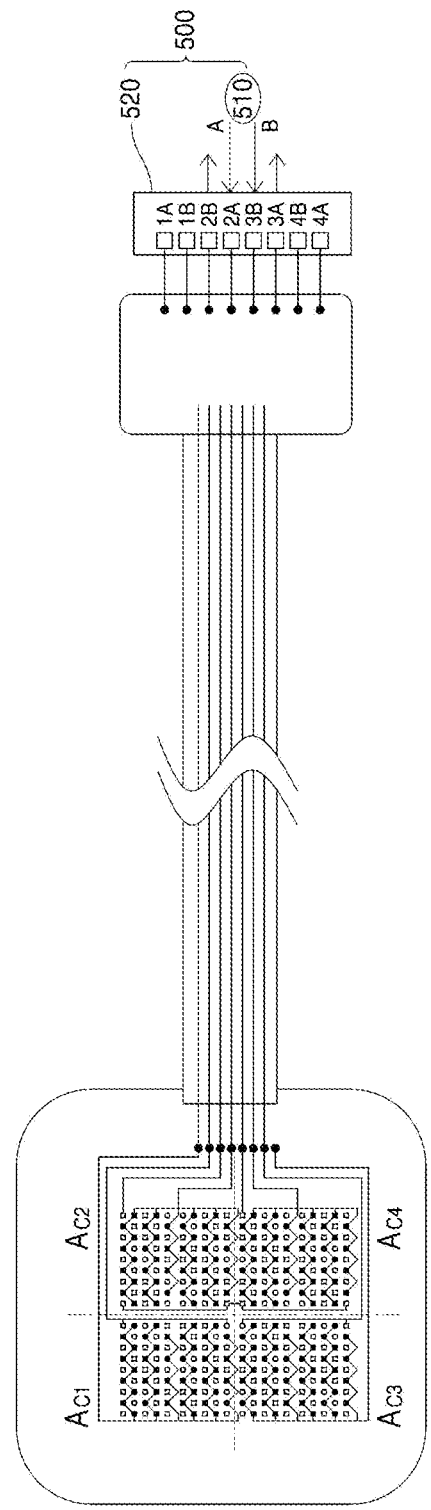
FIG. 42 is a schematic diagrammatic view illustrating a configuration of another example of a detection probe pin contactor unit of a detection probe pin body of a semiconductor film layer inspection apparatus according to another embodiment of the present invention.
Figure 43:
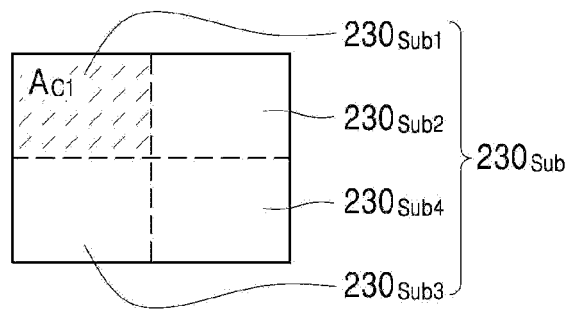
FIGS. 43 to 46 are schematic diagrammatic views illustrating one example of a detecting calibration process of a detection probe pin contactor unit of a detection probe pin body of a semiconductor film layer inspection apparatus according to another embodiment of the present invention.
Figure 44:
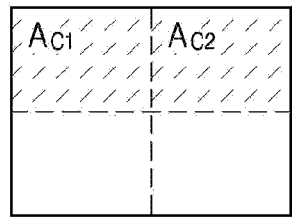
Figure 45:
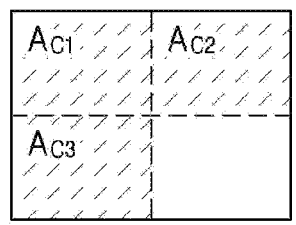
Figure 46:
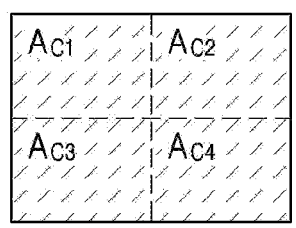

FIG. 38 is a is a schematic block diagram illustrating a modification of a semiconductor film layer inspection apparatus according to another embodiment of the present invention, FIG. 39 is a top perspective view illustrating a modification of a detection probe moving unit of a detection unit of a semiconductor film layer inspection apparatus according to another embodiment of the present invention, and FIGS. 40 to 42 are diagrammatic views illustrating the state and configuration of a modification of a detection probe pin of a semiconductor film layer inspection apparatus according to another embodiment of the present invention. In this embodiment, the detection unit 200 is brought into close contact with at least two points on one surface of the oxide semiconductor layer 31 of the semiconductor film layer 30 disposed on the substrate 20. Such contact is performed through the detection probe pin contactor unit 233 of the detection probe pin 230, and the detection probe pin contactor unit 233 is provided in plural numbers so as to provide a plural contact with the oxide semiconductor layer 31. This configuration is the same as described above.

In this case, the detection probe pin contactor unit 233 of the detection unit 200 of the semiconductor film layer inspection apparatus 10 according to this embodiment may further include the detection probe pin contactor 235 and the detection probe pin medium 237 as in the previous embodiment shown in FIG. 18. The detection probe pin medium 237 may be formed as an elastically deformable conductor disposed between the detection probe pin body 231 and the detection probe pin contactor 235. The detection probe pin medium may be formed integrally or individually in units of the detection probe pin contactor 235, or in some embodiments, may be modified in various manners, such as taking a structure in which the detection probe pin medium is excluded.

In this case, unlike the case in which the detection probe pin contactor unit 233 disposed on the detection probe pin body 231 is moved as in the previous embodiment Unlike the case in which the plurality of detection probe pin contactor units 233 disposed on the plurality of detection probe pin bodies 231 are simultaneously operated as an entire unit as in the previous embodiment, the present invention may have a configuration in which the plurality of detection probe pin contactor units 233 are segmented and operated individually. In other words, as shown in FIG. 38, the detection probe pin contactor unit 233 of the present invention at least partially forms a plurality of independently detectable and operable segmented pin contactor unit blocks, so that the electrical characteristics detection signal of the oxide semiconductor layer 31 which is detected through contact between the detection probe pin contactor unit 233 and the oxide semiconductor layer 31 in each segmented block region may be utilized entirely or partially in a selective or combined manner.

Figure 53:
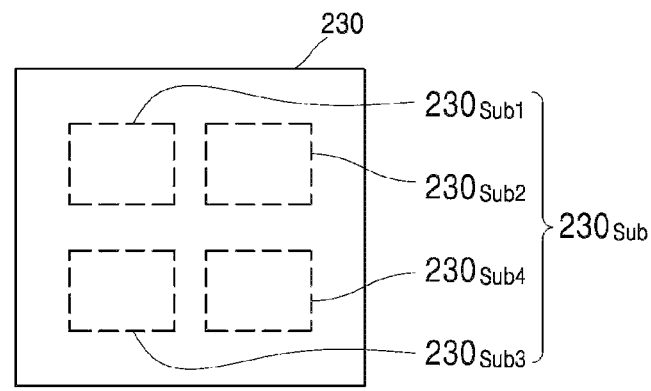
FIGS. 53 and 54 are diagrammatic views illustrating a configuration of pin contactor unit blocks of a semiconductor film layer inspection apparatus according to another embodiment of the present invention.
Figure 54:
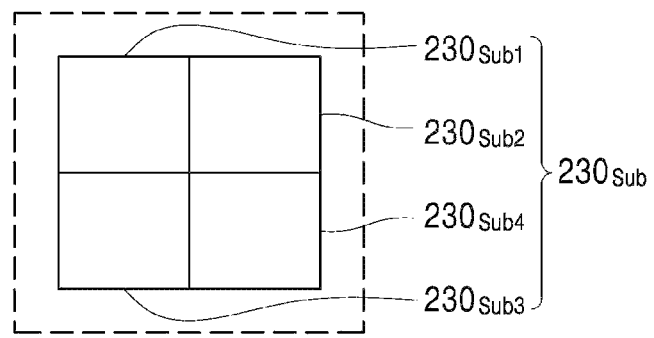

The detection probe pin contactor unit 233 disposed on the detection probe pin body 231 may have an individually operable structure in units of segmented block regions. In order to form such a structure, the detection probe pin 230 may have a configuration in which it includes a detection probe sub pin 230sub (230sub1, 230sub2, 230sub3 and 230sub4) as block units of the detection probe pin contactor unit 233 of the detection probe pin contactor unit 233. The detection probe pin contactor unit 233 mounted on a single detection probe pin body 231 of a physically integrated and unified detection probe pin 230 may have a structure in which it forms the pin contactor blocks through the detection probe sub pin 230sub (230sub1, 230sub2, 230sub3, and 230sub4) of the block units as units of independently operable segmented regions as shown in FIG. 53, and the detection probe pin contactor unit 233 mounted on each of a plurality of detection probe pin bodies 231 may have a structure in which it forms the pin contactor blocks through the detection probe sub pin 230sub (230sub1, 230sub2, 230sub3, and 230sub4) of the block units as units of independently operable individual regions as shown in FIG. 54. Thus, the detection probe pin contactor unit 233 may be selected in various manners. In other words, in the present invention, the physically unified detection probe pin body 231 may include a configuration in which it forms the pin contactor unit blocks as a plurality of segmented structures as shown in FIG. 53, and the detection probe pin contactor unit 233 disposed on the detection probe pin body 231 may include a configuration in which it forms a plurality of segmented pin contactor blocks through the form of a combination in which the physically individualized detection probe pin bodies 231 are functionally integrated and unified.

Further, the semiconductor film layer inspection apparatus 10 of the present invention may include a detecting calibration module (500). The detecting calibration module 500 may be disposed between the detection probe module 202 and the detection probe pin 230 to allow for the transmission and reception of electrical signals between therebetween. More specifically, as described above, the detection probe pin contactor unit 233 in this embodiment forms a plurality of independently detectable and operable pin contactor unit blocks, and a detection signal from the detection probe module 202 is applied to the detection probe pin contactor unit 233. Then, the detecting calibration module 500 processes an independently operable detection sensing signal applied thereto from the detection probe pin contactor unit 233 for application to the detection probe module 202. The detection signal from the detection probe module 202 may be applied, as an independently operable detection signal, to the detection probe pin contactor unit 233 in units of respectively segmented pin contactor unit blocks.

More specifically, the detecting calibration module 500 includes a detecting calibration data selector 520 and a detecting calibration control unit 510. The detecting calibration data selector 520 selects a target pin contactor unit block from among the plurality of pin contactor unit blocks using the detection signal from the detection probe module 202 as the independently operable detection signal. In other words, the detecting calibration data selector 520 of the detecting calibration module 500 may be switched in response to a control signal from the control unit 100 of the semiconductor film layer inspection apparatus 10 to perform a data selection function. The control signal from the control unit 100 may be generated from the control unit 100 or the detecting calibration control unit 510 which will be described later. Although having been described focusing on an individual configuration in this embodiment, the detection calibration control unit 510 may be represented as a term for functional distinction or the control unit 10 may perform an integrated function within the scope of performing a corresponding function, and thus various modifications thereof may be made depending on design specifications.

As shown in FIGS. 40 to 42, the detecting calibration data selector 520 is implemented as a multiplexer (MUX). The detecting calibration data selector 520 may output, as the independently operable detection sensing signal, the detection sensing signal applied to the detecting calibration module 500 from the detection probe pin contactor unit 233 of a corresponding pin contactor unit block as a result of detection of the oxide semiconductor layer 31 in response to a control signal for selecting the target pin contactor unit block, generated from the control unit 100 or the detecting calibration control unit 510, and allows the outputted detection sensing signal to be applied to another element.

Such an independently operable detection sensing signal is applied to the detecting calibration control unit 510. The detecting calibration control unit 510 determines whether to use the independently operable detection sensing signal from the detection probe pin contactor unit 233 of the corresponding pin contactor unit block. Such determination is made based on the independently operable detection sensing signals of the plurality of pin contactor unit blocks and information on the number of the detection probe pin contactor units 233, The number information of the detection probe pin contactor units 233 may be stored as preset data in a detecting calibration storage unit 530 shown in FIG. 38, and the detecting calibration storage unit 530 may perform functions such as withdrawing the preset data or storing the independently operable detection sensing signal through electrical communication with the detection calibration control unit 510. The function of the detecting calibration storage unit 530 may be modified in various manners depending on design specifications, such as being integrated so as to be performed by an overall storage unit of the semiconductor film layer inspection apparatus 10.

The detecting calibration control unit 510 may perform a normalization of the electrical characteristics of the semiconductor film layer 30 including the oxide semiconductor layer 31 based on the number of the detection probe pin conductor units 233 depending on whether to use the independently operable detection sensing signal from the detection probe pin contactor unit 233 of the corresponding pin contactor unit block. As used in herein, the term "normalization" refers to arithmetically calculating the detection sensing signal obtained through detection of the detection probe pin contactor units 233 and the total number of the detection probe pin contactor units 233 used for detection, and using the electrical characteristics value of the oxide semiconductor layer 31 detected per each detection probe pin contactor unit 233. The arithmetic calculation may be performed through a simple division, or may be implemented in various manners within the scope of enabling to confirm linearity with respect to the number of detection probe pin contactor units 233 used to allow the detection calibration control unit 510 to determine whether to use the independent operable detection sensing signal among the whole detection probe pin contactor units.

In addition, an arithmetic calculation required during this process may be performed by an overall arithmetic unit or an integrated control unit, or in some embodiments, a separate arithmetic unit for a necessary arithmetic calculation process may be further provided. As such, the arithmetic calculation may be selected in various manners.

In FIGS. 43 to 47, there are shown a diagrammatic view showing a detecting calibration process of determining whether to use the independently operable detection sensing signal detected by the detection probe pin contactor unit 233 of a corresponding pin contactor unit block, and a graph showing calculated capacitance values as the electrical characteristics of the oxide semiconductor layer 31, obtained in regions determined to be used through the detecting calibration process through a determination and calculation function of the detecting calibration control unit 510.

Figure 47:
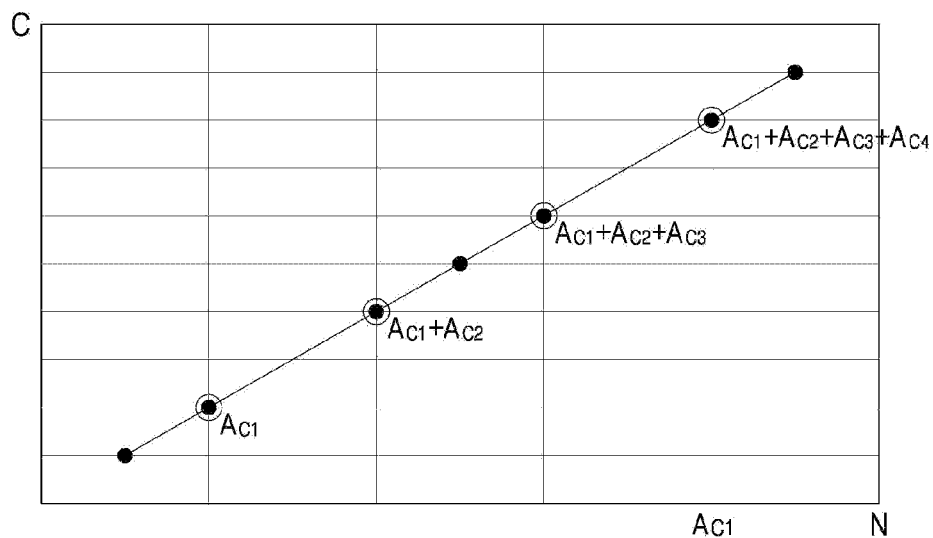
FIG. 47 is a graph illustrating electrical characteristics results of FIGS. 43 to 46.

As shown in FIGS. 43 to 46, the detection probe pin 230 formed by the detection probe pin body 231 and the detection probe pin contactor unit 233 disposed on the detection probe pin body 231 has a structure in which it is segmented into a total of four pin contactor unit blocks 230sub (230sub1, 230sub2, 230sub3 and 230sub4). These pin contactor unit blocks are independently operable so that a detection can be sequentially or cumulatively made on four regions indicated by reference numerals Ac1 to Ac4, which correspond to the total of four pin contactor blocks 230sub (230sub1, 230sub2, 230sub3 and 230sub4) as shown in FIGS. 43 to 46. The detection sensing signals obtained by the detection made on the four regions Ac1 to Ac4 may be processed and represented as a graph showing the electrical characteristics, e.g., capacitance values as shown in FIG. 47. In this case, the capacitances designated by respective points of the graph form a linear relationship, and the gradient at each point form a ratio relationship equal to the number of corresponding regions, i.e., the number of the pin contactor units blocks used for detection, more specifically, the number of the detection probe pin contactor units used for detection, so that the electrical characteristics value normalized per the number of detection probe pin contactor units 233 can be derived, thereby further enhancing the reliability of the detection sensing signal.

In some embodiment, the detecting calibration control unit 510 may be configured variously for the purpose of the selection and determination of the plurality of segmented pin contactor unit blocks as well as the more accurate detection of the electrical characteristics of the oxide semiconductor layer, normalized with respect to the number of the detection probe pin contactor units 233 through the selection and determination. For example, the detecting calibration control unit 510 according to one embodiment of the present invention may include a detecting calibration calculation control unit 511, a detecting calibration determination control unit 513, and a detecting calibration update control unit 515.

The detecting calibration calculation control unit 511 calculates independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units 233.

The detecting calibration determination control unit 513 determines whether to use the independently operable detection sensing signals per the number of the detection probe pin contactor units calculated by the calibration calculation control unit 511 as independently operable detection sensing signals based on the independently operable detection sensing signals per the number of the detection probe pin contactor units calculated by the calibration calculation control unit 511 or the electrical characteristics values corresponding to the independently operable detection sensing signals. In other words, the detecting calibration storage unit 530 has independently operable detection sensing signal reference values per the number of the detection probe pin contactor units stored therein. In this case, arbitrarily selected or preset data may be used in an initial state, or an updated value may be stored in the detecting calibration storage unit 530 depending on whether to use the independently operable detection sensing signals in a subsequent step to allow new independent operation detection signal reference values per the number of the detection probe pin contactor units to be stored in the detecting calibration storage unit 530.

The detecting calibration determination control unit 513 compares the independently operable detection sensing signals per the number of the detection probe pin contactor units, calculated by the calibration calculation control unit 511 with the independently operable detection sensing signal reference values per the number of the detection probe pin contactor units, which are stored in the detecting calibration storage unit 530. If the calculated independently operable detection sensing signals per the number of the detection probe pin contactor units is out of the preset data range stored in the detecting calibration storage unit 530 from the independently operable detection sensing signal reference values per the detection probe pin contactor units, the detecting calibration determination control unit 513 determines not to use the independently operable detection signal detected in the corresponding pin contactor block.

On the contrary, If the calculated independently operable detection sensing signals per the number of the detection probe pin contactor units is not out of the preset data range stored in the detecting calibration storage unit 530 from the independently operable detection sensing signal reference values per the detection probe pin contactor units, the detecting calibration determination control unit 513 determines to use the independently operable detection signal detected in the corresponding pin contactor block.

When the detecting calibration determination control unit 513 determines whether to use the independently operable detection sensing signals per the number of the detection probe pin contactor units, the detecting calibration update control unit 51) determines whether to update the independently operable detection sensing signal reference values per the number of the detection probe pin contactor units. In other words, if the detecting calibration determination control unit 513 determines to use the independently operable detection sensing signals per the number of the detection probe pin contactor units as independently operable detection sensing signals, the detecting calibration update control unit 515 updates the independently operable detection sensing signals per the number of the detection probe pin contactor units as the independently operable detection sensing signal reference values per the number of the detection probe pin contactor units, which are stored in the detecting calibration storage unit 530.

Figure 48:
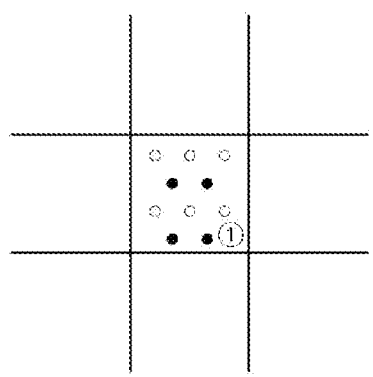
FIGS. 48 to 50 are schematic diagrammatic views illustrating another example of a detecting calibration process of a detection probe pin contactor unit of a detection probe pin body of a semiconductor film layer inspection apparatus according to another embodiment of the present invention.
Figure 49:
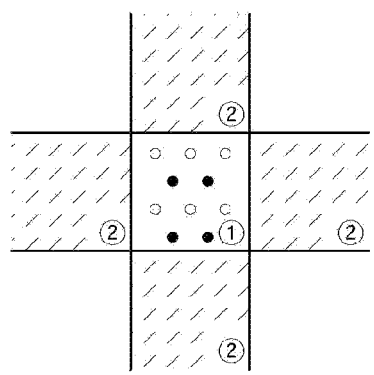
Figure 50:
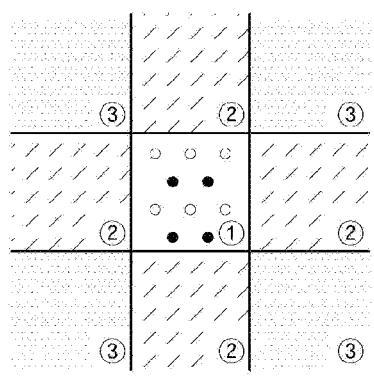

In the previous embodiment, a description has been made of only the configuration in which the detection probe pin contactor unit 233 forms a total of four pin contactor unit blocks, but this invention is not limited thereto. In other words, as shown in FIGS. 48 to 50, the detection probe pin contactor unit 233 may form a structure in which it is segmented into a total of nine pin contactor unit blocks. These pin contactor unit blocks may be individualized and may be subjected to a detection and determination operation in such a manner as to be incremented by one as shown in FIGS. 43 to 46. The contactor unit blocks may be selected in various manners, such as being subjected to the process of detection, determination and calculation in such a manner as to be incremented in units of plural pin contactor unit blocks. In other words, in the case of FIGS. 48 to 50, the process of detection, determination and calculation may be executed in such a manner that the pin contactor unit blocks are extended in the order of a central pin contactor unit block indicated by reference numeral ①, other adjacent pin contactor unit blocks indicated by reference numeral ② and located at the top, bottom, left, and right positions of the central pin contactor unit block ①, other pin contactor unit blocks indicated by reference numeral ③ and located diagonally from the central pin contactor unit block ①, and block regions adjacent to the pin contactor unit blocks ②. Herein, the order of the execution of the detection and determination operation in which the pin contactor unit blocks are extended is not limited to the case of FIGS. 48 to 50, but may be selected in various manners within the scope of performing the calculation process.

Figure 51:
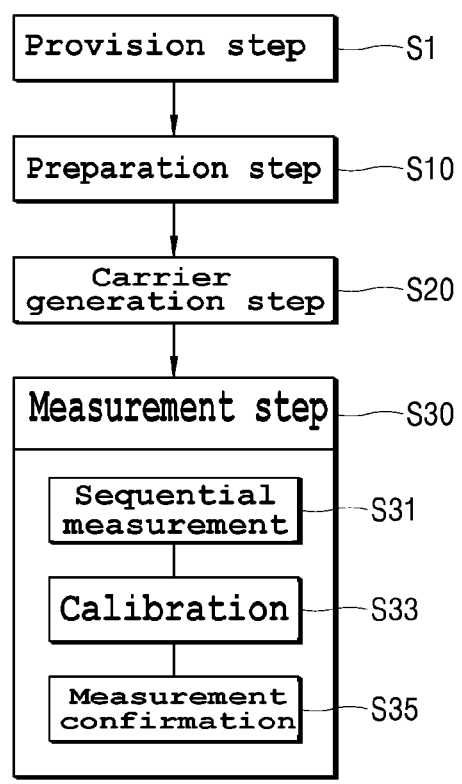
FIG. 51 is a flowchart illustrating a process of controlling a semiconductor film layer inspection apparatus according to another embodiment of the present invention.
Figure 52:
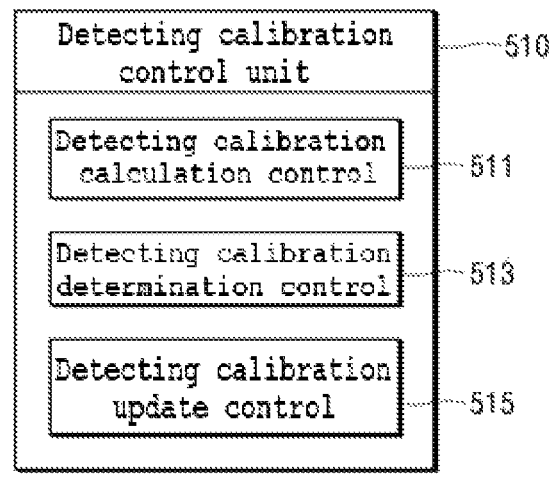
FIG. 52 is a diagrammatic flowchart illustrating a configuration of a detecting calibration control unit of a semiconductor film layer inspection apparatus according to another embodiment of the present invention.

Meanwhile, in the previous embodiment, although the description has been made focusing on a configuration in which the process of detection, determination, calculation, and confirmation of each of the pin contactor unit blocks is performed in units of segmented blocks, such a configuration may be selected in various manners within the scope or executing a fast calculation process. For example, as shown in FIG. 51, as described above, a control process of the semiconductor film layer inspection apparatus may be performed as follows. A provision step S1 (see FIG. 6) of providing the semiconductor film layer inspection apparatus 10 of the present invention is performed, and a preparation step S10 of preparing a sample object whose characteristics is to be inspected is performed so that the sample object is disposed on the semiconductor film layer inspection apparatus 10. In the preparation step, the substrate 20 is provided on which the oxide semiconductor layer 31 as the inspection sample object is formed. Thereafter, a carrier generation step S20 is performed to form a state of enabling detection through excitation of the free carrier, and the preparation step S10 and the carrier generation step S20 are the same as described above.

Subsequently, a measurement step S30 is performed. The measurement step S30 may include a sequential measurement step S31, a calibration step S33, and a measurement confirmation step S35.

Figure 55:
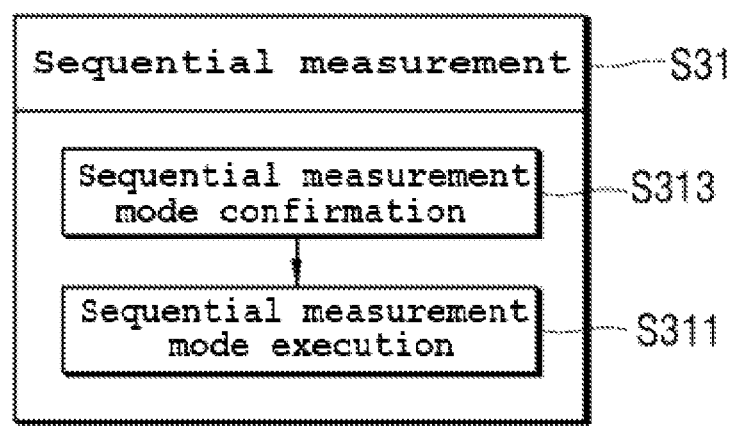
FIGS. 55 and 56 are flowcharts illustrating a semiconductor film layer inspection method using a semiconductor film layer inspection apparatus according to another embodiment of the present invention.

As shown in FIG. 55, in the sequential measurement step S31, a detection sensing signal is acquired as an independently operable detection sensing signal individually or in preset single or plural units of blocks for a plurality of pin contactor unit blocks which are segmented in a preset manner.

Figure 56:
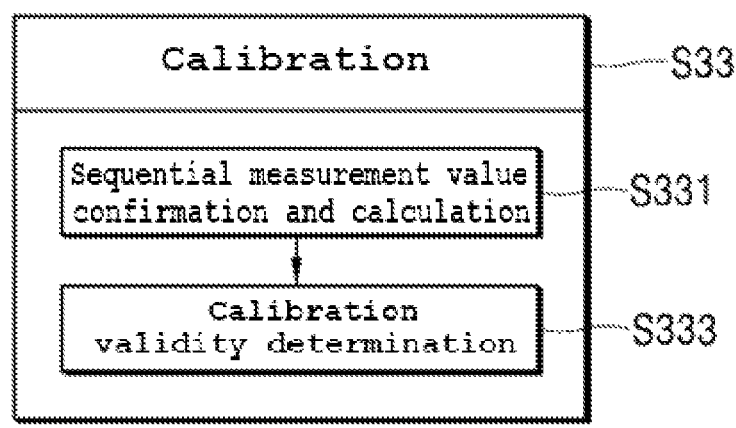

As shown in FIG. 56, in the calibration step S33, a sequential measurement value measured in a target pin contactor unit block is verified and calculated using the detection sensing signal acquired individually for the pin contactor unit blocks in the sequential measurement step S31 as the independently operable detection sensing signal, and validity of the calculated sequential measurement value as the independently operable detection sensing signal is determined.

In the measurement confirmation step S35, the final electrical characteristics of the oxide semiconductor layer is outputted as a result of determination in the calibration step S33.

In this case, as described above, the semiconductor film layer inspection apparatus further includes a detecting calibration module 500.

The detecting calibration module 500 is disposed between the detection probe module 202 and the detection probe pin 230 to allow for the transmission and reception of electrical signals between therebetween, and applies, as an independently operable detection signal, a detection signal from a detection probe module 202 to the detection probe pin contactor unit 233 that forms a plurality of independently detectable and operable pin contactor unit blocks and processes an independently operable detection sensing signal applied thereto from the detection probe pin contactor unit 233 for application to the detection probe module 202.

More specifically, the detecting calibration module 500 includes a detecting calibration data selector 520 and a detecting calibration control unit 510. The detecting calibration data selector 520 selects a target pin contactor unit block from among the plurality of pin contactor unit blocks using the detection signal from the detection probe module 202 as the independently operable detection signal, and outputs as the independently operable detection sensing signal from the detection probe pin contactor unit 233 of a corresponding pin contactor unit block of the pin contactor unit blocks, the detection sensing signal applied to the detecting calibration module 500 from the detection probe pin contactor unit 233. The detecting calibration control unit 510 determines whether to use the independently operable detection sensing signal from the detection probe pin contactor unit 233 of the corresponding pin contactor unit block based on the independently operable detection sensing signals of the plurality of pin contactor unit blocks and information on the number of the detection probe pin contactor units 233, and performs a normalization of the electrical characteristics of the semiconductor film layer 30 including the oxide semiconductor layer 31 based on the number of the detection probe pin conductor units 233 depending on whether to use the independently operable detection sensing signal from the detection probe pin contactor unit 233 of the corresponding pin contactor unit block. This configuration of the detecting calibration module 500 is the same as described above.

First, in the sequential measurement step S31, a detection sensing signal is acquired as an independently operable detection sensing signal individually or in preset single or plural units of blocks for a plurality of pin contactor unit blocks which are segmented in a preset manner. In some embodiments, the sequential measurement step S31 includes a sequential measurement mode confirmation step S311 and a sequential measurement mode execution step S313. In other words, in the sequential measurement mode confirmation step S311, the detecting calibration control unit 510 confirms a sequential measurement mode which is to be selected and executed by a user. In the case of a single line operation system, a single sequential measurement mode may be stored to take a structure capable of implementing a single line operation process, but in some embodiment, the single line operation system may be modified in various manners, such as adopting a plurality of sequential measurement modes and employing a method of performing the sequential measurement mode by selecting an optimal mode according to the workload and work speed by the user.

In this case, the sequential measurement mode selected by the user may be modified in various manners. In this embodiment, in this sequential measurement step, the sequential measurement mode and the detection sensing signal may be selected and acquired, respectively, through the operation of the detecting calibration control unit 510 and the detection calibration data selector 520 as a multiplexer. For example, as shown in FIGS. 43 to 46, the detection sensing signal may be individually acquired as an independently operable detection sensing signal for the regions Ac1 to Ac4 corresponding to the four segmented pin contactor unit blocks, which is to be measured in a zig zag pattern proceeding from left to right and from top to bottom. Alternatively, as shown in FIGS. 48 to 50, the detection sensing signal may be individually acquired as an independently operable detection sensing signal for other adjacent segmented pin contactor unit blocks located at the top, bottom, left, and right positions of the central segmented pin contactor unit block, and other segmented pin contactor unit blocks located diagonally from the segmented central pin contactor unit block. The sequential measurement mode may be modified in various manners, such as adopting various sequential measurement preset methods as an example of the above-mentioned method.

As such, the detecting calibration control unit 510 performs a measurement mode operation of acquiring the detection sensing signal as the independently operable detection sensing signal individually for the segmented pin contactor unit blocks according to the sequential measurement mode selected in the sequential measurement mode execution step S313 according to the sequential measurement mode confirmed in the sequential measurement mode confirmation step S311.

After the sequential measurement step S31 including the sequential measurement mode confirmation step S311 and the sequential measurement mode execution step S313 has been completed, the calibration step S33 is executed.

In the calibration step S33, the detecting calibration control unit 510 confirms and calculates a sequential measurement value measured in a target pin contactor unit block using the detection sensing signal acquired individually for the segmented pin contactor unit blocks in the sequential measurement step (S31) as the independently operable detection sensing signal, and determines validity of the calculated sequential measurement value as the independently operable detection sensing signal.

In other words, the calibration step S33 may include a sequential measurement value confirmation and calculation step S331 and a calibration validity determination step S333. In the sequential measurement value confirmation and calculation step S331, the detecting calibration calculation control unit 511 calculates independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units 233.

Thereafter, the calibration validity determination step S333 is performed. In the calibration validity determination step S333, the detecting calibration determination control unit 513 determines whether to use the independently operable detection sensing signals per the number of the detection probe pin contactor units calculated by the calibration calculation control unit 511 as independently operable detection sensing signals based on the independently operable detection sensing signals per the number of the detection probe pin contactor units calculated by the calibration calculation control unit 511 or the electrical characteristics values corresponding to the independently operable detection sensing signals. In other words, as described above, the detecting calibration storage unit 530 may have independently operable detection sensing signal reference values per the number of the detection probe pin contactor units stored therein. In this case, arbitrarily selected or preset data may be used in an initial state, or an updated value may be stored in the detecting calibration storage unit 530 depending on whether to use the independently operable detection sensing signals in a subsequent step to allow new independent operation detection sensing signal reference values per the number of the detection probe pin contactor units to be stored in the detecting calibration storage unit 530.

The detecting calibration determination control unit 513 compares the independently operable detection sensing signals per the number of the detection probe pin contactor units, calculated by the calibration calculation control unit 511 with the independently operable detection sensing signal reference values per the number of the detection probe pin contactor units, which are stored in the detecting calibration storage unit 530.

The detecting calibration determination control unit 513 compares the independently operable detection sensing signals per the number of the detection probe pin contactor units, calculated by the calibration calculation control unit 511 with independently operable detection sensing signal reference values per the number of the detection probe pin contactor units, which are stored in the detecting calibration storage unit 530. If the calculated independently operable detection sensing signals per the number of the detection probe pin contactor units is out of the preset data range stored in the detecting calibration storage unit 530 from the independently operable detection sensing signal reference values per the detection probe pin contactor units, the detecting calibration determination control unit 513 determines not to use the independently operable detection signal detected in the corresponding pin contactor block, and performs the predetermined step S333.

On the contrary, If the calculated independently operable detection sensing signals per the number of the detection probe pin contactor units is not out of the preset data range stored in the detecting calibration storage unit 530 from the independently operable detection sensing signal reference values per the detection probe pin contactor units, the detecting calibration determination control unit 513 determines to use the independently operable detection signal detected in the corresponding pin contactor block, and performs the predetermined step S333.

In step S333, if the detecting calibration determination control unit 513 determines to use the independently operable detection sensing signals per the number of the detection probe pin contactor units as independently operable detection sensing signals, a predetermined measurement confirmation step is performed in step S35.

In other words, in the measurement confirmation step S35, the detecting calibration update control unit 515 determines whether to update the independently operable detection sensing signal reference values per the number of the detection probe pin contactor units. If the detecting calibration determination control unit 513 determines to use the independently operable detection sensing signals per the number of the detection probe pin contactor units as independently operable detection sensing signals, the detecting calibration update control unit 515 updates the independently operable detection sensing signals per the number of the detection probe pin contactor units as the independently operable detection sensing signal reference values per the number of the detection probe pin contactor units, which are stored in the detecting calibration storage unit 530. On the contrary, if the detecting calibration determination control unit 513 determines not to use the independently operable detection sensing signals per the number of the detection probe pin contactor units as independently operable detection sensing signals, a process is executed in which the detecting calibration update control unit 515 excludes the independently operable detection sensing signals per the number of the detection probe pin contactor units from the independently operable detection sensing signal reference values.

Through this process, in the measurement confirmation step S35, the detection sensing signal obtained through detection of the detection probe pin contactor units 233 and the total number of the detection probe pin contactor units 233 used for detection are arithmetically calculated, and the electrical characteristics value of the oxide semiconductor layer 31 detected per each detection probe pin contactor unit 233 is used. The capacitances designated by respective points of the graph form a linear relationship, and the gradient at each point form a ratio relationship equal to the number of corresponding regions, i.e., the number of the pin contactor units blocks used for detection, more specifically, the number of the detection probe pin contactor units used for detection, so that the electrical characteristics value normalized per the number of detection probe pin contactor units 233 can be derived, thereby further enhancing the reliability of the detection sensing signal.

After this determination, the measurement confirmation step S35 may be performed to improve the detection accuracy of the measurement characteristics, e.g., the capacitance of the oxide semiconductor layer 31 as an inspection sample object through a finally calculated or updated value, thereby ensuring reliability of data, which is the same as described above.

In addition, as in the previous embodiment, the detection probe pin body 231 of the semiconductor film layer inspection apparatus 10 of this embodiment may include a detection probe pin body base 231-1 and a detection probe pin body line 231-2. The detection probe pin body base 231-1 allows the detection probe pin contactor unit 233 to be disposed thereon, and the the detection probe pin body line 231-2 is disposed on one surface of the detection probe pin body base 231-1 so as to be electrically connected to the detection probe pin contactor unit 233.

The detection probe pin body base 231-1 includes an FPCB, and the detection probe pin contactor unit 233 comprises a plurality of detection probe pin contactors 235 which is disposed on one surface of the detection probe pin body base 231-1 so as to be electrically connected to the detection probe pin body line 231-2, and is brought into direct contact with the oxide semiconductor layer. This structure may be the same as described above.

In addition, at least one of the plurality of detection probe pin contactors 235 may be applied with an electrical signal different from that of at least another adjacent detection probe pin contactor 235. In FIGS. 41 and 42, there is shown only a matrix type configuration of a detection probe pin contactor unit, but it is obvious from the foregoing that the detection probe pin contactors 235 may form a structure in which at least one part thereof captures another part thereof.

Figure 29:
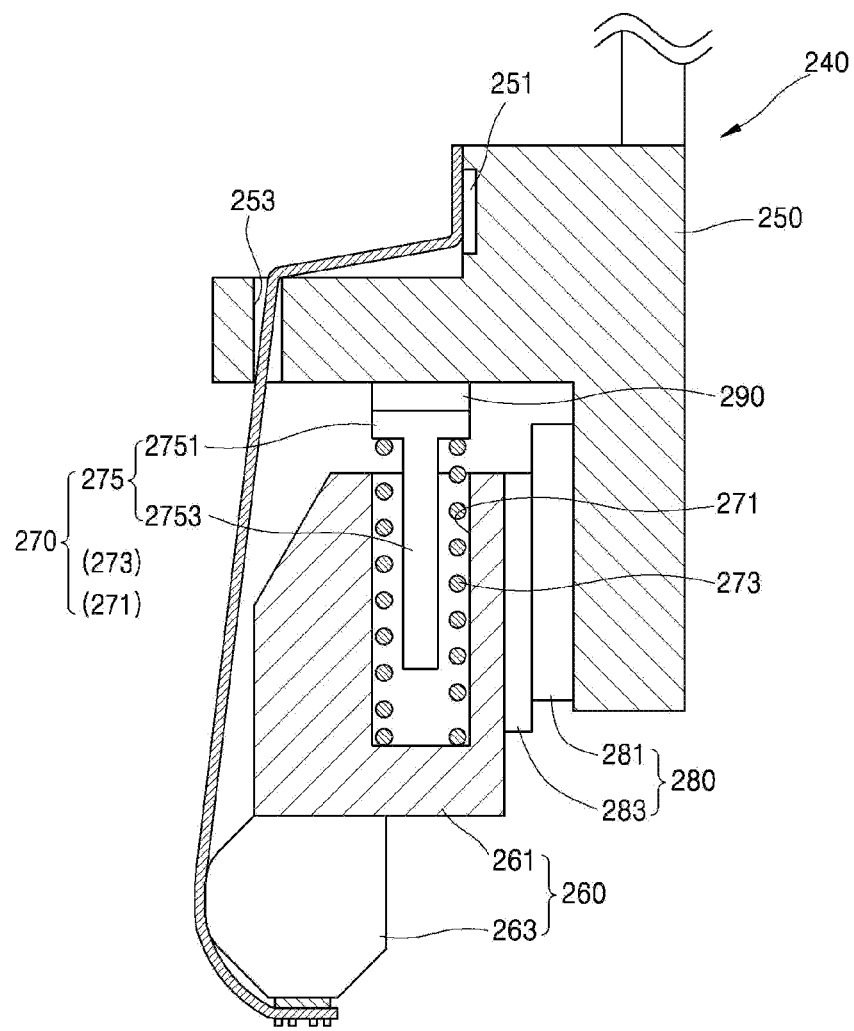

In addition, as in the above-described embodiment of FIG. 29, the detection unit 200 may include a detection probe moving unit 240. The detection probe moving unit 240 has a structure in which it allows the detection probe pin 230 to be disposed at one end thereof so as to be relatively movable with respect to the base unit 40. In this case, the detection probe moving unit 240 may include a detection probe moving body 241 and a detection probe moving guide 280. The detection probe moving body 241 allows the detection probe pin 230 to be disposed at one end thereof, and the detection probe moving guide 280 may have one end disposed at the detection probe moving body 241 and the other end disposed so as to be relatively movable with respect to the base unit 40.

The detection probe moving unit 240 may include a detection probe damping unit 270. The detection probe damping unit 270 may damp the movement of the detection probe moving body 241 to enable to implement a stable contact structure.

The detection probe damping unit 270 may include a damping moving body accommodating part 271, a damping elastic part 273, and a damping plunger 275. The damping moving body accommodating part 271 is disposed at the inside of the detection probe moving body 241. The damping elastic part 273 is disposed inside the damping body accommodating part 271 in such a manner as to be supported at one end thereof by the inner side of the damping body accommodating part 271. The damping plunger 275 is brought at one end thereof into contact with the damping elastic part 273 and is disposed at the other end thereof within the damping body accommodating part 271 so as to be oriented toward the base unit 40 to limit the movement of the detection probe moving body 241.

The damping plunger 275 may include a damping plunger body 2751 ad a damping plunger shaft 2753. The damping plunger body 2751 may be supported at an end thereof by the damping elastic part 273 in an elastic contact manner. The damping plunger shaft 2753 may be connected at one end thereof to the damping plunger body 2751 and accommodatingly disposed at the other end thereof within the damping moving body accommodating part 271 along the longitudinal direction of the damping moving body accommodating part 271.

The detection probe moving unit 240 includes a detection probe moving sensing unit 290. The detection probe moving sensing unit 290 is disposed at the base unit 40 so as to be opposed to the damping plunger body 2751, and is brought into contact with the damping plunger body 2751 to senses a contact state. In addition, the detection probe moving sensing unit 290 may include a pressure sensor. This configuration is the same as in the previous embodiment.

The semiconductor film layer inspection apparatus and the semiconductor film layer inspection method using the same according to the present invention may be modified in various manners depending on design specifications, such as having an independent arrangement structure or performing a detection step of detecting the electrical characteristics of the semiconductor film layer through the independent arrangement structure.

While the present invention has been described in connection with the exemplary embodiments illustrated in the drawings, they are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical sprit of the appended claims.

What is claimed is:

1. A semiconductor film layer inspection apparatus (10) for detecting the electrical characteristics of a semiconductor film layer (30) formed on one surface of a substrate (20) and including an oxide semiconductor layer (31), the apparatus comprising:
a base unit (40) configured to allow the substrate to be seatingly disposed on one surface thereof;
a detection signal generator (200) configured to apply an electrical signal based on close contact with at least two points on one surface of the oxide semiconductor layer, so as to detect the electrical characteristics of the oxide semiconductor layer; and
a carrier generator (300, 300a, 300b) configured to increase a concentration of a carrier of the oxide semiconductor layer,
wherein the detection signal generator (200) comprises:
a detection probe pin (230) configured to be brought into close contact with one or more points spaced apart from each other on one surface of the oxide semiconductor layer; and
a detection signal generating and sensing probe (202) configured to generate a detection signal for application to the detection probe pin (230) to detect the electrical characteristics of the oxide semiconductor layer, and configured to sense a detection sensing signal inputted thereto from the detection probe pin (230),
wherein the detection probe pin (230) comprises:
a detection probe pin body (231) disposed spaced apart from the oxide semiconductor layer; and
a detection probe pin contactor unit (233) disposed at one end thereof at the detection probe pin body (231) and brought at the other end thereof into direct contact with the oxide semiconductor layer, and
wherein the detection probe pin contactor unit (233) at least partially forms a plurality of independently detectable and operable segmented pin contactor unit blocks.

2. The semiconductor film layer inspection apparatus (10) according to claim 1, wherein the detection probe pin (230) comprises one or more detection probe sub pins (230sub), and the detection probe pin contactor unit (233) disposed on each of the detection probe sub pins (230sub) forms an independently detectable and operable pin contactor unit block in units of each detection probe sub pin (230sub).

3. The semiconductor film layer inspection apparatus (10) according to claim 1, further comprising a detecting calibration module (500) disposed between the detection signal generating and sensing probe (202) and the detection probe pin (230), and configured to apply, as an independently operable detection signal, a detection signal from the detection signal generating and sensing probe (202) to the detection probe pin contactor unit (233) that forms one or more independently detectable and operable pin contactor unit blocks and configured to process an independently operable detection sensing signal applied thereto from the detection probe pin contactor unit (233) for application to the detection signal generating and sensing probe (202).

4. The semiconductor film layer inspection apparatus (10) according to claim 3, wherein the detecting calibration module (500) comprises:
 a detecting calibration data selector (520) configured to select a target pin contactor unit block from among a plurality of pin contactor unit blocks using the detection signal from the detection signal generating and sensing probe (202) as the independently operable detection signal, and configured to output, as the independently operable detection sensing signal from the detection probe pin contactor unit (233) of a corresponding pin contactor unit block of the pin contactor unit blocks, the detection sensing signal applied to the detecting calibration module (500) from the detection probe pin contactor unit (233); and
 a detecting calibration control unit (510) configured to determine whether to use the independently operable detection sensing signal from the detection probe pin contactor unit (233) of the corresponding pin contactor unit block based on the independently operable detection sensing signals of the plurality of pin contactor unit blocks and information on a number of the detection probe pin contactor units (233), and configured to perform a normalization of the electrical characteristics of the semiconductor film layer (30) including the oxide semiconductor layer (31) based on the number of the detection probe pin contactor units (233) depending on whether to use the independently operable detection sensing signal from the detection probe pin contactor unit (233) of the corresponding pin contactor unit block.

5. The semiconductor film layer inspection apparatus (10) according to claim 4, wherein the detecting calibration control unit (510) comprises:
 a detecting calibration calculation control unit (511) configured to calculate independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units (233);
 a detecting calibration determination control unit (513) configured to compare the independently operable detection sensing signals per the number of the detection probe pin contactor units, calculated by the calibration calculation control unit (511) with independently operable detection sensing signal reference values per the number of the detection probe pin contactor units, which are stored in a detecting calibration storage unit (530), and determine whether to use the independently operable detection sensing signals per the number of the detection probe pin contactor units as independently operable detection sensing signals; and
 a detecting calibration update control unit (515) configured to update the independently operable detection sensing signals per the number of the detection probe pin contactor units as the independently operable detection sensing signal reference values per the number of the detection probe pin contactor units, which are stored in the detecting calibration storage unit (530) if the detecting calibration determination control unit (513) determines to use the independently operable detection sensing signals per the number of the detection probe pin contactor units as independently operable detection sensing signals.

6. The semiconductor film layer inspection apparatus (10) according to claim 1, wherein the detection probe pin body (231) comprises:
 a detection probe pin body base (231-1) configured to allow the detection probe pin contactor unit (233) to be disposed thereon; and
 a detection probe pin body line (231-2) disposed on one surface of the detection probe pin body base (231-1) to allow the detection probe pin contactor unit (233) to be electrically connected to the detection probe pin contactor unit (233).

7. The semiconductor film layer inspection apparatus (10) according to claim 6, wherein the detection probe pin body base (231-1) comprises an FPCB, and
 wherein the detection probe pin contactor unit (233) comprises one or more detection probe pin contactors (235) disposed on one surface of the detection probe pin body base (231-1) so as to be electrically connected to the detection probe pin body line (231-2), and configured to be brought into direct contact with the oxide semiconductor layer.

8. The semiconductor film layer inspection apparatus (10) according to claim 7, wherein at least one of the one or more detection probe pin contactors (235) is applied with an electrical signal different from that of at least another adjacent detection probe pin contactor (235).

9. The semiconductor film layer inspection apparatus (10) according to claim 7, wherein the one or more detection probe pin contactors (235) form a structure in which at least one part thereof captures another part thereof.

10. The semiconductor film layer inspection apparatus (10) according to claim 1, wherein the detection signal generator (200) comprises a detection probe moving unit (240) configured to allow the detection probe pin (230) to be disposed at one end thereof so as to be relatively movable with respect to the base unit (40).

11. The semiconductor film layer inspection apparatus (10) according to claim 10, wherein the detection probe moving unit (240) comprises:
 a detection probe moving body (241) configured to allow the detection probe pin (230) to be disposed at one end thereof; and
 a detection probe moving guide (280) having one end disposed at the detection probe moving body (241) and another end disposed so as to be relatively movable with respect to the base unit (40).

12. The semiconductor film layer inspection apparatus (10) according to claim 11, wherein the detection probe moving unit (240) comprises a detection probe damping unit (270) configured to damp a movement of the detection probe moving body (241).

13. The semiconductor film layer inspection apparatus (10) according to claim 12, wherein the detection probe damping unit (270) comprises:
- a damping moving body accommodating part (271) disposed at an inside of the detection probe moving body (241);
- a damping elastic part (273) disposed inside the damping body accommodating part (271) in such a manner as to be supported at one end thereof by an inner side of the damping body accommodating part (271); and
- a damping plunger (275) brought at one end thereof into contact with the damping elastic part (273) and disposed at another end thereof within the damping body accommodating part (271) so as to be oriented toward the base unit (40) to limit the movement of the detection probe moving body (241).

14. The semiconductor film layer inspection apparatus (10) according to claim 13, wherein the damping plunger (275) comprises:
- a damping plunger body (2751) supported at an end thereof by the damping elastic part (273) in an elastic contact manner; and
- a damping plunger shaft (2753) connected at one end thereof to the damping plunger body (2751) and accommodatingly disposed at another end thereof within the damping moving body accommodating part (271) along a longitudinal direction of the damping moving body accommodating part (271).

15. The semiconductor film layer inspection apparatus (10) according to claim 14, wherein the detection probe moving unit (240) comprises a detection probe moving sensing unit (290) disposed at the base unit (40) so as to be opposed to the damping plunger body (2751), and configured to be brought into contact with the damping plunger body (2751) to senses a contact state.

16. The semiconductor film layer inspection apparatus (10) according to claim 15, wherein the detection probe moving sensing unit (290) comprises a pressure sensor.

17. A detection signal generator (200) configured to apply an electrical signal based on close contact with at least two points on one surface of an oxide semiconductor layer to detect electrical characteristics of the oxide semiconductor layer,
wherein the detection signal generator (200) comprises:
- a detection probe pin (230) configured to be brought into close contact with one or more points spaced apart from each other on one surface of the oxide semiconductor layer; and
- a detection signal generating and sensing probe (202) configured to generate a detection signal for application to the detection probe pin (230) to detect the electrical characteristics of the oxide semiconductor layer, and configured to sense a detection sensing signal inputted thereto from the detection probe pin (230),
wherein the detection probe pin (230) comprises:
- a detection probe pin body (231) disposed spaced apart from the oxide semiconductor layer; and
- a detection probe pin contactor unit (233) disposed at one end thereof at the detection probe pin body (231) and brought at another end thereof into direct contact with the oxide semiconductor layer,
wherein the detection probe pin contactor unit (233) at least partially forms a plurality of independently detectable and operable segmented pin contactor unit blocks,
wherein the detection probe pin body (231) comprises:
- a detection probe pin body base (231-1) configured to allow the detection probe pin contactor unit (233) to be disposed thereon; and
- a detection probe pin body line (231-2) disposed on one surface of the detection probe pin body base (231-1) so as to be electrically connected to the detection probe pin contactor unit (233),
wherein the detection probe pin body base (231-1) comprises an FPCB, and the detection probe pin contactor unit (233) comprises one or more detection probe pin contactors (235) disposed on one surface of the detection probe pin body base (231-1) so as to be electrically connected to the detection probe pin body line (231-2), and configured to be brought into direct contact with the oxide semiconductor layer, and
wherein at least one of the one or more detection probe pin contactors (235) is applied with an electrical signal different from that of at least another adjacent detection probe pin contactor (235).

18. The detection signal generator (200) according to claim 17, wherein the one or more detection probe pin contactors (235) form a structure in which at least one part thereof captures another part thereof.

19. The detection signal generator (200) according to claim 17, wherein the detection signal generator (200) comprises a detection probe moving unit (240) configured to allow the detection probe pin (230) to be disposed at one end thereof so as to be relatively movable with respect to a base unit (40) configured to allow a substrate on which a semiconductor film layer (30) comprising the oxide semiconductor layer is formed to be seatingly disposed on one surface thereof.

20. The detection signal generator (200) according to claim 19, wherein the detection probe moving unit (240) comprises:
- a detection probe moving body (241) configured to allow the detection probe pin (230) to be disposed at one end thereof; and
- a detection probe moving guide (280) having one end disposed at the detection probe moving body (241) and another end disposed so as to be relatively movable with respect to the base unit (40) configured to allow the substrate to be seatingly disposed on one surface thereof.

21. The detection signal generator (200) according to claim 20, wherein the detection probe moving unit (240) comprises a detection probe damping unit (270) configured to damp a movement of the detection probe moving body (241).

22. The detection signal generator (200) according to claim 21, wherein the detection probe damping unit (270) comprises:
- a damping moving body accommodating part (271) disposed at an inside of the detection probe moving body (241);
- a damping elastic part (273) disposed inside the damping body accommodating part (271) in such a manner as to be supported at one end thereof by the inner side of the damping body accommodating part (271); and
- a damping plunger (275) brought at one end thereof into contact with the damping elastic part (273) and disposed at another end thereof within the damping body accommodating part (271) so as to be oriented toward the base unit (40) having one surface on which the substrate is seatingly disposed to limit the movement of the detection probe moving body (241).

23. The detection signal generator (200) according to claim 22, wherein the damping plunger (275) comprises:
a damping plunger body (2751) supported at an end thereof by the damping elastic part (273) in an elastic contact manner; and
a damping plunger shaft (2753) connected at one end thereof to the damping plunger body (2751) and accommodatingly disposed at another end thereof within the damping moving body accommodating part (271) along a longitudinal direction of the damping moving body accommodating part (271).

24. The detection signal generator (200) according to claim 23, wherein the detection probe moving unit (240) comprises a detection probe moving sensing unit (290) disposed at the base unit (40) so as to be opposed to the damping plunger body (2751), and configured to be brought into contact with the damping plunger body (2751) to senses a contact state.

25. The detection signal generator (200) according to claim 24, wherein the detection probe moving sensing unit (290) comprises a pressure sensor.

26. A method of inspecting a semiconductor film layer using a semiconductor film layer inspection apparatus (10) for detecting electrical characteristics of the semiconductor film layer (30) formed on one surface of a substrate (20) and including an oxide semiconductor layer (31), the apparatus comprising: a base unit (40) configured to allow the substrate to be seatingly disposed on one surface thereof; a detection signal generator (200) configured to apply an electrical signal based on close contact with at least two points on one surface of the oxide semiconductor layer to detect the electrical characteristics of the oxide semiconductor layer; and a carrier generator (300, 300a, 300b) configured to increase a concentration of a carrier of the oxide semiconductor layer, wherein the detection signal generator (200) comprises: a detection probe pin (230) configured to be brought into close contact with one or more points spaced apart from each other on one surface of the oxide semiconductor layer; and a detection signal generating and sensing probe (202) configured to generate a detection signal for application to the detection probe pin (230) to detect the electrical characteristics of the oxide semiconductor layer, and configured to sense a detection sensing signal inputted thereto from the detection probe pin (230), wherein the detection probe pin (230) comprises: a detection probe pin body (231) disposed spaced apart from the oxide semiconductor layer; and a detection probe pin contactor disposed at one end thereof at the detection probe pin body (231) and brought at the another end thereof into direct contact with the oxide semiconductor layer, and wherein the detection probe pin contactor unit (233) at least partially forms a plurality of independently detectable and operable segmented pin contactor unit blocks,
wherein the method comprises:
a provision step (S1) of providing the semiconductor film layer inspection apparatus;
a preparation step (S10) of preparing the substrate (20) having one surface on which the oxide semiconductor layer (31) as an inspection object is formed so that the substrate is disposed on the semiconductor film layer inspection apparatus (10);
a carrier generation step (S20) of allowing the carrier generator (300) to increase the carrier concentration of the oxide semiconductor layer (31); and
a measurement step (S30) of allowing the detection signal generator (200) to be brought into contact with at least two points on one surface of oxide semiconductor layer (31) to detect the electrical characteristics of the oxide semiconductor layer (31) by applying an electrical signal to the oxide semiconductor layer (31), and
wherein the measurement step (S30) comprises:
a sequential measurement step (S31) of acquiring a detection sensing signal as an independently operable detection sensing signal individually or in preset single or plural units of blocks for a plurability of pin contactor unit blocks which are segmented in a preset manner;
a calibration step (S33) of confirming and calculating a sequential measurement value measured in a target pin contactor unit block using the detection sensing signal acquired individually for the segmented pin contactor unit blocks in the sequential measurement step (S31) as the independently operable detection sensing signal, and determining validity of the calculated sequential measurement value as the independently operable detection sensing signal; and
a measurement confirmation step (S35) of outputting final electrical characteristics of the oxide semiconductor layer as a result of determination in the calibration step (S33).

27. The method according to claim 26, wherein the semiconductor film layer inspection apparatus (10) further comprises a detecting calibration module (500) disposed between the detection signal generating and sensing probe (202) and the detection probe pin (230), and configured to apply, as an independently operable detection signal, a detection signal from the detection signal generating and sensing probe (202) to the detection probe pin contactor unit (233) that forms one or more independently detectable and operable pin contactor unit blocks and configured to process an independently operable detection sensing signal applied thereto from the detection probe pin contactor unit (233) for application to the detection signal generating and sensing probe (202),
wherein the detecting calibration module (500) comprises:
a detecting calibration data selector (520) configured to select a target pin contactor unit block from among a plurality of pin contactor unit blocks using the detection signal from the detection signal generating and sensing probe (202) as the independently operable detection signal, and configured to output as the independently operable detection sensing signal from the detection probe pin contactor unit (233) of a corresponding pin contactor unit block of the pin contactor unit blocks, the detection sensing signal applied to the detecting calibration module (500) from the detection probe pin contactor unit (233); and
a detecting calibration control unit (510) configured to determine whether to use the independently operable detection sensing signal from the detection probe pin contactor unit (233) of the corresponding pin contactor unit block based on the independently operable detection sensing signals of the plurality of pin contactor unit blocks and information a number of the detection probe pin contactor units (233), and configured to perform a normalization of the electrical characteristics of the semiconductor film layer (30) including the oxide semiconductor layer (31) based on the number of the detection probe pin contactor units (233) depending on whether to use the independently operable detection sensing signal from the detection probe pin contactor unit (233) of the corresponding pin contactor unit block, and wherein the sequential measurement step (S31) comprises:

a sequential measurement mode confirmation step (S311) of allowing the detecting calibration control unit (510) to confirm a sequential measurement mode which is to be selected and executed by a user; and a sequential measurement mode execution step (S313) of acquiring the detection sensing signal as the independently operable detection sensing signal individually for the segmented pin contactor unit blocks according to the sequential measurement mode selected through the detecting calibration control unit (510) according to the sequential measurement mode confirmed in the sequential measurement mode confirmation step (S311).

28. The method according to claim 27, wherein the calibration step (S33) comprises:

a sequential measurement value confirmation and calculation step (S331) of allowing a detecting calibration calculation control unit (511) of the detecting calibration control unit (510) to calculate independently operable detection sensing signals per the number of the detection probe pin contactor units in the case of including the corresponding pin contactor unit block based on the independently operable detection sensing signals of the plurality of pin contactor unit blocks and information on the number of the detection probe pin contactor units (233); and a calibration validity determination step (S333) of allowing a detecting calibration determination control unit (513) of the detecting calibration control unit (510) to determine whether to use the independently operable detection sensing signals per the number of the detection probe pin contactor units as independently operable detection sensing signals based on the independently operable detection sensing signals per the number of the detection probe pin contactor units, calculated by the detecting calibration calculation control unit (511).

* * * * *